US 6,670,597 B1

(12) United States Patent
Kitamura et al.

(10) Patent No.: US 6,670,597 B1
(45) Date of Patent: Dec. 30, 2003

(54) ILLUMINATION SENSOR WITH SPECTRAL SENSITIVITY CORRESPONDING TO HUMAN LUMINOSITY CHARACTERISTIC

(75) Inventors: Nobuhiro Kitamura, Katano (JP); Yukihiro Murata, Katano (JP); Yoshinori Akinari, Kadoma (JP); Yoshihisa Ishigami, Tsu (JP)

(73) Assignee: Matsushita Electric Works, Ltd., Osaka (JP)

( * ) Notice: Subject to any disclaimer, the term of this patent is extended or adjusted under 35 U.S.C. 154(b) by 471 days.

(21) Appl. No.: 09/580,573

(22) Filed: May 30, 2000

(30) Foreign Application Priority Data

Aug. 6, 1999 (JP) ............................................. 11-224676

(51) Int. Cl.[7] ............................................. H05B 41/36
(52) U.S. Cl. ........................ 250/214 AL; 250/214 SW; 315/159
(58) Field of Search .................. 250/214 AL, 214 SW; 324/514; 315/149–155, 159

(56) References Cited

U.S. PATENT DOCUMENTS 4,227,098 A * 10/1980 Brown et al. ............... 307/311
5,453,663 A * 9/1995 Nakayama ................... 315/159
5,714,012 A * 2/1998 Murata et al. ............... 136/247

FOREIGN PATENT DOCUMENTS

| EP | 0048146 A1 | 3/1982 |
| GB | 2154820 A | 9/1985 |
| JP | 61092034 | 5/1986 |
| JP | 05055886 | 3/1993 |
| JP | 08298447 | 11/1996 |
| JP | 9305878 | 11/1997 |
| JP | 2001-189470 A | 7/2001 |
| JP | 2001-500272 | * 7/2001 |

* cited by examiner

*Primary Examiner*—Stephone B. Allen
(74) *Attorney, Agent, or Firm*—Nixon & Vanderhye P.C.

(57) ABSTRACT

A solar battery SB for detecting the surrounding brightness is provided and a switching element SW is controlled based on output voltage of the solar battery SB. The switching element SW is made up of MOSFETs Q1 and Q2. To form an electronic automatic on/off switch, a triac Q is controlled by turning on/off the switching element SW.

16 Claims, 60 Drawing Sheets

FIG. 4
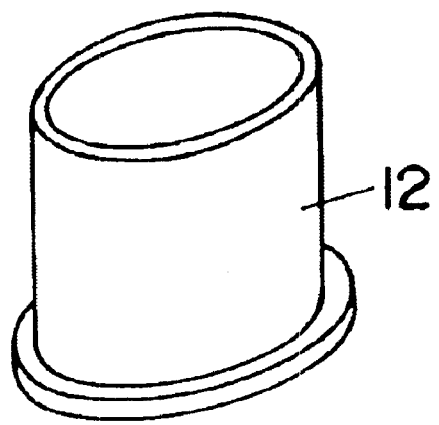
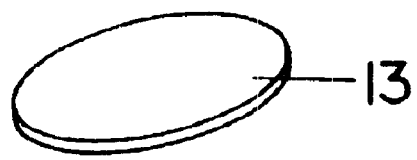
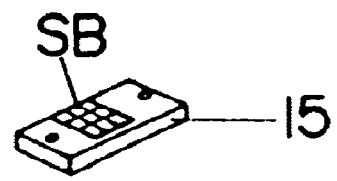
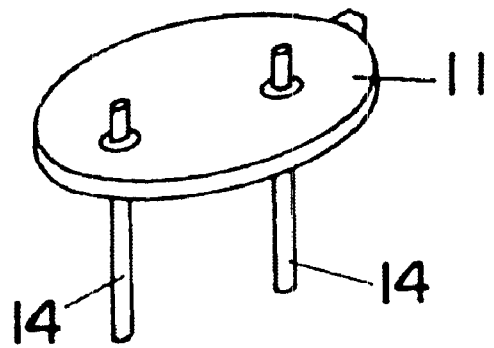

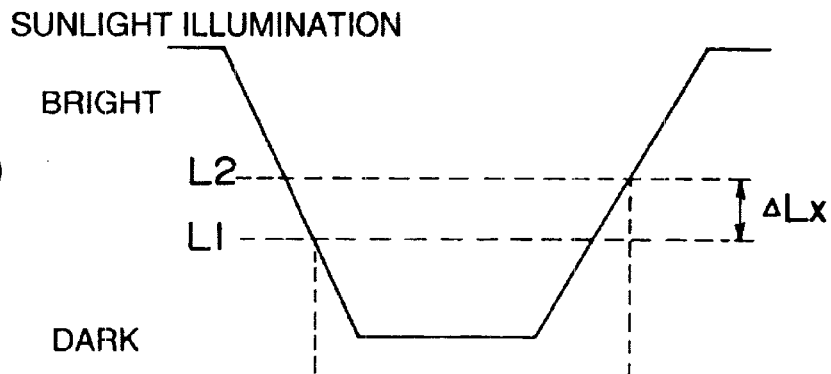
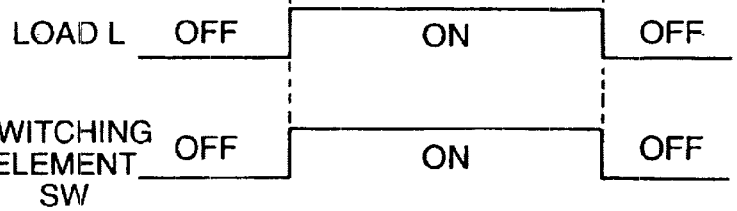
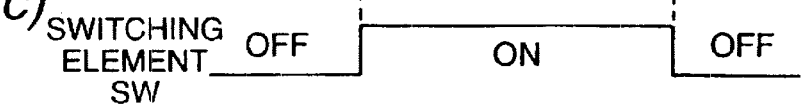
FIG. 18
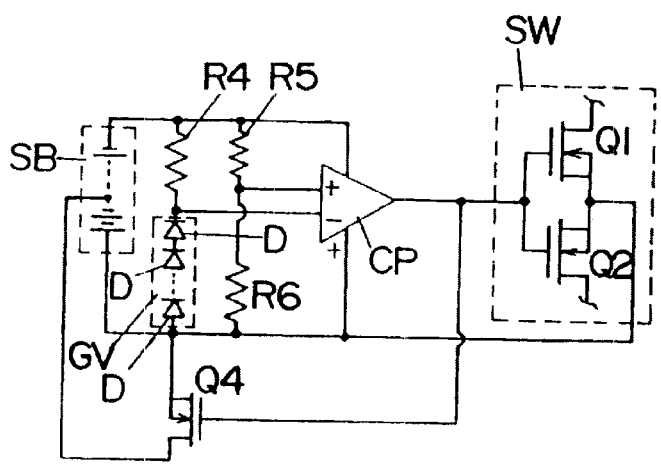

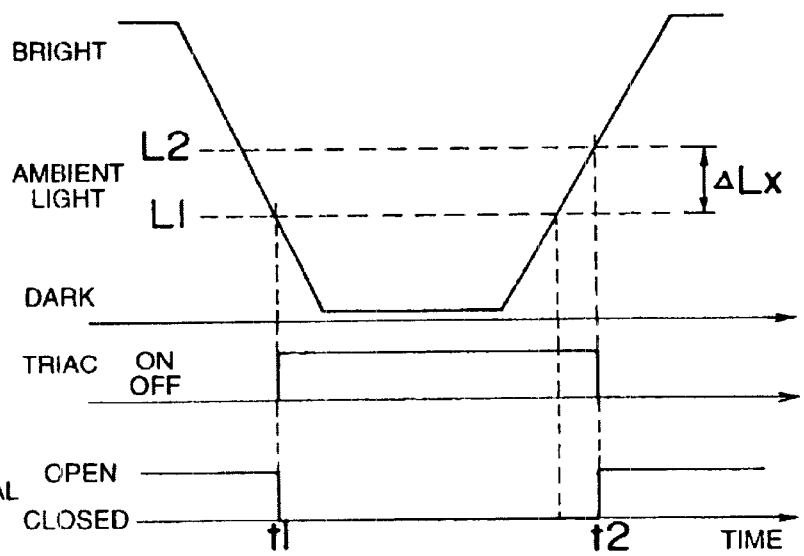
FIG. 25(a)
FIG. 25(b)
FIG. 25(c)
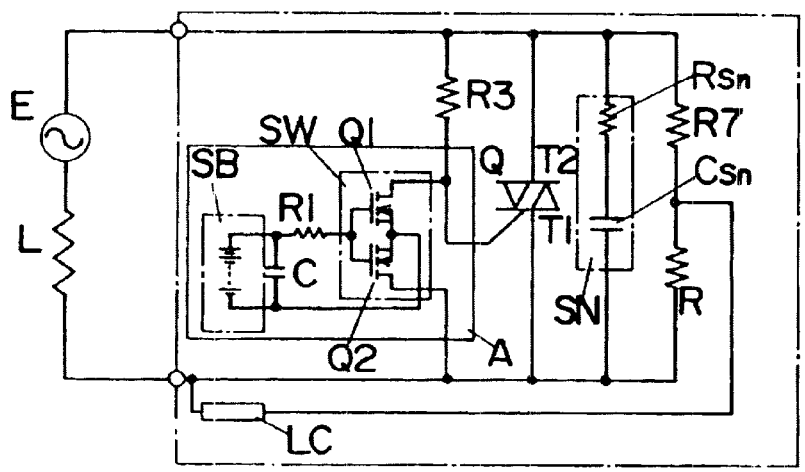
FIG. 26

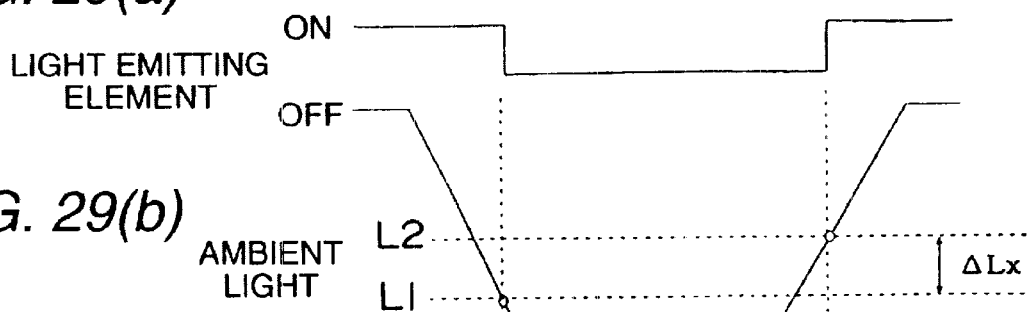
FIG. 29(a) LIGHT EMITTING ELEMENT
FIG. 29(b) AMBIENT LIGHT
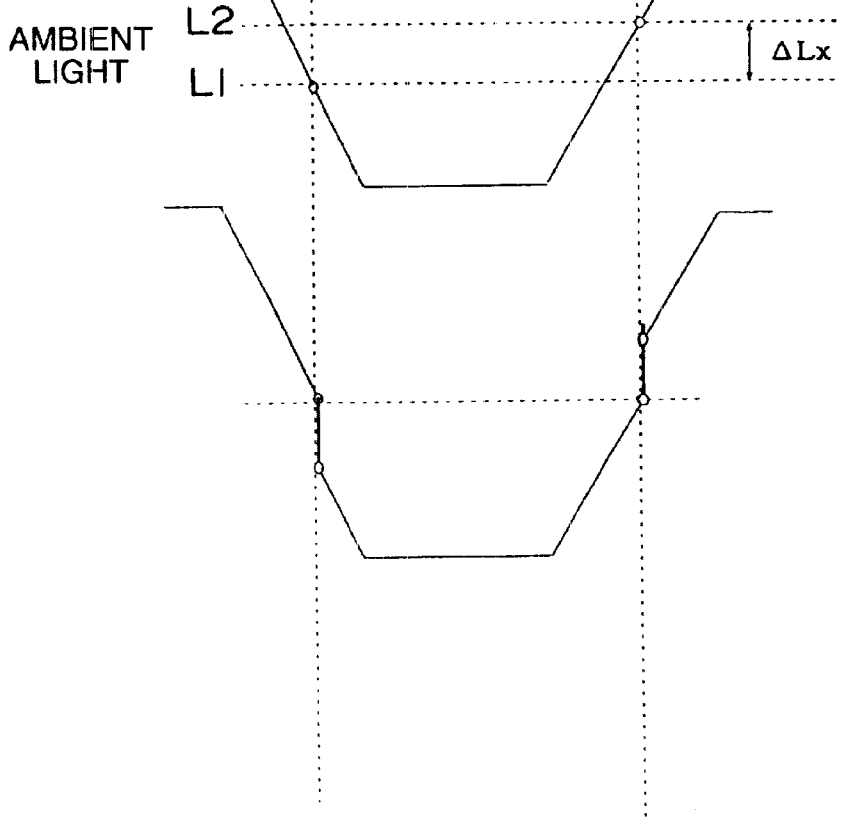
FIG. 29(c)
FIG. 29(d) SWITCHING ELEMENT
FIG. 29(e) LOAD

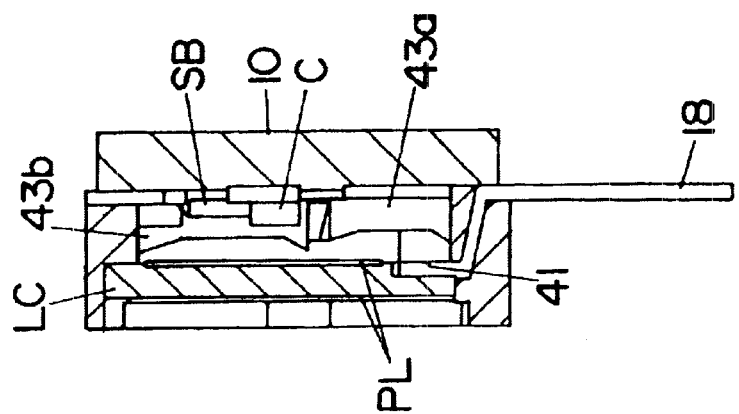
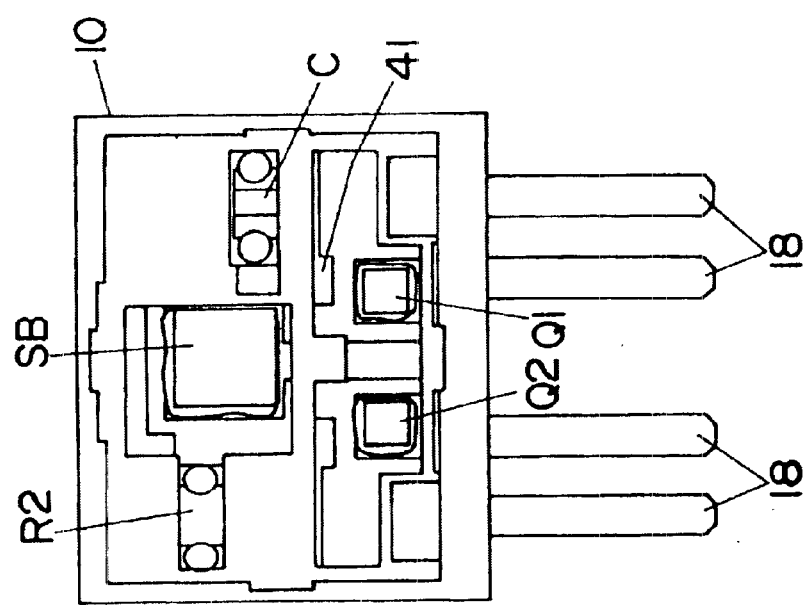
FIG. 40(a)
FIG. 40(b)

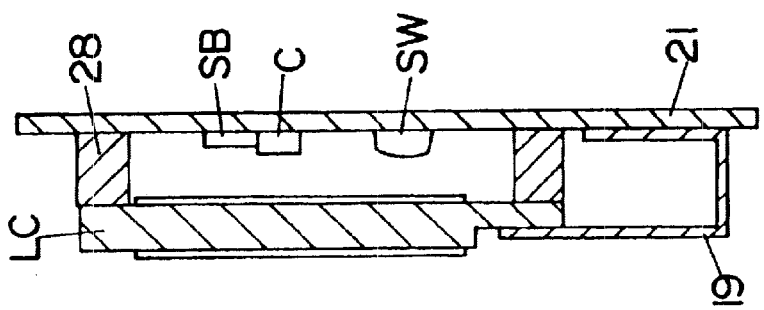
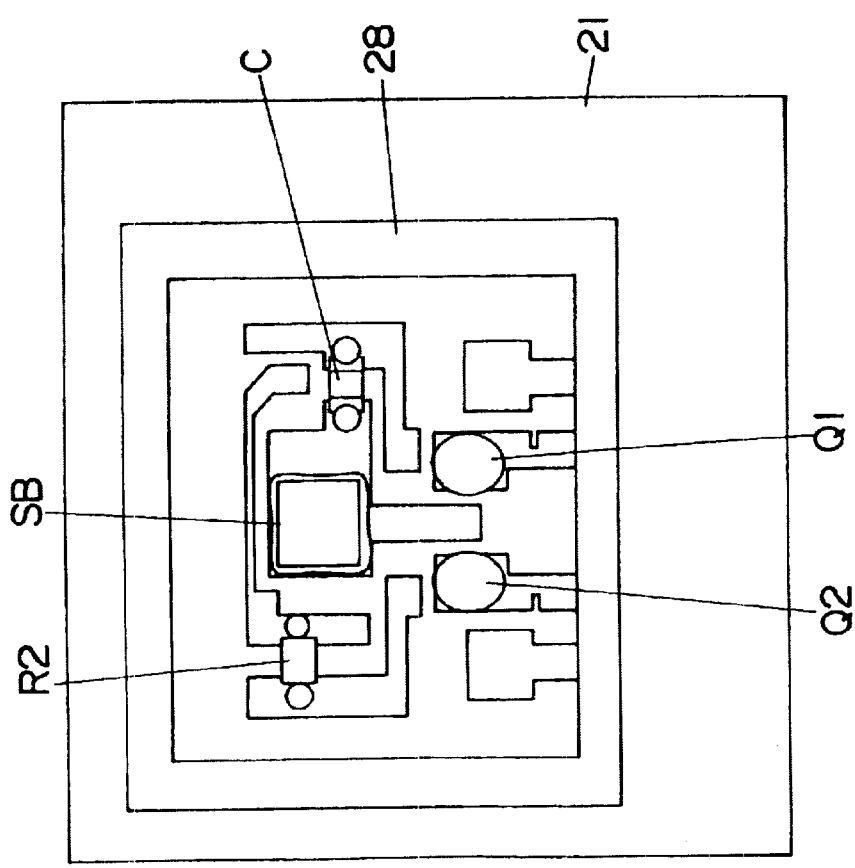

WAVELENGTH ( nm )

WAVELENGTH ( nm )

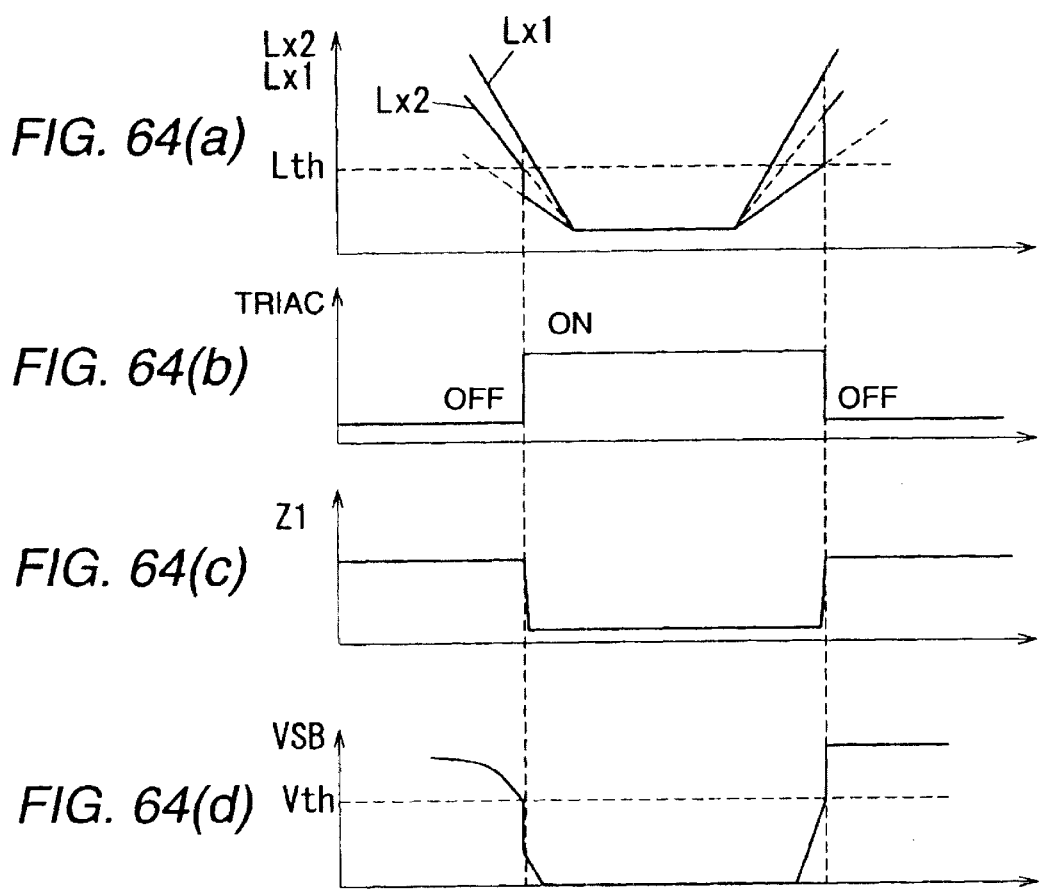

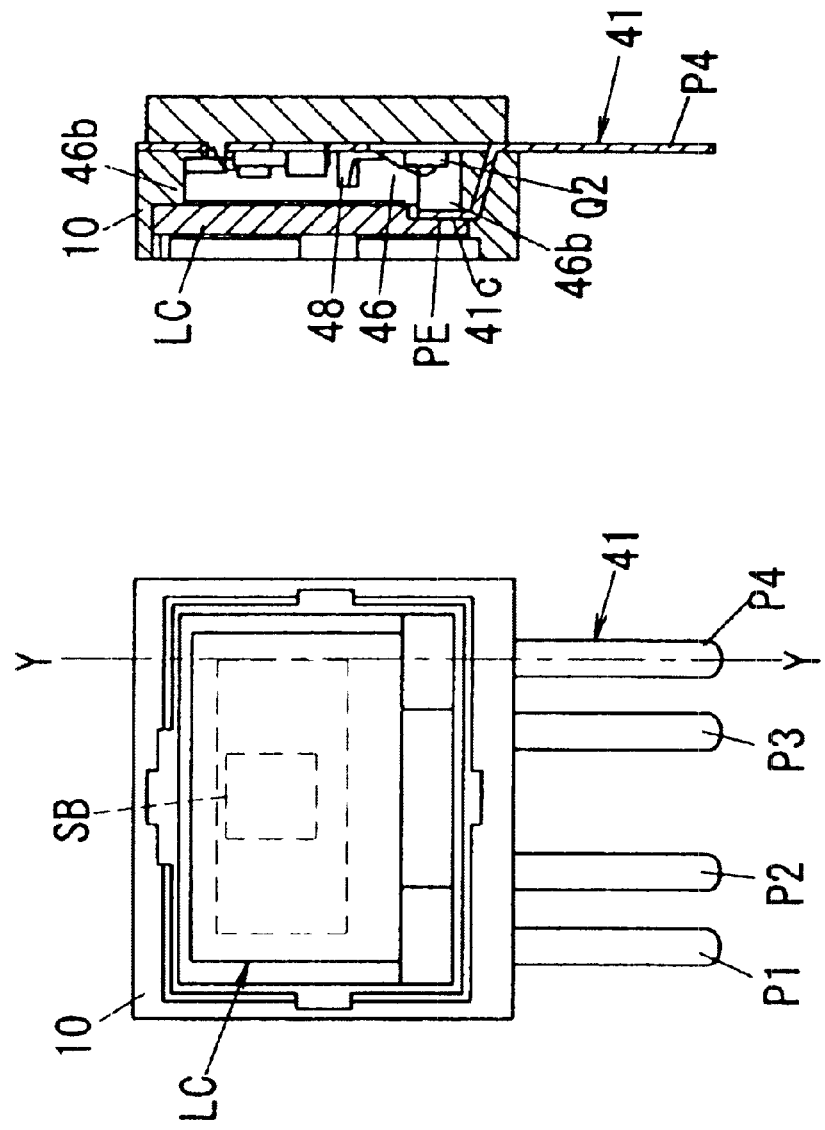

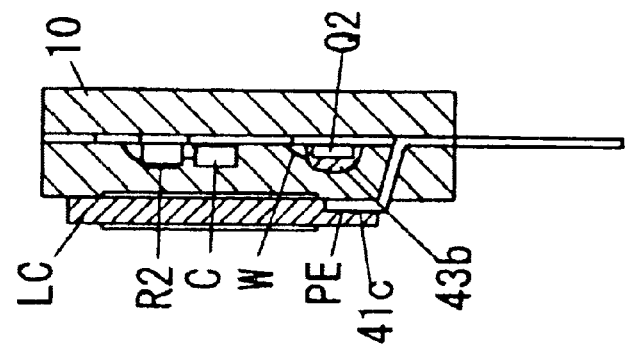
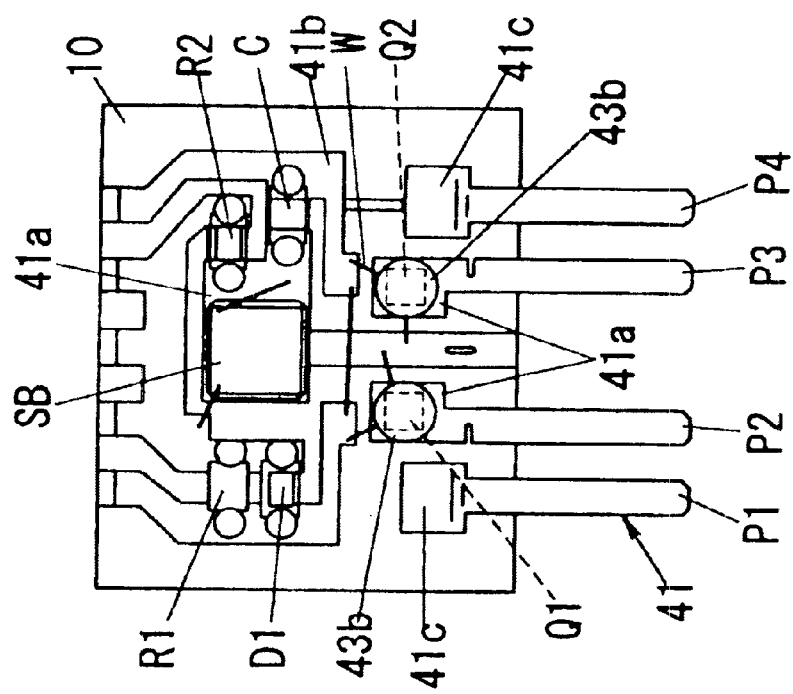

ILLUMINATION SENSOR WITH SPECTRAL SENSITIVITY CORRESPONDING TO HUMAN LUMINOSITY CHARACTERISTIC

BACKGROUND OF INVENTION

1. Field of Invention

This invention relates to an illumination sensor for turning on and off a separately provided switch element in response to the brightness of ambient light and an electronic automatic on/off switch for turning on and off power supply to a load in response to the brightness of ambient light.

2. Related Art

Conventionally, an automatic on/off switch for detecting the brightness of ambient light and lighting a load when the ambient light becomes stipulated brightness or less has been provided. With an automatic on/off switch of this kind, a CdS cell has been widely used as an illumination sensor for detecting the brightness of ambient light. The automatic on/off switch of this kind is called a thermal type; a bimetal heater as a switch element is connected in series to the CdS cell and a contact inserted between a load and a power supply is opened and closed by means of the bimetal. Such a thermal-type automatic on/off switch has the advantage that it can be provided at low cost. However, cadmium is used for the CdS cell and therefore the automatic on/off switch using the CdS cell as the illumination sensor has a problem of a large load on the environment when it is manufactured and is discarded.

Then, a device using a photodiode array in place of the CdS cell to detect the brightness of ambient light is proposed to reduce the load on the environment when it is manufactured and is discarded. For example, JP-A-5-152924 describes a configuration wherein a photodiode array 1 is used as an illumination sensor for detecting the brightness of ambient light and a switching element 2 comprising two depletion-type MOSFETs connected in series is used as a switch element for turning on and off the feeding path from a power supply E to a load L, as shown in FIG. 81.

In the configuration, the load of cadmium on the environment is eliminated because the CdS cell is not used to detect the brightness and no power is required for controlling the switching element 2 and the number of parts is lessened because the photodiode array 1 of photovoltaic element is used.

By the way, the switching element 2 comprising two depletion-type MOSFETs is inserted between the power supply E and the load L in the configuration shown in FIG. 81 and thus the switching element 2 needs to have a large rated current capacity to use a load consuming large power. To drive the switching element 2 of a large rated current capacity, the electromotive force of the diode array 1 must also be enlarged. Since the electromotive force of one photodiode is constant, the number of photodiodes needs to be increased to provide a large electromotive force and consequently, the occupation area of the photodiode array 1 becomes large. That is, in addition to use of a high-cost switching element of a large rated current capacity as the switching element 2, a high-cost photodiode array 1 of a large area is also used as the photodiode array 1.

JP-A-5-152924 describes the fact that if the load capacity is large, the MOSFETs making up the switching element 2 are connected in parallel, thereby enlarging the current capacity of the switching element 2; however, if the gates and sources of two or more MOSFETs are connected in parallel, the capacity components of the gates and sources are also connected in parallel and thus it is feared that the capacity components may form a feedback path, resulting in an oscillation state. Moreover, if two or more MOSFETs are connected in parallel, the costs are increased as with use of MOSFET of a large rated current capacity and the MOSFET occupation area becomes large, leading to upsizing.

SUMMARY OF INVENTION

It is therefore an object of the invention to provide an electronic automatic on/off switch that can lessen a load on the environment, of course, and provide a comparatively large current capacity at low costs and an illumination sensor forming a part of the electronic automatic on/off switch with a switch element.

Illumination Sensor

According to a first aspect of the present invention, there is provided an illumination sensor comprising a photovoltaic element made of a solar battery for generating a voltage responsive to brightness of ambient light and a switching element comprising MOSFET being turned on or off in response to the output voltage of the photovoltaic element for opening or closing a separately provided switch element. According to the configuration, a solar battery is used as the photovoltaic element, whereby a circuit for applying a bias voltage as with a photodiode need not be provided and moreover a power supply is not required for controlling the switching element. Moreover, MOSFET is used as the switching element, so that low power is consumed and the switching element can be turned on and off by output of a small-sized solar battery. Further, CdS cells are not used and thus the ill effect of cadmium on the environment is not produced.

According to a second aspect of the present invention, in the illumination sensor as the first aspect of the present invention, the switching element is made up of two MOSFETs with sources connected and gates connected in common. In the configuration, the switching element can be used for an AC power supply.

According to the third aspect of the present invention, in the illumination sensor as the first aspect of the present invention, the photovoltaic element is a solar battery comprising a plurality of cells each having a pin structure connected in series on a single plane, the cells being formed on a single substrate. According to the configuration, the output voltage of the photovoltaic element can be enlarged without increasing the number of parts at the assembling time.

According to a fourth aspect of the present invention, in the illumination sensor as the first aspect of the present invention, an amorphous silicon solar battery having a sensitivity wavelength range of 400 to 700 nm, a peak wavelength in the vicinity of 500 nm, and a spectral sensitivity characteristic closely similar to the luminosity characteristic of a human being is used as the solar battery. According to the configuration, the operation of the switching element in response to the brightness of ambient light can be matched with the luminosity characteristic of a human being and control with no sense of incongruity is enabled. Moreover, an amorphous silicon solar battery is used, so that easy formation is enabled at comparatively low temperature on a comparatively inexpensive substrate of glass, silicon, etc., and costs can be reduced.

According to a fifth aspect of the present invention, the illumination sensor as the first aspect of the present invention further includes a light quantity adjustment member being placed in at least a part of an incidence path of ambient light on a light reception face of the photovoltaic element and having transmittance controlled by an external signal generated in response to opening or closing the switch element. According to the configuration, the light quantity adjustment member having transmittance controlled by an external signal responsive to turning on or off the switching element controlled in response to the brightness of ambient light is placed in the incidence path of ambient light on the photovoltaic element, so that it is made possible to give hysteresis to the relationship between the brightness of the ambient light and turning on/off the switching element. That is, an external signal is given so as to decrease the transmittance of the light quantity adjustment member when the ambient light is decreased, whereby it is made possible to lower the sensitivity when the quantity of the ambient light is small, and it is made possible to set so as to prevent a malfunction if light of headlights of an automobile, etc., is incident in the night. Since a delay element need not be placed between the solar battery and the switching element, when light quantity change of the ambient light is sufficiently large, the transmittance of the light quantity adjustment member can be immediately raised with no delay.

According a sixth aspect of the present invention, in the invention as the fifth aspect of the present invention, the light quantity adjustment member has a transmittance-type liquid crystal plate having transmittance changed in response to the strength of an electric field applied to liquid crystal. According to the configuration, a liquid crystal plate is used as the light quantity adjustment member; it is driven by an electric field and has very large impedance and thus consumes small power. That is, the switching element is driven by the output voltage of the photovoltaic element and the power required for the external signal for controlling the light quantity adjustment member is small, so that the illumination sensor can be operated with extremely small power. A polarizing plate is placed on each of the surface and the back of the liquid crystal plate and the transmittance of the polarizing plates and the liquid crystal plate is set based on the relative angle of a vibration face of light passing through the polarizing plates. According to the configuration, the transmittance is adjusted based on the positional relationship of the vibration face of light passing through the polarizing plates, so that it is made possible to make whole adjustment of the quantity of light incident on the photovoltaic element.

In a seventh aspect of the present invention, in the illumination sensor as the fifth aspect of the present invention, a monocrystalline silicon solar battery having a sensitivity wavelength range across a visible light area and a near-infrared light area and a peak wavelength in an infrared light area is used as the photovoltaic element and the liquid crystal plate used has a transmittance characteristic different between the visible light area and the infrared light area. The light quantity adjustment member has a transmittance-type liquid crystal plate having transmittance changed in response to the strength of an electric field applied to liquid crystal. According to the configuration, a liquid crystal plate is used as the light quantity adjustment member; it is driven by an electric field and has very large impedance and thus consumes small power. That is, the switching element is driven by the output voltage of the photovoltaic element and the power required for the external signal for controlling the light quantity adjustment member is small, so that the illumination sensor can be operated with extremely small power. According to the configuration, it is made possible to enlarge hysteresis for illumination light and lessen hysteresis for natural light by combining the spectral sensitivity characteristic of the photovoltaic element and the transmittance characteristic of the liquid crystal plate. That is, it is made possible to give a hysteresis characteristic such that no response is made if illumination light or light of headlights is incident as ambient light in the night and that a response is made immediately if the sunlight is incident at the crack of dawn.

In an eighth aspect of the present invention, in the illumination sensor as the fourth aspect of the present invention, a filter having transmittance different in a visible light area and an infrared light area is added to the incidence path of ambient light on the light reception face of the photovoltaic element. According to the configuration, the quantity of light incident on the photovoltaic element can be adjusted in response to the wavelength of light and it is made possible to provide any desired hysteresis characteristic.

In a ninth aspect of the present invention, the illumination sensor as the first aspect of the present invention further includes a control circuit being inserted between the photovoltaic element and the switching element for adjusting a response of the switching element to change in the output voltage of the photovoltaic element. According to the configuration, the response of the switching element to the output of the photovoltaic element can be adjusted.

In a tenth aspect of the present invention, the illumination sensor as the first aspect of the present invention further includes a package made of a molded article of a synthetic resin, the package being formed with connection terminals for connecting to an external circuit in one piece. According to the configuration, the connection terminals are projected on the package for easy mounting. Since the electric parts forming the illumination sensor are housed in the package of a molded article made of a synthetic resin, the illumination sensor can be miniaturized and moreover when the illumination sensor is built in any other unit, discrete electric parts need not be built in and the illumination sensor can be handled as one part. Moreover, the wiring length of the photovoltaic element and the switching element can be shortened by miniaturizing the illumination sensor, and external radiation noise can be prevented from causing the switching element to malfunction.

In an eleventh aspect of the present invention, in the illumination sensor as the tenth aspect of the present invention, the package is molded with a metal frame in one piece at the same time, the frame being formed with parts mounting parts where the connection terminals and electric parts are mounted and wiring parts forming electric paths between the connection terminals and the parts mounting parts. According to the configuration, the electric parts are mounted on the frame and the package is molded with the frame in one piece at the same time, so that manufacturing is easy and it is made possible to miniaturize as compared with the case for use with a print-circuit board, etc.

In a twelfth aspect of the present invention, the illumination sensor as the eleventh aspect of the present invention further includes a first seal member having a translucent property for sealing the photovoltaic element and a second seal member having a lightproof property for sealing the switching element. According to the configuration, both the photovoltaic element and the switching element are sealed with the seal members, whereby degradation caused by humidity, etc., can be suppressed and moreover the switching element is sealed with the seal member having a lightproof property, so that a malfunction or degradation caused by drawing light into the switching element can be prevented.

In a thirteenth aspect of the present invention, in the illumination sensor as the eleventh aspect of the present invention, the package is provided with a separation wall for separating the mounting part of the switching element and the mounting part of the photovoltaic element and a first seal member having a lightproof property for sealing the switching element and a second seal member having a translucent property for sealing the photovoltaic element are separated through the separation wall. According to the configuration, the switching element is sealed with the seal member not allowing light to pass through, so that the switching element can be prevented from being degraded because of the surrounding environment, and the photovoltaic element is sealed with the seal member having a translucent property, so that the photovoltaic element can be prevented from being degraded because of the surrounding environment. Further, the mounting part of the switching element and the mounting part of the photovoltaic element are separated by the separation wall, thus the seal member having a lightproof property for sealing the switching element and the seal member having a translucent property for sealing the photovoltaic element are not mixed; the accident in which the seal member having a lightproof property is drawn into the photovoltaic element for decreasing the quantity of light incident on the light reception face of the photovoltaic element can be prevented, and the state in which the elements are not completely sealed because each seal member is drawn into any other portion, whereby the amount of the seal member is lowered can be prevented from occurring.

In a fourteenth aspect of the present invention, in the illumination sensor as the eleventh aspect of the present invention, a light quantity adjustment member having transmittance controlled by an external signal generated in response to opening or closing the switch element is attached to the package so as to overlap at least a part of a light reception face of the photovoltaic element and is mounted on the parts mounting part and is electrically connected to the connection terminal. According to the configuration, an external control signal is input to the light quantity adjustment member, whereby the quantity of light passing through the light quantity adjustment member and incident on the light reception face of the photovoltaic element can be adjusted; for example, when the switching element is off, the quantity of light passing through the light quantity adjustment member is lowered, whereby hysteresis can be given to the response of the switching element to the brightness of ambient light when the switching element is turned on and off.

In a fifteenth aspect of the present invention, in the illumination sensor as the fourteenth aspect of the present invention, the light quantity adjustment member has a transmittance-type liquid crystal plate having transmittance changed in response to the strength of an electric field applied to liquid crystal and comprises a translucent seal member for sealing at least the periphery on the incidence side of ambient light on the liquid crystal plate. According to the configuration, the liquid crystal plate is vulnerable to the surrounding environment (particularly, humidity), but at least the periphery of the liquid crystal plate is sealed with the seal member, so that the liquid crystal plate can be prevented from being degraded due to humidity.

In a sixteenth aspect of the present invention, in the illumination sensor as the fourteenth aspect of the present invention, the light quantity adjustment member has a filter having a spectral transmittance characteristic different from that of the photovoltaic element, the filter being attached to the package so as to be opposed to the light reception face of the photovoltaic element. According to the configuration, the spectral characteristic of light incident on the photovoltaic element is corrected through the filter, so that the photovoltaic element can be provided with sensitivity to light in any desired wavelength area.

In a seventeenth aspect of the present invention, the illumination sensor as the first aspect of the present invention further includes a print-circuit board being formed with a wiring pattern for surface-mounting electric parts and provided with connection terminals for connecting to an external circuit and a package made of a translucent synthetic resin, integral with the print-circuit board so as to cover the side of the print-circuit board on which the photovoltaic element is mounted. According to the configuration, the electric parts forming the illumination sensor are mounted on the print-circuit board and thus can be easily mounted and the circuit pattern can be changed comparatively easily; illumination sensors of various specifications can be provided at low costs.

In an eighteenth aspect of the present invention, in the illumination sensor as the tenth aspect of the present invention, the package is a MID formed with parts mounting parts for mounting electric parts and wiring parts forming electric paths between the parts mounting parts and the connection terminals by metal plating. According to the configuration, it is made possible to place the electric parts stereoscopically and the illumination sensor can be miniaturized.

Electronic Automatic On/Off Switch

According to a nineteenth aspect of the present invention, there is provided an electronic automatic on/off switch comprising a photovoltaic element made of a solar battery for generating a voltage responsive to brightness of ambient light, a switching element comprising MOSFET being turned on or off upon reception of the output voltage of the photovoltaic element, and a switch element being inserted between an AC power supply and a load and controlled by the switching element so as to energize the load when brightness detected by the photovoltaic element is equal to or less than a stipulated value. According to the configuration, the brightness of ambient light is detected by the solar battery, so that the load on the environment at the manufacturing time or at the discard time is lessened as compared with use of CdS cells and moreover the solar battery produces a comparatively large output per area, thus MOSFET of voltage drive type consuming low power can be reliably driven without using an additional power supply or drive circuit. Moreover, when the brightness of ambient light is equal to or less than a stipulated value, namely, the surroundings become dark, the load is energized through the switch element separately provided from the switching element, so that it is not necessary to allow a load current to flow into the MOSFET, and if the load current is large, an inexpensive element having a smaller rated current capacity than the load current can be used as the switching element. Since the switch element is controlled by the switching element, an electromagnetic relay or a three-terminal bidirectional thyristor which has a comparatively large basic-angle current capacity and is comparatively inexpensive can be used as the switch element, and costs can be reduced as compared with the case where large-capacity MOSFET is used.

In a twentieth aspect of the present invention, in the electronic automatic on/off switch as the nineteenth aspect of the present invention, the switch element is an electromagnetic relay having a contact inserted between power supply and the load and a relay coil inserted between the power supply and the switching element. According to the configuration, the load is controlled by the electromagnetic relay, thus heat is little generated, a radiator plate required as a three-terminal bidirectional thyristor is used is not required, and a noise prevention circuit part is not required either. That is, the electronic automatic on/off switch can be more miniaturized and reduced in costs as compared with the case where a three-terminal bidirectional thyristor is used as the switch element.

In a twenty-first aspect of the present invention, in the electronic automatic on/off switch as the nineteenth aspect of the present invention, the switching element is made up of two MOSFETs with sources connected and gates connected in common. Thus, to adopt a configuration of supplying an alternating current to the switching element, a current can be prevented from flowing into the switching element through a parasitic diode of MOSFET when MOSFET is off, and the switching element can be turned off reliably.

In a twenty-second aspect of the present invention, in the electronic automatic on/off switch as the nineteenth aspect of the present invention, the photovoltaic element is a solar battery comprising a plurality of cells each having a pin structure connected in series on a single plane, the cells being formed on a single substrate. According to the configuration, the switching element is controlled based on the output voltage of the series circuit of the cells, whereby sensitivity can be enhanced and the solar battery can be handled as one part comprising a plurality of cells, so that the number of parts at the assembling time is not increased.

In a twenty-third aspect of the present invention, in the electronic automatic on/off switch as the nineteenth aspect of the present invention, an amorphous silicon solar battery having a sensitivity wavelength range of 400 to 700 nm, a peak wavelength in the vicinity of 500 nm, and a spectral sensitivity characteristic closely similar to the luminosity characteristic of a human being is used as the solar battery. According to the configuration, the amorphous silicon solar battery is used, so that easy formation is enabled at comparatively low temperature on a comparatively inexpensive substrate of glass, silicon, etc., and costs can be reduced. Since the spectral sensitivity characteristic is made closely similar to the luminosity characteristic of a human being, it is made possible to control the load almost matching the luminosity of a human being, and a sense of incongruity is not produced in control of the load.

According to the invention a twenty-fourth aspect of the present invention, there is provided an electronic automatic on/off switch comprising a photovoltaic element for generating a voltage responsive to brightness of ambient light, a voltage supervisory circuit being driven by the output voltage of the photovoltaic element and generating a binary signal in response to larger-than or smaller-than relation between reference voltage and the output voltage of the photovoltaic element, a switching element being turned on or off in response to the binary signal of the voltage supervisory circuit, and a switch element being inserted between a power supply and a load for turning on or off power supply to the load in response to turning on or off the switching element. According to the configuration, the response time of the switching element to change in the output voltage of the photovoltaic element is not adjusted, thus a malfunction is not caused by the change speed of brightness and moreover responsivity to change in the brightness can be enhanced.

In a twenty-fifth aspect of the present invention, in the electronic automatic on/off switch as the twenty-fourth aspect of the present invention, the voltage supervisory circuit comprises a reference voltage generation circuit for generating the reference voltage and a comparator for comparing the output voltage of the photovoltaic element with the reference voltage with respect to the larger-than or smaller-than relation. According to the configuration, the threshold value of brightness for operating the switching element can be set with accuracy.

In a twenty-sixth aspect of the present invention, in the electronic automatic on/off switch as the twenty-fifth aspect of the present invention, a series circuit of a plurality of diodes connected to the photovoltaic element via a resistor is used as the reference voltage generation circuit. According to the configuration, the reference voltage can be generated in a simple circuit configuration.

In a twenty-seventh aspect of the present invention, in the electronic automatic on/off switch as the twenty-fifth aspect of the present invention, the comparator comprises a feedback resistor for giving hysteresis to a threshold value for the output voltage of the photovoltaic element. According to the configuration, hysteresis is provided for the threshold value of brightness when the load is turned on/off, so that the load can be prevented from malfunctioning due to variation in the surrounding brightness.

In a twenty-eighth aspect of the present invention, in the electronic automatic on/off switch as the twenty-fifth aspect of the present invention, a threshold value switching element being turned on or off based on output of the comparator for giving hysteresis to a threshold value for the output voltage of the photovoltaic element is connected in parallel to at least some of the plurality of diodes. The threshold value switching element can be turned on or off, thereby changing the reference voltage for giving hysteresis to the threshold value of brightness when the load is turned on/off.

In a twenty-ninth aspect of the present invention, in the electronic automatic on/off switch as the twenty-fifth asepct of the present invention, the photovoltaic element is made of a solar battery comprising a plurality of cells connected in series and wherein a threshold value switching element being turned on or off based on output of the comparator for giving hysteresis to a threshold value for the output voltage of the photovoltaic element is connected in parallel to at least some of the plurality of cells. According to the configuration, the threshold value switching element can be turned on or off, thereby changing the electromotive force of the solar battery for providing hysteresis for the threshold value of brightness when the load is turned on/off.

In a thirtieth aspect of the present invention, the electronic automatic on/off switch as the nineteenth aspect of the present invention further includes a light emitting element for allowing light different from ambient light to be incident on the photovoltaic element and increasing the light quantity when the switch element is off as compared with that when the switch element is on. According to the configuration, when the surroundings are bright, the light emitting element is turned on, thereby allowing the ambient light and the light from the light emitting element to be incident on the photovoltaic element at the same time; when the surroundings are dark and bidirectional thyristor is turned on for energizing the load, the light emitting element is turned off. Thus, hysteresis can be given to the surrounding brightness and turning on/off the bidirectional thyristor and the on/off state of the bidirectional thyristor is not changed due to minute variation in the brightness of ambient light, namely, the operation of turning on/off the thyristor is stabilized.

In a thirty-first aspect of the present invention, in the electronic automatic on/off switch as the thirtieth aspect of the present invention, a series circuit of the light emitting element and a variable resistor is connected in parallel to the switch element. According to the configuration, when the surroundings are bright, the light emitting element is turned on, thereby allowing the ambient light and the light from the light emitting element to be incident on the photovoltaic element at the same time; when the surroundings are dark and bidirectional thyristor is turned on for energizing the load, the light emitting element is turned off. Thus, hysteresis can be given to the surrounding brightness and turning on/off the bidirectional thyristor and the on/off state of the bidirectional thyristor is not changed due to minute variation in the brightness of ambient light, namely, the operation of turning on/off the thyristor is stabilized. Moreover, the variable resistor is connected in series to the light emitting element, thus if the variable resistor is adjusted, the light emitting quantity of the light emitting element is adjusted and the hysteresis characteristic can be adjusted easily.

In a thirtysecond aspect of the present invention, in the electronic automatic on/off switch as the thirtieth aspect of the present invention, a series circuit of the light emitting element, a variable resistor, and the switching element is connected in parallel to the switch element. According to the configuration, when the surroundings are bright, the light emitting element is turned on, thereby allowing the ambient light and the light from the light emitting element to be incident on the photovoltaic element at the same time; when the surroundings are dark and bidirectional thyristor is turned on for energizing the load, the light emitting element is turned off. Thus, hysteresis can be given to the surrounding brightness and turning on/off the bidirectional thyristor and the on/off state of the bidirectional thyristor is not changed due to minute variation in the brightness of ambient light, namely, the operation of turning on/off the thyristor is stabilized. Moreover, the variable resistor is connected in series to the light emitting element, thus if the variable resistor is adjusted, the light emitting quantity of the light emitting element is adjusted and the hysteresis characteristic can be adjusted easily.

A thirty-third aspect of the present invention, the electronic automatic on/off switch as the thirtieth aspect of th present invention further includes a metal frame mounting the photovoltaic element and the switching element and a package made of a synthetic resin, molded with the frame in one piece at the same time, wherein the light emitting element is attached to the package and connection terminals formed continuously on the metal frame in one piece are projected from the package. According to the configuration, the connection terminals are projected on the package, so that mounting is easy.

In a thirty-fourth aspect of the present invention, the electronic automatic on/off switch as the nineteenth aspect of the present invention further includes a light quantity adjustment member being placed in at least a part of an incidence path of ambient light on a light reception face of the photovoltaic element and having transmittance lowered when the switch element is on as compared with that when the switch element is off. According to the configuration, once the on or off state of the switch element is changed, the on or off state can be made hard to be changed if the brightness of ambient light varies, and hysteresis can be given to turning on or off the switch element in response to the brightness of ambient light.

In a thirty-fifth aspect of the present invention, in the electronic automatic on/off switch as the thirty-fourth aspect of the present invention, the light quantity adjustment member has a transmittance-type liquid crystal plate having transmittance changed in response to the strength of an electric field applied to liquid crystal. According to the configuration, the applied voltage to the liquid crystal plate is adjusted, whereby the hysteresis characteristic can be adjusted.

In a thirty-sixth aspect of the present invention the electronic automatic on/off switch as the thirty-fifth aspect of the present invention further includes a base having one side to which the photovoltaic element and the switching element are attached and a cover for covering the one side of the base, the cover being provided in a part with a translucent plate for allowing ambient light to be incident on the photovoltaic element, wherein the liquid crystal plate is disposed between the photovoltaic element and the translucent plate. According to the configuration, the photovoltaic element and the liquid crystal plate are housed in the space closed by the base and the cover, so that the effect of stray light is hard to receive and it is made possible to set the hysteresis characteristic for ambient light with accuracy.

In a thirty-seventh aspect of the present invention, the electronic automatic on/off switch as the thirty-fifth aspect of the present invention further includes a base having one side to which the photovoltaic element and the switching element are attached and a cover for covering the one side of the base, the cover being provided with the liquid crystal plate in a part for allowing ambient light to be incident on the photovoltaic element. According to the configuration, the space between the photovoltaic element and the liquid crystal plate becomes the space closed by the base and the cover, so that the effect of stray light is hard to receive and it is made possible to set the hysteresis characteristic for ambient light with accuracy.

In a thirty-eighth aspect of the present invention, the electronic automatic on/off switch as the thirty-fifth aspect of the present invention further includes a metal frame mounting the photovoltaic element and the switching element and a package made of a synthetic resin, molded with the frame in one piece at the same time, wherein the liquid crystal plate is attached to the package so as to overlap a light reception face of the photovoltaic element and connection terminals formed continuously on the metal frame in one piece are projected from the package. According to the configuration, the metal frame and the synthetic resin package are molded in one piece at the same time, the frame is provided with the connection terminals, and the parts are mounted on the frame, so that any other circuit board is not required and the electronic automatic on/off switch can be miniaturized.

In a thirty-ninth aspect of the present invention, the electronic automatic on/off switch as the thirty-fifth aspect of the present invention further includes a print-circuit board mounting the photovoltaic element and the switching element, a holding frame made of a synthetic resin for holding the liquid crystal plate, and a case for housing at least the print-circuit board, wherein the holding frame is fixedly secured to either of the print-circuit board and the case. According to the configuration, the print-circuit board is used, so that mounting work is easy and moreover the holding frame holding the liquid crystal plate is fixedly secured to either of the print-circuit board and the case, thus the liquid crystal plate can be positioned reliably.

In a fortieth-aspect of the present invention, in the electronic automatic on/off switch as the twentieth aspect of the present invention, the power supply is an AC power supply, the electromagnetic relay is of AC-drive type, wherein the switching element is made up of two MOSFETs with sources connected and gates connected in common, and the drain of one MOSFET is connected to one end of a series circuit of the power supply and the relay coil and the drain of the other MOSFET is connected to an opposite end of the series circuit. According to the configuration, two MOSFETs are connected in inverse series, so that a current does not flow through a parasitic diode when MOSFET is off, and an alternating current can be shut off. Consequently, a simple circuit configuration is compatible with an AC power supply.

In a forty-first aspect of the present invention, in the electronic automatic on/off switch as the twentieth aspect of the present invention, the power supply is an AC power supply and the electromagnetic relay is of DC-drive type, further including a rectifier being inserted between a series circuit of the drain and source of the MOSFET and the relay coil and the power supply and a smoothing capacitor being connected in parallel to the relay coil. According to the configuration, the number of parts is increased as compared with the case where two MOSFETs are used, but an inexpensive DC electromagnetic relay can be used, the number of MOSFETs may be one, and it is not necessary to consider variations in the MOSFET characteristic. Moreover, the smoothing capacitor is used, whereby the delay time between the instant at which the switching element is turned off and the instant at which the contact of the electromagnetic relay is turned off can be set; for example, if the strong light of headlights of an automobile, etc., is applied for a short time in the night, the contact of the electromagnetic relay does not respond to the light, so that a malfunction can be prevented.

BRIEF DESCRIPTION OF THE DRAWINGS

In the accompanying drawings:

FIG. 4 is an exploded perspective view to show an illumination sensor used in the first embodiment of the invention;

FIG. 17 is a schematic representation concerning the hysteresis operation in the fourth embodiment of the invention;

FIG. 18 is a main part circuit diagram to show a fifth embodiment of the invention;

FIG. 25 is a schematic representation concerning the hysteresis operation in the seventh embodiment of the invention;

FIG. 26 is a circuit diagram to show an eighth embodiment of the invention;

FIGS. 29A to 29E are schematic representations of the operation in the tenth embodiment of the invention;

FIGS. 40A and 40B show an illumination sensor used in the sixteenth embodiment of the invention; FIG. 40A is a front view of the illumination sensor with a liquid crystal plate removed and FIG. 40B is a sectional view of the illumination sensor;

FIGS. 41A and 41B show another configuration example of the illumination sensor used in the sixteenth embodiment of the invention; FIG. 41A is a front view of the illumination sensor with a liquid crystal plate removed and FIG. 41B is a sectional view of the illumination sensor;

FIG. 64 is a schematic representation of the operation of the electronic automatic on/off switch using the illumination sensor shown in FIG. 62;

FIG. 65A is a front view of the illumination sensor with a liquid crystal plate removed and FIG. 65B is a sectional view taken on line X—X in FIG. 65A;

FIG. 66A is a perspective view of a SIP form and FIG. 66B is a perspective view of a DIP form;

FIGS. 67A and 67B show the illumination sensor shown in FIG. 62; FIG. 67A is a front view of the illumination sensor with a liquid crystal plate attached and FIG. 67B is a sectional view taken on line Y—Y in FIG. 67A;

FIGS. 78A and 78B show a twenty-ninth embodiment of the invention; FIG. 78A is a front view with a liquid crystal plate removed and FIG. 78B is a sectional view;

FIG. 80A is a front view with a liquid crystal plate removed and FIG. 80B is a sectional view.

DETAILED DESCRIPTION OF PREFERRED EMBODIMENTS

First Embodiment

Figure 1:
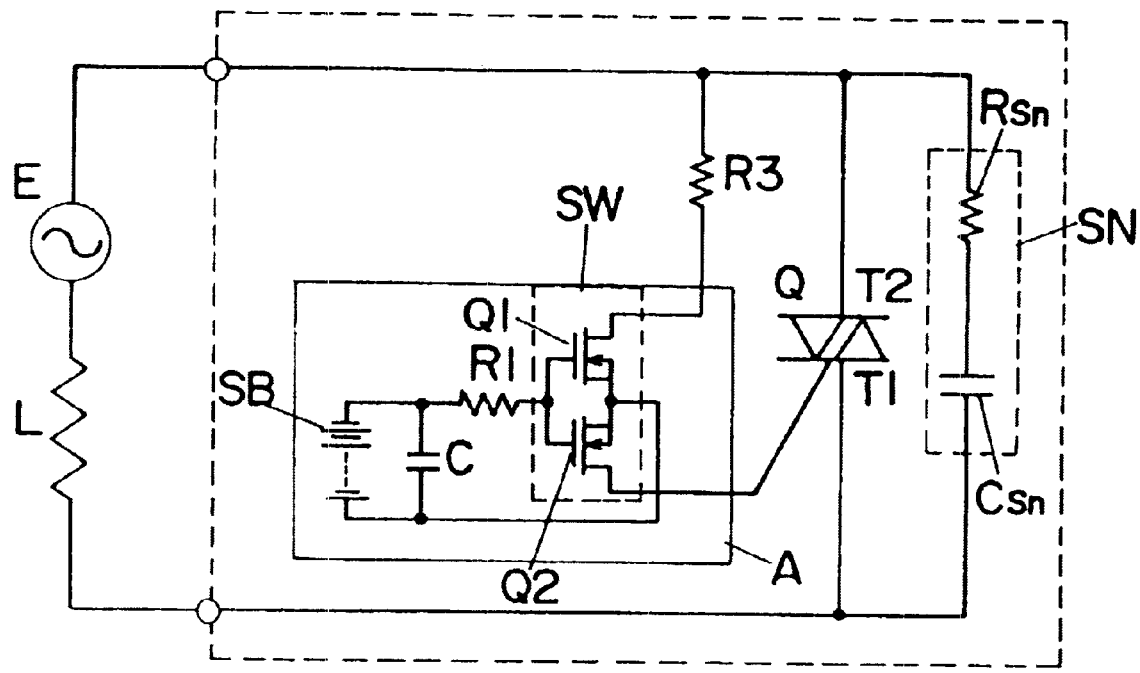
FIG. 1 is a circuit diagram to show a first embodiment of the invention.
Figure 2:
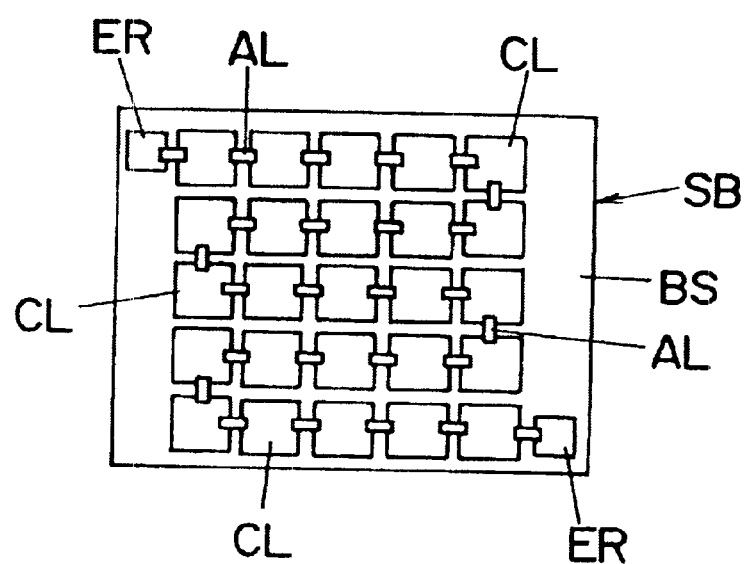
FIG. 2 is a plan view of a solar battery used in the first embodiment of the invention.
Figure 3:
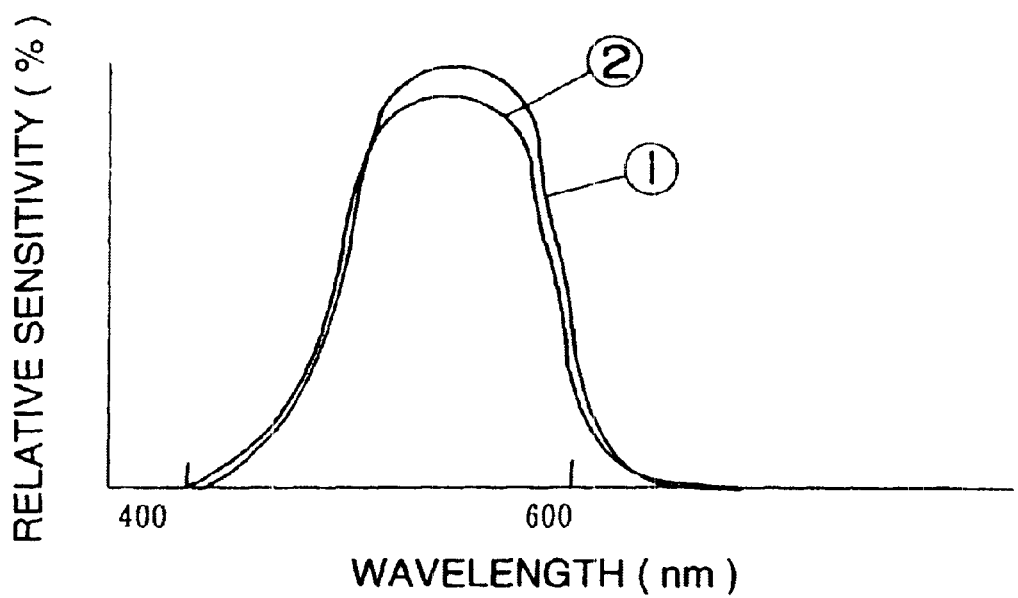
FIG. 3 is a schematic representation of the operation to show the characteristic of the solar battery used in the first embodiment of the invention.

In a first embodiment of the invention, a basic configuration is shown. As shown in FIG. 1, a solar battery SB is used as a photovoltaic element for generating an output voltage responsive to the brightness of ambient light. The solar battery SB comprises a plurality of cells connected in series and the cells CL are arranged like a matrix on one plane of one substrate BS and are connected in series, as shown in FIG. 2. An electrode ER is placed on both ends of the series circuit of the cells CL. The solar battery SB has a spectral sensitivity characteristic shown in (1) in FIG. 3; the sensitivity wavelength range is 400 to 700 nm and the peak wavelength is in the vicinity of 500 nm. The curve in (2) in FIG. 3 indicates the luminosity characteristic of a human being and the spectral sensitivity characteristic of the solar battery SB used in the embodiment is closely similar to the luminosity characteristic of a human being. The solar battery SB of this kind is provided by an amorphous solar battery.

A capacitor C is connected to the solar battery SB in parallel and the solar battery SB has a negative pole connected via a resistor R1 to a connection terminal of a switching element SW. The resistor R1 and the capacitor C make up a control circuit for adjusting response of the switching element SW to output of the solar battery SB. The switching element SW comprises two depletion-type (normally-off-type) MOSFETs Q1 and Q2 connected in inverse series and sources are connected and gates are connected in common. Therefore, the gates of Q1 and Q2 of the switching element SW are connected to the negative pole of the solar battery SB via the resistor R1 as control terminal and the sources are connected to the positive pole of the solar battery SB. The purpose of connecting the MOSFETs Q1 and Q2 in inverse series is to prevent an electric current from flowing through parasitic diodes of the MOSFETs Q1 and Q2 when the MOSFETs Q1 and Q2 are off for making it possible to control an alternating current through the switching element SW. Since the MOSFETs Q1 and Q2 are connected in inverse series, on resistance becomes almost equal regardless of the polarity of an alternating current.

According to the configuration, when the ambient light is bright, the solar battery SB outputs a comparatively large voltage and the gate potential of each of the MOSFETs Q1 and Q2 becomes lower than the source potential, so that the switching element SW is held on. On the other hand, when the quantity of the ambient light lowers and the output voltage of the solar battery SB becomes small, the switching element SW is turned on. Thus, the switching element SW is turned on and off in response to the brightness of the ambient light, so that the solar battery SB, the capacitor C, the resistor R1, and the switching element SW make up an illumination sensor A for detecting the brightness of the ambient light.

An electronic automatic on/off switch comprises a switch element inserted between power supply E like a commercial power supply and load L and the switch element is controlled by the above-mentioned illumination sensor A. In the embodiment, a three-terminal bidirectional thyristor (triac) Q is used as the switch element. That is, the series circuit of the power supply E and the load L is connected at one end to a T1 terminal of the triac Q and at another end to a T2 terminal and the switching element SW is connected at one end (drain of MOSFET Q2) to the gate of the triac Q and at an opposite end (drain of MOSFET Q1) to the T2 terminal of the triac Q via a resistor R3. Therefore, when the switching element SW is turned on, the triac Q is triggered and is tuned on, turning on the load L. Generally, the load L to be controlled by the electronic automatic on/off switch is an illumination load and when the triac Q is turned on, the illumination load is turned on. A snubber circuit SN of a series circuit consisting of a resistor Rsn and a capacitor Csn is connected across the triac Q.

According to the described configuration, when the surroundings are bright and the quantity of the ambient light is large, the gate potential of the MOSFET Q1, Q2 becomes lower than the source potential in response to the output voltage of the solar battery SB, thus the switching element SW is turned off and the triac Q is held on, holding the load L in a light-out state. On the other hand, when the surroundings are dark and the quantity of the ambient light lowers and then the output voltage of the solar battery SB lowers and it is made impossible to maintain the switching element SW off, the switching element SW is turned on and the triac Q is triggered and is tuned on, lighting the load L.

Figure 5:
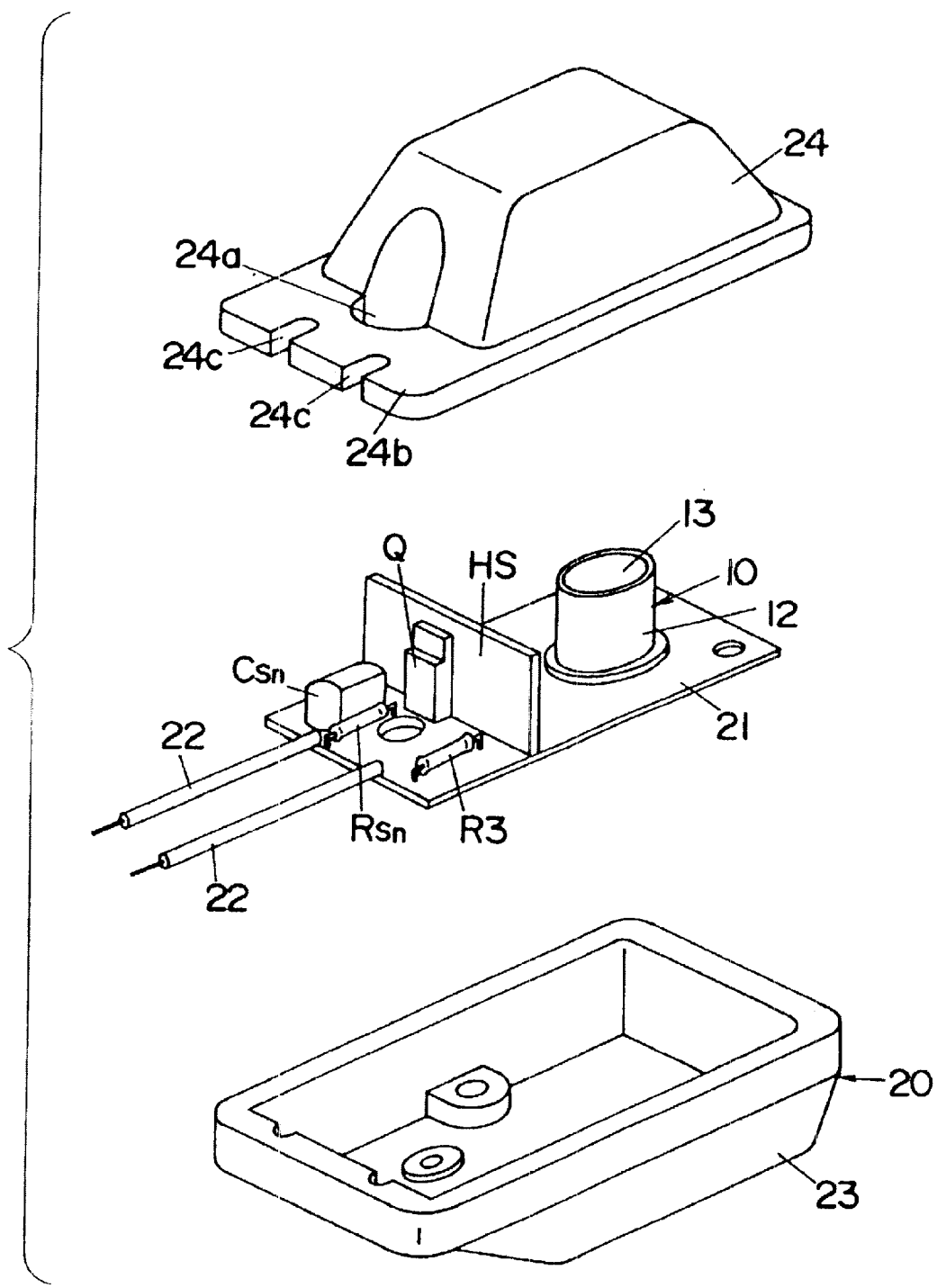
FIG. 5 is an exploded perspective view of the illumination sensor in FIG. 4.

By the way, in the embodiment, as shown in FIG. 4, a board 15 on which the solar battery BS, the capacitor C, the resistor 1, and the switching element SW are mounted is housed in a package 10, thereby forming the illumination sensor A and the illumination sensor A is housed in a case 20 together with other parts, such as the triac Q, as shown in FIG. 5, thereby providing the electronic automatic on/off switch. The package 10 is formed by putting a tubular cover 12 on a flat base 11. The board 15 is fixed onto the base 11 and a translucent plate 13 is attached to the part of the cover 12 corresponding to the light reception face of the solar battery SB (one end face of the cover 12 in the axial direction thereof). Therefore, ambient light is incident on the solar battery SB through the translucent plate 13. A pair of terminal pins 14 connected to both ends of the switching element SW in the illumination sensor A is inserted into the base 11. The terminal pins 14 and the switching element SW are connected by wire (not shown).

As shown in FIG. 5, the illumination sensor A is mounted on a print-circuit board 21 and the triac Q and the resistor R3 and the capacitor Csn and the resistor Rsn making up the snubber circuit SN are also mounted on the print-circuit board 21. Further, a rectangular heat slinger HS is set upright on the print-circuit board 21 so as to abut the triac Q. Two electric lines are connected to the print-circuit board 21 for connection to the power supply E and the load L.

The case 20 for housing the print-circuit board 21 is formed by joining a body 23 and a cover 24 each formed of a synthetic resin like a box. The print-circuit board 21 is fixed to the body 23 by a fixing screw (not shown). The cover 24 is joined to the body 23 by an assembling screw (not shown) screwed to the body 23 through an assembly hole 24a. A flange part 24b is formed in the periphery of the cover 24 on the body 23 side and a pair of notches 24c to draw out the electric lines 22 into the outside of the case 20 is formed in parts of the flange part 24b. ABS resin, etc., is used for the body 23 and an acrylic resin having translucency or the like is used for the cover 24. Therefore, ambient light is made incident on the solar battery SB through the cover 24 of the case 20 and the translucent plate 13 of the package 10.

Figure 6A:
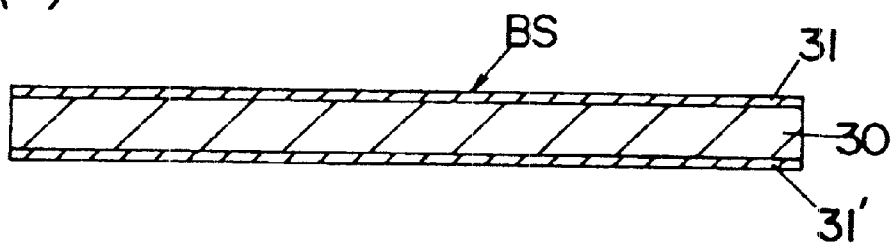
FIGS. 6A to 6C are drawings to show the manufacturing process of the solar battery used in the first embodiment of the invention.

Next, a manufacturing method of the solar battery SB will be discussed with reference to FIGS. 6 and 7. Here, only two cells CL forming the solar battery SB will be discussed. That is, a monocrystalline silicon substrate 30 is introduced into a diffusion furnace and is heated to a high temperature (about 1100° C.) and undergoes pyrogenic oxidation (pyro oxidation), whereby $SiO_2$ films 31 and 31' each about 1 $\mu$m thick are formed on the surface and the back of the monocrystalline silicon substrate 30 as shown in FIG. 6A. That is, a substrate BS is formed.

Figure 6B:
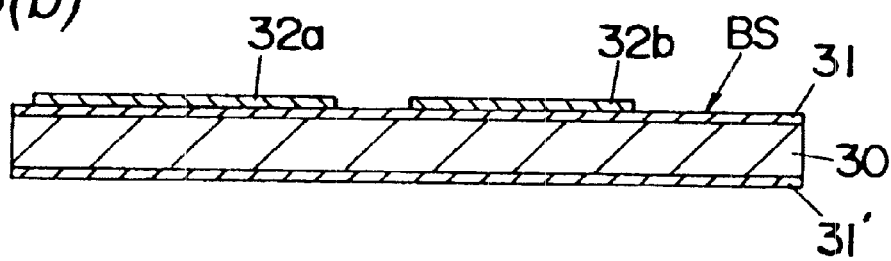

Next, a chrome film is formed on the full face of the $SiO_2$ films 31 formed on the surface of the monocrystalline silicon substrate 30 by an EB evaporation system, then a first resist mask patterned to a predetermined form is formed by photolithography, next the unnecessary portion of the chrome film is removed by wet etching and the first resist mask is removed, whereby lower electrodes 32a and 32b each made of the chrome film of a predetermined shape are formed as shown in FIG. 6B.

Figure 6C:
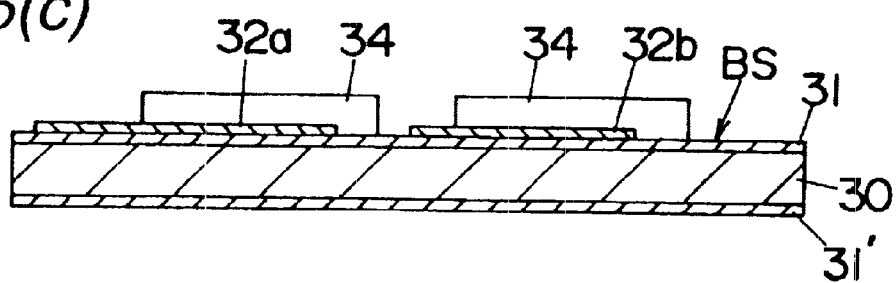

Next, a p-type amorphous silicon layer (p layer), an i-type amorphous silicon layer (i layer), and an n-type amorphous silicon layer (n layer) are deposited in order so as to cover the full face of the main surface (or n, i, and p layers are deposited in order so as to cover the full face of the main surface) by a plasma DVD system, then a second resist mask patterned to a predetermined form is formed by photolithography, next the unnecessary portions of the layers are removed by wet etching and the second resist mask is removed, whereby amorphous silicon layers 34 of a pin structure are formed as shown in FIG. 6C. This means that each amorphous silicon layer 34 comprises the p layer, the i layer, and the n layer deposited on each other. The p layer and the n layer are each set to a film thickness sufficiently thinner than the i layer. In the embodiment, the amorphous silicon layer 34 comprises the p layer, the i layer, and the n layer deposited in order, but may comprise the n layer, the i layer, and the p layer deposited in order.

Figure 7A:
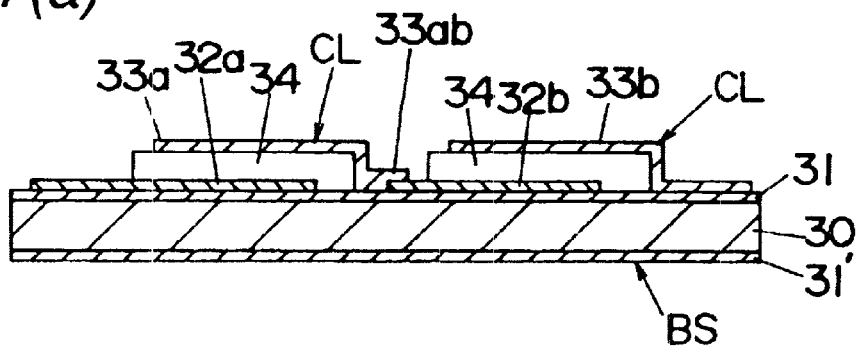
FIGS. 7A to 7C are drawings to show the manufacturing process of the solar battery used in the first embodiment of the invention.

Next, a transparent conductive film made of ITO (Indium Tin Oxide) is formed so as to cover the full face of the main surface by the EB evaporation system, then a third resist mask for patterning the transparent conductive film to a predetermined form is formed by photolithography, next the unnecessary portion of the transparent conductive film is removed by wet etching and the third resist mask is removed, whereby upper electrodes 33a and 33b made of the transparent conductive film are formed as shown in FIG. 7A.

That is, the amorphous silicon layer 34 placed between the lower electrode 32a and the upper electrode 33a, the lower electrode 32a, and the upper electrode 33a makeup one cell CL and the amorphous silicon layer 34 placed between the lower electrode 32b and the upper electrode 33b, the lower electrode 32b, and the upper electrode 33b make up another cell CL. One end part 33ab of the upper electrode 33a of one cell CL is formed so as to come in contact with the lower electrode 32b of the other cell CL. Both cells CL are thus connected in series.

Figure 7B:
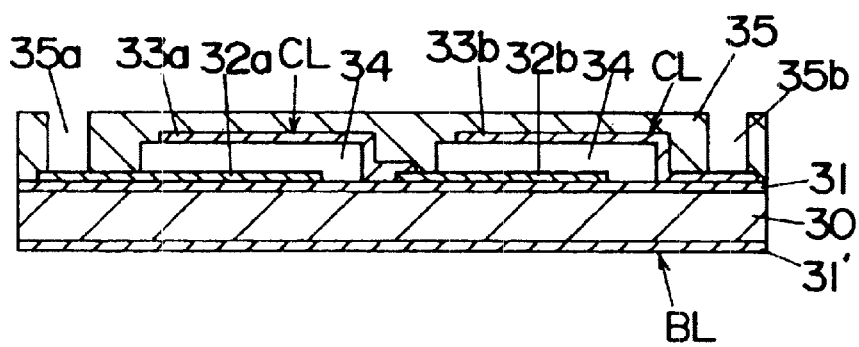

After the cells CL are connected in series, a protective film 35 made of amorphous $SiO_2$ film is formed on the full face of the main surface as shown in FIG. 7B by the plasma CDV system and a fourth resist mask having openings for connecting electrodes ER (see FIG. 7C) to the lower electrode 32a of one cell CL and the upper electrode 33b of the other cell CL is formed by lithography, next parts of the amorphous $SiO_2$ film are wet-etched to make contact holes 35a and 35b, then the fourth resist mask is removed.

Figure 7C:
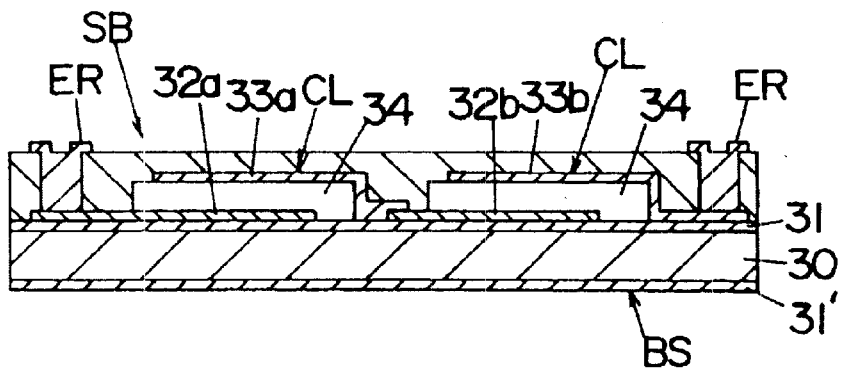
Figure 8:
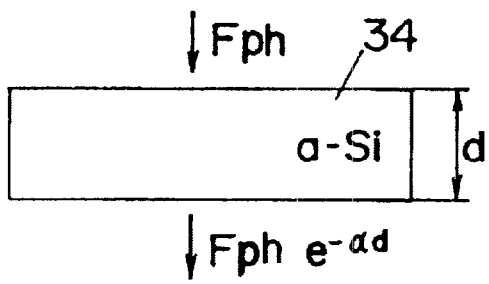
FIG. 8 is a schematic representation of the spectral sensitivity characteristic of the solar battery used in the first embodiment of the invention.

Next, an aluminum film is formed on the full face of the main surface so as to bury the contact holes 35a and 35b by the EB evaporation system, then a fifth resist mask for patterning the aluminum film to the shapes of the electrodes ER is formed by lithography, next the unnecessary portion of the aluminum film is removed by wet etching, whereby the electrodes ER (pad electrodes) are formed as shown in FIG. 7C, then the fifth resist mask is removed. The lower electrode 32a is connected to one electrode ER and the upper electrode 33b is connected to the other electrode ER. The solar battery SB comprising two cells CL connected in series is formed by executing the described process.

Figure 9:
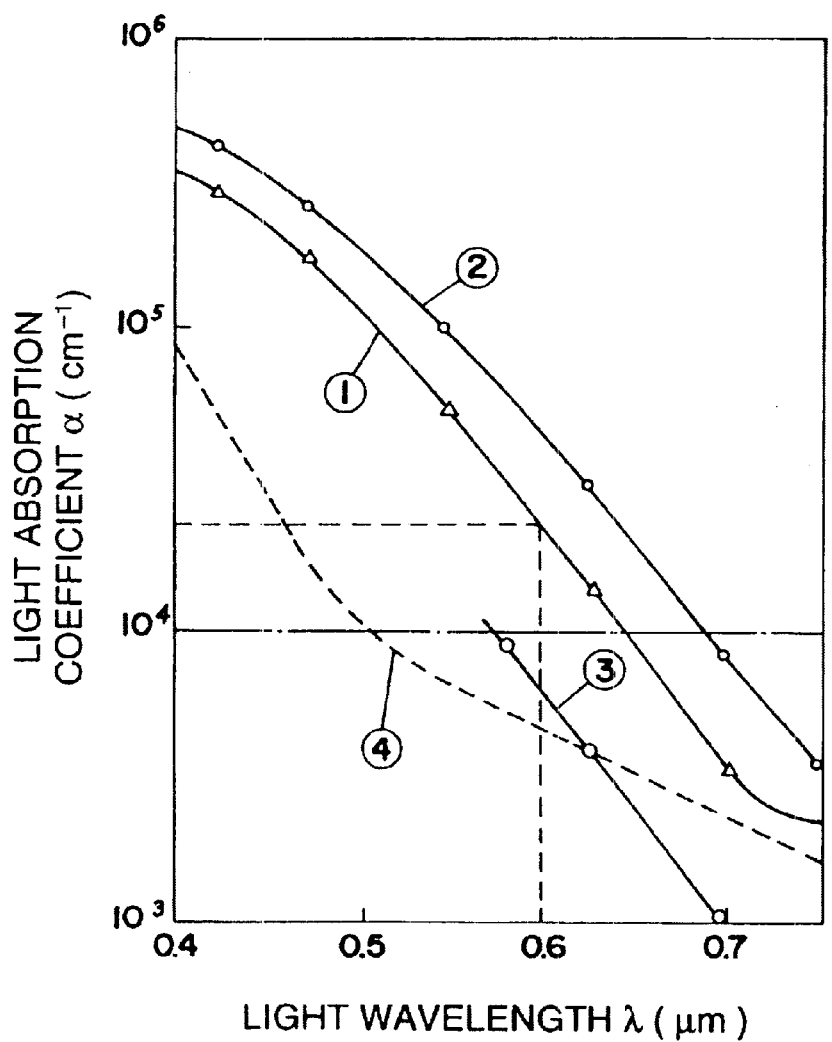
FIG. 9 is a schematic representation to show the characteristics of amorphous silicon.

By the way, considering light absorption of amorphous silicon, letting the thickness of the amorphous silicon layer 34 be d (the film thickness of the i layer becomes a value close to d since the p layer and the n layer are each sufficiently thinner than the i layer in the cell CL), the strength of light input to the main surface of the amorphous silicon layer 34 be Fph, the strength of light passing through the amorphous silicon layer 34 and emitted from the back be Fph×exp(−αd), the wavelength be λ (μm), and a light absorption coefficient be α ($cm^{-1}$), the light absorption amount of the amorphous silicon layer 34 is represented by the following expression:

Absorption amount=Fph−Fph×exp(−αd)=Fph{1−exp(−αd)} Here, the light absorption coefficient of the amorphous silicon layer 34 has wavelength dependence as shown in (1), (2), and (3) in FIG. 9 ((4) in the figure indicates wavelength dependence of monocrystalline silicon). (1), (2), and (3) indicate the cases where substrate temperature Ts when the amorphous silicon layer 34 is formed is 325° C., 420° C., and 30° C. (1) will be discussed as an example. For example, the light absorption coefficient a with wavelength λ=0.6 μm is $2\times10^{-4}$ $cm^{-1}$. The absorption length of wavelength λ=0.6 μm (film thickness d required to absorb 64% of incidence light) becomes the reciprocal of the light absorption coefficient and thus is represented by the following expression:

$$d=1/(2\times10^4)=5\times10 \text{ cm}=0.5 \text{ μm}$$

Figure 10:
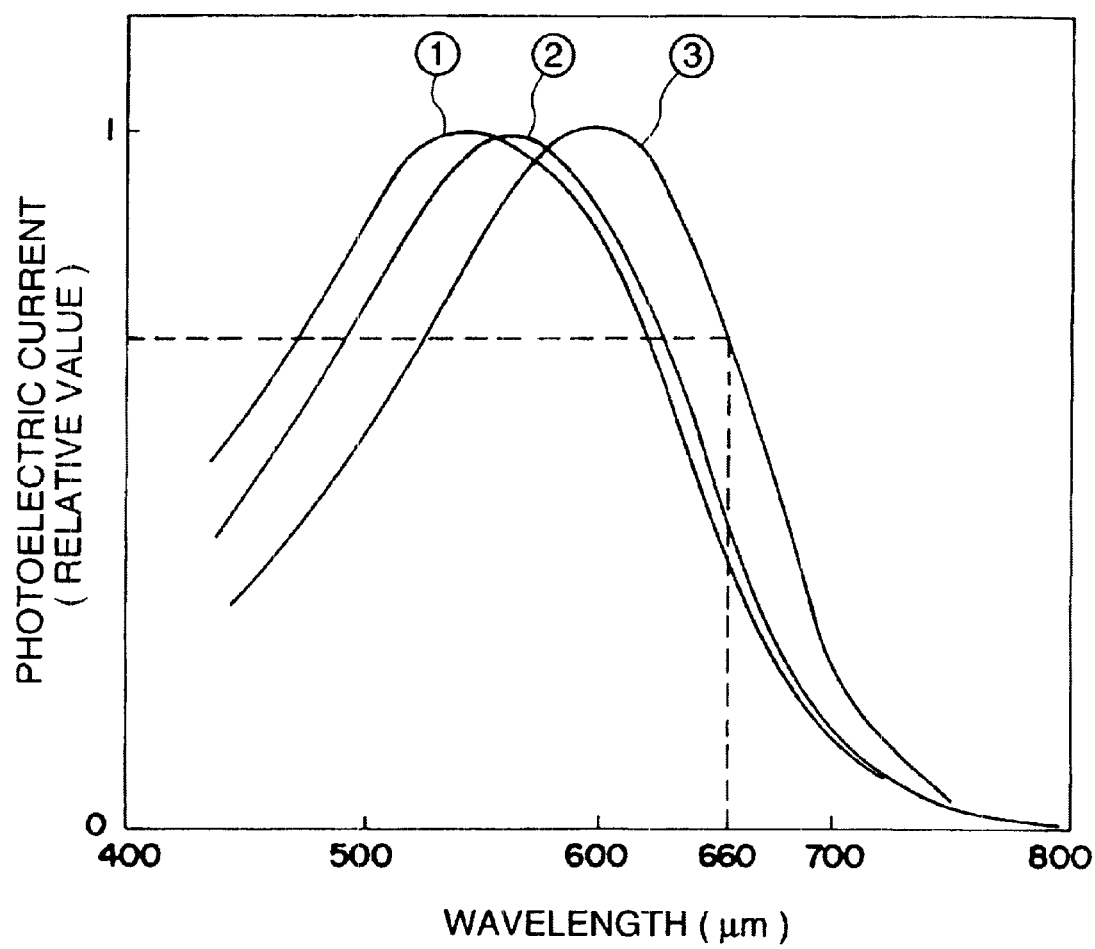
FIG. 10 is a schematic representation to describe the spectral sensitivity characteristic of the amorphous silicon in FIG. 9.

Here, the light absorption coefficient α becomes large on the short wavelength side of the wavelength λ and becomes small on the long wavelength side as shown in FIG. 9. Thus, if the film thickness d of the amorphous silicon layer 34 is lessened, the sensitivity of the short wavelength is enhanced; if the film thickness d is increased, the sensitivity of the long wavelength is enhanced. FIG. 10 shows the measurement results of photoelectric currents by changing the film thickness of the i layer in an amorphous silicon solar battery of a pin structure to 0.2 μm, 0.4 μm, and 0.6 μm as an example. The horizontal axis of FIG. 10 indicates the wavelength λ (nm) and the vertical axis indicates photoelectric current (relative value); (1), (2), and (3) in FIG. 10 correspond to the cases where the film thickness of the i layer is 0.2 μm, 0.4 μm, and 0.6 μm.

Figure 11:
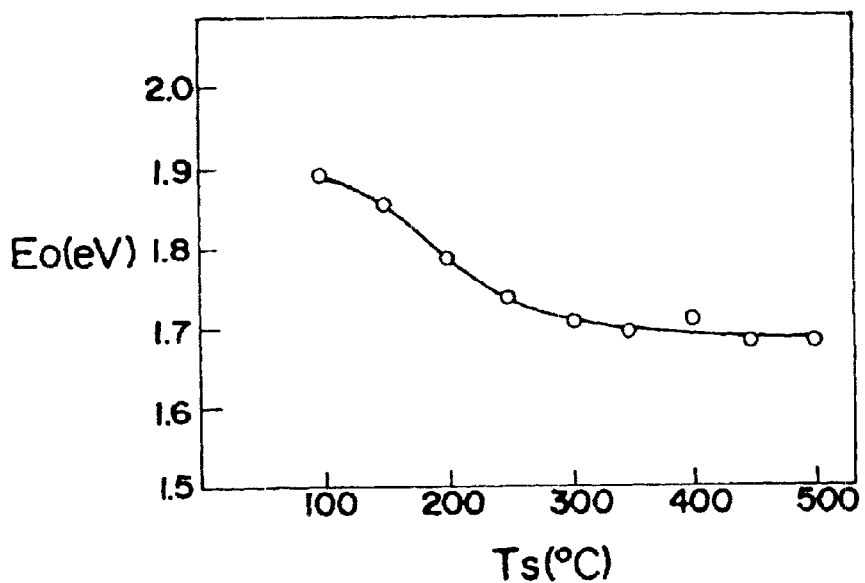
FIG. 11 is a schematic representation of the characteristic of the amorphous silicon.

On the other hand, the wavelength λ of light absorbed in semiconductor is $$\lambda=hc/E0=1.24/E0 \text{ (μm)}$$

where h is a Planck's constant, c is light velocity, and E0 (eV) is optical forbidden bandwidth. However, for amorphous silicon, the optical forbidden bandwidth E0 changes as shown in FIG. 11 depending on the substrate temperature Ts (manufacturing temperature) at the film formation time (when the substrate temperature Ts is in the range of 100° C. to 500° C., the higher the substrate temperature Ts, the smaller the optical forbidden bandwidth E0). As seen in FIG. 11, for example, when the substrate temperature Ts is 100° C., E0 becomes 1.9 eV and light of λ=1.24/1.9=0.65 μm is absorbed. When the substrate temperature Ts is 300° C., E0 becomes 1.7 ev and light of λ=1.24/1.7=0.73 μm is absorbed. In short, the amorphous silicon layer 34 allows the light absorption wavelength to be changed by adjusting the substrate temperature Ts at the manufacturing temperature.

As described above, the amorphous silicon layer 34 has a spectral sensitivity characteristic that can be changed in response to the film thickness d and the substrate temperature Ts at the manufacturing temperature. Therefore, the film thickness d and the substrate temperature at the manufacturing temperature may be adjusted so as to provide a spectral sensitivity characteristic closely similar to the luminosity characteristic of a human being. Since the cells CL forming the solar battery SB use amorphous silicon, limitations on the substrate is less as compared with the case where a single crystal is formed, and the cells CL can be easily formed at a comparatively low temperature on an insulating film such as a glass substrate, a silicon substrate, or $SiO_2$. In the above-described solar battery, one end part 33ab of the upper electrode 33a made of the transparent conductive film is brought into contact with the lower electrode 32b of the other cell CL, whereby the two cells CL are connected in series; however, cells CL may be connected in series using aluminum wiring AL, as shown in FIG. 2.

Second Embodiment

Figure 12:
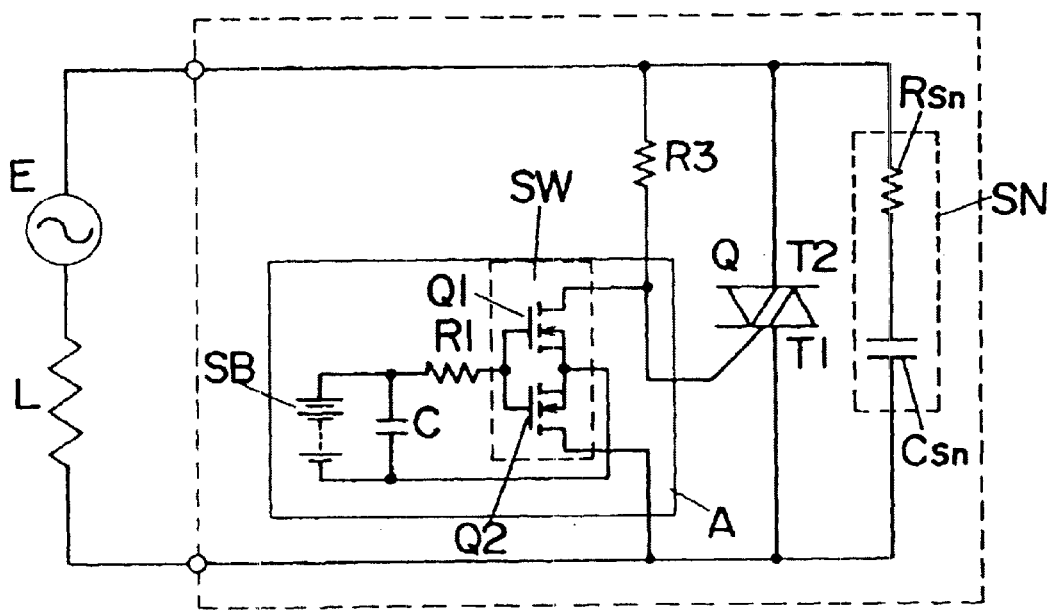
FIG. 12 is a circuit diagram to show a second embodiment of the invention.

In a second embodiment of the invention, two MOSFETs Q1 and Q2 making up a switching element SW are of enhancement type (normally off type) as shown in FIG. 12;

the positive pole of a solar battery SB is connected via a resistor R1 to gates of the MOSFETs Q1 and Q2 and the negative pole of the solar battery SB is connected to sources. The switching element SW is connected at one end (drain of MOSFET Q2) to a T1 terminal of a triac Q and at an opposite end (drain of MOSFET Q1) to a gate of the triac Q. Further, a resistor R3 is connected between the gate of the triac Q and a T2 terminal. In the configuration, when the amount of incidence light on the solar battery SB is small, the switching element SW is off. At this time, a voltage is applied to the gate of the triac Q via the resistor R3, turning on the triac Q. That is, when the surroundings become dark, the triac Q is turned on, energizing a load L. When the surroundings are bright, the solar battery SB outputs a large voltage and thus the switching element SW is turned on, short-circuiting the gate of the triac Q and the T1 terminal, so that the triac Q is turned off, not energizing the load L. Other components similar to those previously described with reference to the accompanying drawings are denoted by the same reference numerals in FIG. 12 and will not be discussed again.

Third Embodiment

Figure 13:
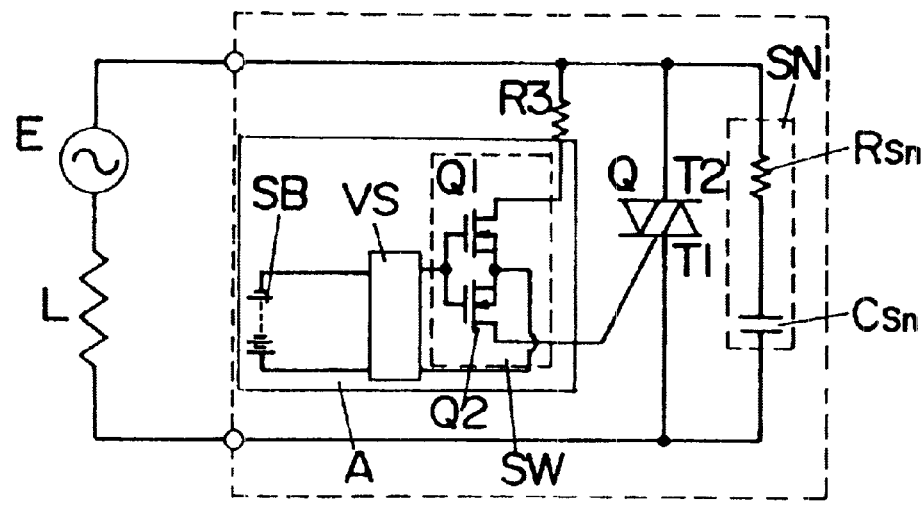
FIG. 13 is a circuit diagram to show a third embodiment of the invention.

In a third embodiment of the invention, a voltage supervisory circuit VS for supervising the output voltage of a solar battery SB, as shown in FIG. 13, in place of the capacitor C and the resistor R1 in the first embodiment. The voltage supervisory circuit VS is driven by power output from the solar battery SB, compares the output voltage of the solar battery SB with a reference voltage, and generates a binary signal for turning on or off a switching element SW. The binary signal output from the voltage supervisory circuit VS is input to a control terminal of the switching element SW. This means that the binary signal is applied between gates and sources of MOSFETs Q1 and Q2 making up the switching element SW.

The voltage supervisory circuit VS consists of a reference voltage generation circuit GV for generating reference voltage Vref and a comparator CP for generating a binary signal of a predetermined negative voltage (low) or a binary signal of 0 V (high) in response to the larger-than or smaller-than relation between the output voltage of the solar battery SB and the reference voltage Vref. The comparator CP is connected so as to output a low binary signal when the surroundings become bright and the output voltage of the solar battery SB rises. Therefore, when the surroundings become bright and the output voltage of the solar battery SB becomes larger than the reference voltage Vref, the comparator CP outputs a low signal and the gate potential of the MOSFET Q1, Q2 becomes lower than the source potential, thus the switching element SW is turned off. On the other hand, when the surroundings become dark and the output voltage of the solar battery SB becomes smaller than the reference voltage Vref, the comparator CP outputs a high signal and the gate potential of the MOSFET Q1, Q2 becomes equal to the source potential, thus the MOSFETs Q1 and Q2 cannot maintain the off state and the switching element SW is turned on.

According to the described operation, when the surroundings become bright and the output voltage of the solar battery SB becomes larger than the reference voltage Vref, the switching element SW is turned off and a triac Q is not triggered, thus a load L is not lighted. On the other hand, when the surroundings become dark and the output voltage of the solar battery SB becomes smaller than the reference voltage Vref, the gate potential of the MOSFET Q1, Q2 becomes equal to the source potential because of the output of the voltage supervisory circuit VS, thus the switching element SW is turned on and a gate signal is given to the triac Q, which is then turned on, turning on the load L.

Figure 15:
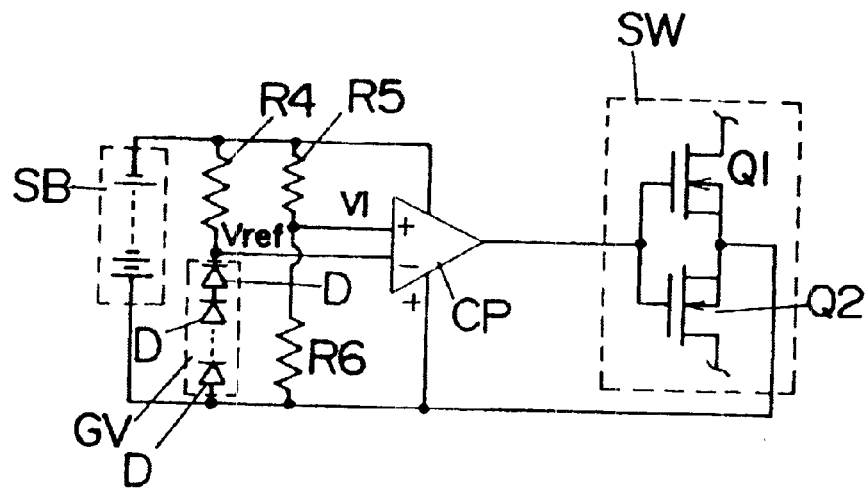
FIG. 15 is a main part circuit diagram in the third embodiment of the invention.

Specifically, a series circuit of a plurality of diodes D connected via a resistor R4 to the solar battery SB, as shown in FIG. 15, is used as the reference voltage generation circuit GV. The diodes D are connected in a forward direction with respect to the output voltage polarity of the solar battery SB and the reference voltage Vref determined by the sum of the forward voltages of the diodes D is applied to an inversion input terminal of the comparator CP. A series circuit of resistors R5 and R6 is connected across the solar battery SB and voltage V1 provided by dividing the output voltage of the solar battery SB through the resistors R5 and R6 is input to a non-inversion input terminal of the comparator CP. The comparator CP has an output terminal connected to the control terminal of the switching element SW.

According to the configuration, when the surroundings become bright and the voltage V1 provided by dividing the output voltage of the solar battery SB through the resistors R5 and R6 is brought into the negative side and falls below the reference voltage Vref, the comparator CP outputs a low signal and the gate of the MOSFET Q1, Q2 becomes a negative potential, thus the switching element SW is turned off. If the switching element SW is thus off, the triac Q is off and the load L is not energized. When the surroundings become dark, the output voltage of the solar battery SB lowers and the comparator CP outputs a high signal (0 V), thus the switching element SW cannot maintain the off state and is turned on and the triac Q is triggered and is turned on, energizing the load L.

Figure 14:
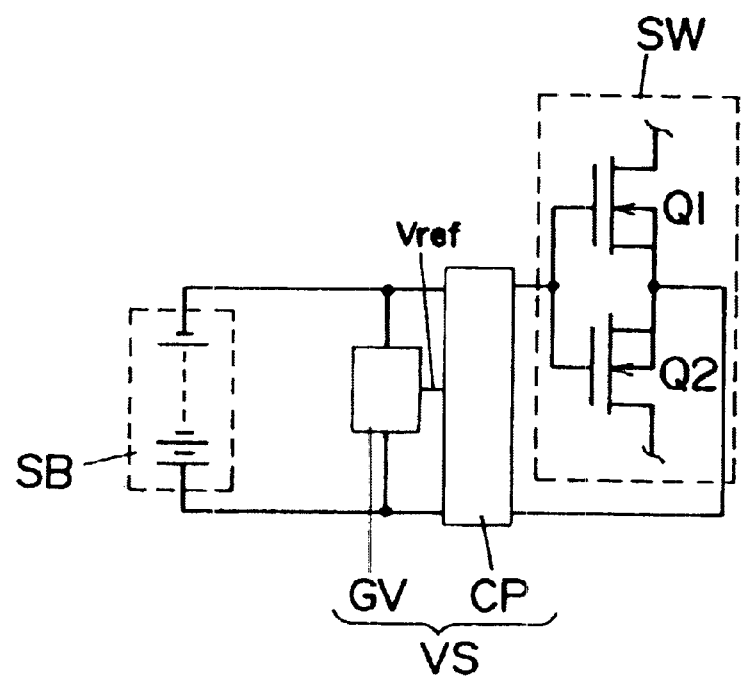
FIG. 14 is a main part circuit diagram in the third embodiment of the invention.

Since the voltage supervisory circuit VS is made up of the reference voltage generation circuit GV and the comparator CP, the threshold value for the brightness for turning on/off the switching element SW can be set with accuracy. Since the reference voltage Vref is generated by the series circuit of the diodes D, it can be generated in the simple circuit configuration. Other components similar to those in the first embodiment previously described with reference to the accompanying drawings are denoted by the same reference numerals in FIGS. 13 to 15 and will not be discussed again.

Fourth Embodiment

In the above-described embodiments, the brightness threshold value applied when the load L is switched off from the light state and on from the off state is constant. In a fourth embodiment of the invention, hysteresis is given to the brightness threshold value applied when a load L is switched off from the light state and that applied when the load L is switched on from the off state.

Figure 16:
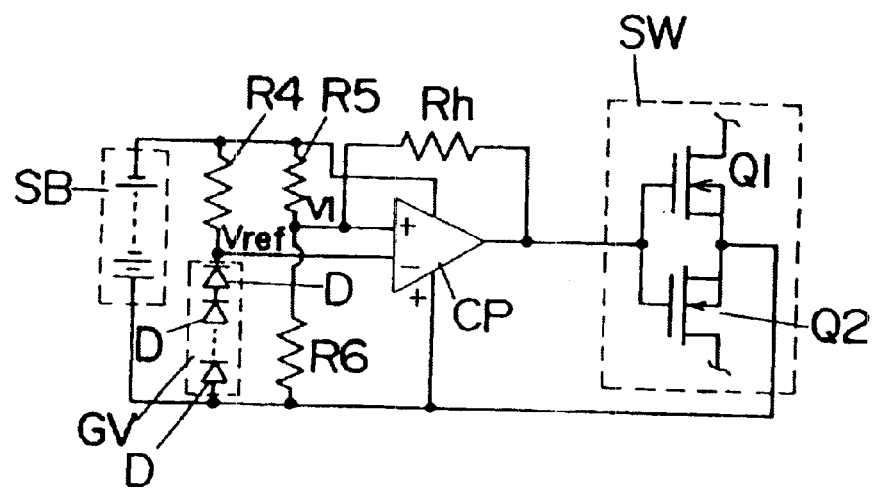
FIG. 16 is a main part circuit diagram to show a fourth embodiment of the invention.

That is, in the embodiment, as shown in FIG. 16, a feedback resistor Rh is connected between the output terminal and non-inversion input terminal of the comparator CP in the circuit configuration shown in FIG. 15, whereby hysteresis is given to the threshold value of the comparator CP with respect to the output voltage of a solar battery SB. The resistor Rh is provided, whereby the dividing ratio of voltage V1 applied to the non-inversion input terminal of the comparator CP can be changed in response to output of the comparator CP.

More particularly, when the surroundings are bright and the comparator CP outputs a low signal as in FIG. 17A, a switching element SW is off as in FIG. 17C and a load L is off as in FIG. 17B. In this state, equivalently a resistor R5 and the resistor Rh are connected in parallel and the absolute value of the voltage V1 becomes large (the negative side becomes large), thus a threshold value L1 for the brightness when the output of the comparator CP is switched high from the low state becomes relatively small. This means that the switching element SW becomes hard to be turned on from the off state.

In contrast, when the surroundings become darker than the brightness corresponding to the threshold value L1 as in FIG. 17A, the comparator CP outputs a high signal and the switching element SW is turned on as in FIG. 17C and the load L is turned on as in FIG. 17B. At this time, equivalently a resistor R6 and the resistor Rh are connected in parallel, the absolute value of the voltage V1 becomes small and a threshold value L2 for the brightness when the output of the comparator CP is switched low from the high state becomes relatively large. This means that the switching element SW becomes hard to be turned off from the on state.

As described above, hysteresis is given to the brightness threshold values when a triac Q is turned on and off, and the brightness threshold value L2 when the triac Q is turned off for turning off the load L is raised as compared with the brightness threshold value L1 when the triac Q is turned on for turning on the load L. As the operation is performed, the load L once turned on becomes hard to be turned off if the brightness of ambient light a little varies and the load L once turned off becomes hard to be turned on if the brightness of ambient light a little varies. This means that the brightness threshold value L2 for turning off the load L becomes higher than the brightness threshold value L1 for turning on the load L by ΔLx.

Hysteresis is thus given to the brightness thresholds, whereby a malfunction can be prevented for variation in the brightness of ambient light such as variation in ambient light caused by headlights of an automobile in the night. Thus, as compared with such a configuration wherein a delay circuit, etc., adjusts the response time of the switching element SW to output variation of the solar battery SB, a malfunction caused by change speed of brightness does not occur and moreover the load L can be turned on and off in good response if the brightness of ambient light sufficiently changes. Further, the power for giving hysteresis is minute and can be supplied from the solar battery SB, thus a leakage current when the load L is turned off scarcely occurs; particularly, to use a glow-type fluorescent lamp as a load, a problem of causing glow discharge to occur can be circumvented. Other components similar to those in the first embodiment previously described with reference to the accompanying drawings are denoted by the same reference numerals in FIG. 16 and will not be discussed again.

Fifth Embodiment

In a fifth embodiment of the invention, as the configuration for giving hysteresis to a threshold value with respect to the output voltage of solar battery SB, a configuration wherein a depletion-type MOSFET Q4 as a threshold value switching element is connected in parallel to a part of cells CL of solar battery SB and an output terminal of a comparator CP is connected to a gate of the MOSFET Q4, as shown in FIG. 18, is adopted in place of use of the feedback resistor Rh.

In the configuration, when the surroundings become bright and voltage V1 provided by dividing the output voltage of the solar battery SB through resistors R5 and R6 is brought into the negative side and falls below reference voltage Vref, the comparator CP outputs a low signal and gate of MOSFET Q1, Q2 becomes a negative potential, thus the switching element SW is turned off. At the same time, the MOSFET Q4 is also turned off, thus the output voltage of the solar battery SB becomes large. Consequently, the voltage V1 further becomes large on the negative side and the brightness threshold value of ambient light when a load L is switched on from the off state becomes relatively small.

On the other hand, when the surroundings become dark and the voltage V1 provided by dividing the output voltage of the solar battery SB through resistors R5 and R6 exceeds the reference voltage Vref, the comparator CP outputs a high signal (roughly 0 V) and the switching element SW cannot maintain the off state and is turned on. If the switching element SW is turned on, the MOSFET Q4 is also turned on, thus a part of the cells CL of the solar battery SB is short-circuited by the MOSFET Q4 and the output voltage of the solar battery SB becomes small. Consequently, the brightness threshold value of ambient light when the load L is switched off from the on state becomes relatively large.

The comparator CP thus controls the MOSFET Q4 as the threshold value switching element connected in parallel to a part of the cells CL making up the solar battery SB, whereby hysteresis can be given to the threshold value with respect to the output voltage of solar battery SB.

Figure 19:
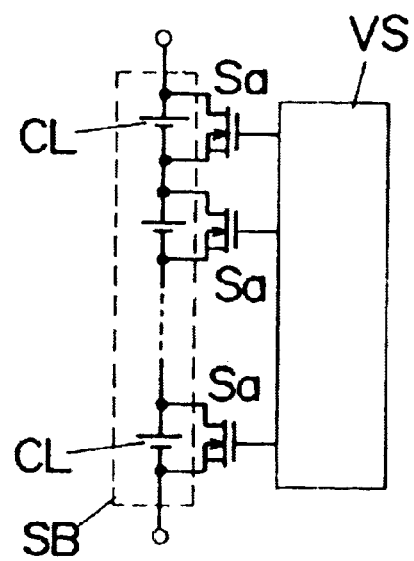
FIG. 19 is a main part circuit diagram to show another configuration example in the fifth embodiment of the invention.

As shown in FIG. 19, a configuration wherein depletion-type MOSFETs Sa as threshold value switching elements are connected in parallel to the cells CL making up the solar battery SB in a one-to-one correspondence can also be adopted. That is, a voltage supervisory circuit VS turns on and off the MOSFETs Sa separately, whereby it is made possible to appropriately select the number of the cells CL making up the solar battery SB. Other components similar to those in the first and fourth embodiments previously described with reference to the accompanying drawings are denoted by the same reference numerals in FIG. 18 and will not be discussed again. The advantages provided by giving hysteresis are similar to those in the fourth embodiment.

Sixth Embodiment

Figure 20:
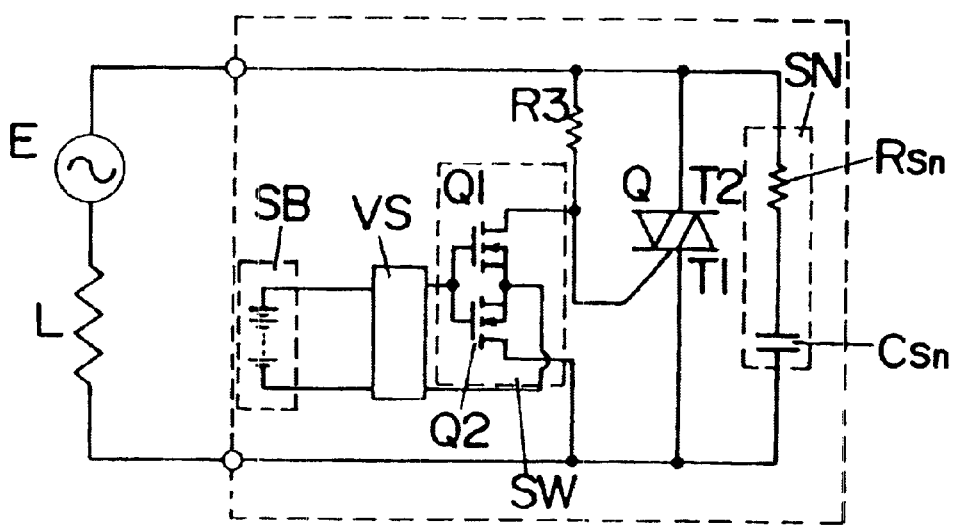
FIG. 20 is a circuit diagram to show a sixth embodiment of the invention.

A sixth embodiment of the invention basically has a similar configuration to that shown in FIG. 13; in the sixth embodiment, a switching element SW is made up of enhancement-type (normally-off-type) MOSFETs Q1 and Q2, as shown in FIG. 20. The switching element SW is connected at one end (drain of MOSFET Q1) to a T2 terminal of a triac Q via a resistor R3 and to a gate of the triac Q. The switching element SW is connected at an opposite end (drain of MOSFET Q2) to a T1 terminal of the triac Q. Further, the output voltage of a solar battery SB is input to a voltage supervisory circuit VS and the polarity is reverse to that in the configuration shown in FIG. 13.

Figure 21:
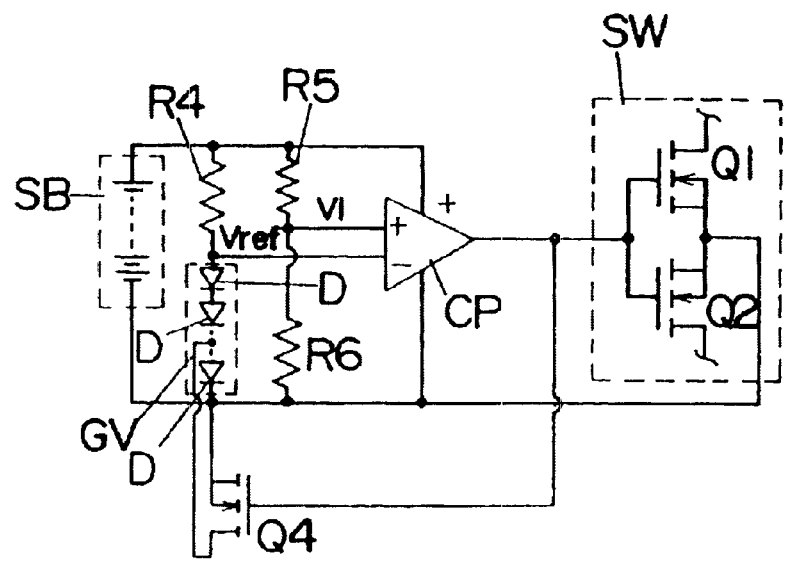
FIG. 21 is a main part circuit diagram in the sixth embodiment of the invention.

As shown in FIG. 21, the voltage supervisory circuit VS basically has a similar configuration to that of the voltage supervisory circuit VS shown in FIG. 15, namely, consists of a reference voltage generation circuit GV for generating reference voltage Vref and a comparator CP for comparing the output voltage of the solar battery SB with the reference voltage Vref and outputting a binary signal. However, a configuration for giving hysteresis to a threshold value with respect to the output voltage of the solar battery SB is a configuration for switching the output voltage of the reference voltage generation circuit GV. That is, an enhancement-type MOSFET Q4 as a threshold value switching element is connected in parallel to a part of diodes D making up the reference voltage generation circuit GV and an output terminal of the comparator CP is connected to a gate of the MOSFET Q4. Since the connection polarity of the solar battery SB to the switching element SW is reverse to that in the configuration shown in FIG. 15, the polarity of each of the diodes D placed in the reference voltage generation circuit GV is also reverse (however, forward to the output voltage polarity of the solar battery SB).

In the configuration, when the surroundings become dark and voltage V1 provided by dividing the output voltage of the solar battery SB through resistors R5 and R6 rises and exceeds the reference voltage Vref, the comparator CP outputs a high signal and the gate potential of the MOSFET Q1, Q2 becomes higher than the source potential, thus the switching element SW is turned on. If the switching element SW is on, the gate and the T1 terminal of the triac Q are short-circuited, thus the triac Q is turned off and a load L is not energized. At the same time, the MOSFET Q4 is also turned off, thus some diodes D are short-circuited, the reference voltage Vref output from the reference voltage generation circuit GV becomes small, and the brightness threshold value when the switching element SW is switched off from the on state, namely, the brightness threshold value of ambient light when the load L is switched on from the off state becomes relatively small.

On the other hand, when the surroundings become dark and the voltage V1 provided by dividing the output voltage of the solar battery SB through resistors R5 and R6 falls below the reference voltage Vref, the comparator CP outputs a low signal, the switching element SW is turned off, and the triac Q is triggered through the resistor R3 and is turned on, energizing the load L. If the switching element SW is turned off, the MOSFET Q4 is also turned off, thus all diodes of the reference voltage generation circuit GV are connected in series and the reference voltage Vref becomes large. Consequently, the brightness threshold value of ambient light when the load L is switched off from the on state becomes relatively large.

The comparator CP thus controls the MOSFET Q4 as the threshold value switching element connected in parallel to a part of cells CL making up the solar battery SB, whereby hysteresis can be given to the threshold value with respect to the output voltage of solar battery SB.

Figure 22:
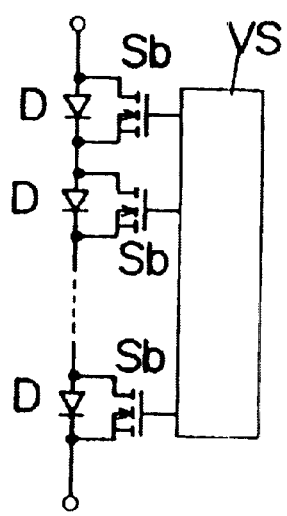
FIG. 22 is a main part circuit diagram to show another configuration example in the sixth embodiment of the invention.

As shown in FIG. 22, a configuration wherein enhancement-type MOSFETs Sb as threshold value switching elements are connected in parallel to the diodes D making up the reference voltage generation circuit GV in a one-to-one correspondence can also be adopted. That is, the voltage supervisory circuit VS turns on and off the MOSFETs Sb separately, whereby it is made possible to control the reference voltage Vref to any desired voltage value. Other components similar to those in the first and fourth embodiments previously described with reference to the accompanying drawings are denoted by the same reference numerals in FIGS. 20 and 21 and will not be discussed again. The advantages provided by giving hysteresis are similar to those in the fourth embodiment.

In the embodiment, the reference voltage Vref is changed in response to the output of the comparator CP, whereby hysteresis is given to the relationship between the ambient light and turning on/off the load L. However, instead of changing the reference voltage Vref, a feedback resistor may be connected between the output terminal and a non-inversion input terminal of the comparator CP for giving hysteresis or the number of cells CL connected in series in the solar battery SB may be changed for giving hysteresis.

Seventh Embodiment

Figure 23:
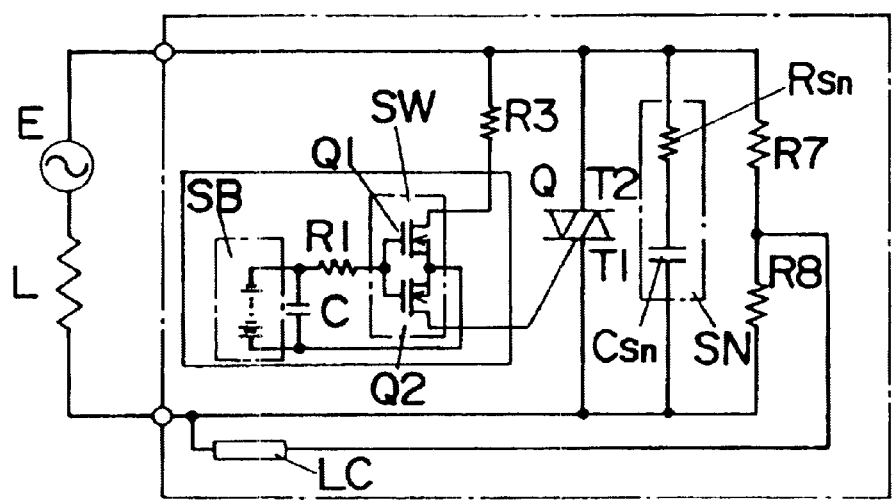
FIG. 23 is a circuit diagram to show a seventh embodiment of the invention.

In a seventh embodiment of the invention, a liquid crystal plate LC as a light quantity adjustment member placed in an incidence path of ambient light on a solar battery SB is used as a configuration of giving hysteresis to the relationship between the ambient light and turning on/off a load L. That is, with the circuit shown in FIG. 1 as a basic configuration, a series circuit of two resistors R7 and R8 is connected in parallel to a triac Q and the liquid crystal plate LC is connected in parallel to the resistor R8, as shown in FIG. 23. The liquid crystal plate LC is of transmittance type and has transmittance changed in response to the strength of an electric field applied to liquid crystal. The liquid crystal plate LC used here is of negative type wherein the transmittance when no power is supplied is made lower than that when power is supplied. That is, the liquid crystal plate LC has transmittance lowered when the triac Q is turned on and no power is supplied and raised when the triac Q is turned off and power is supplied.

Figure 24:
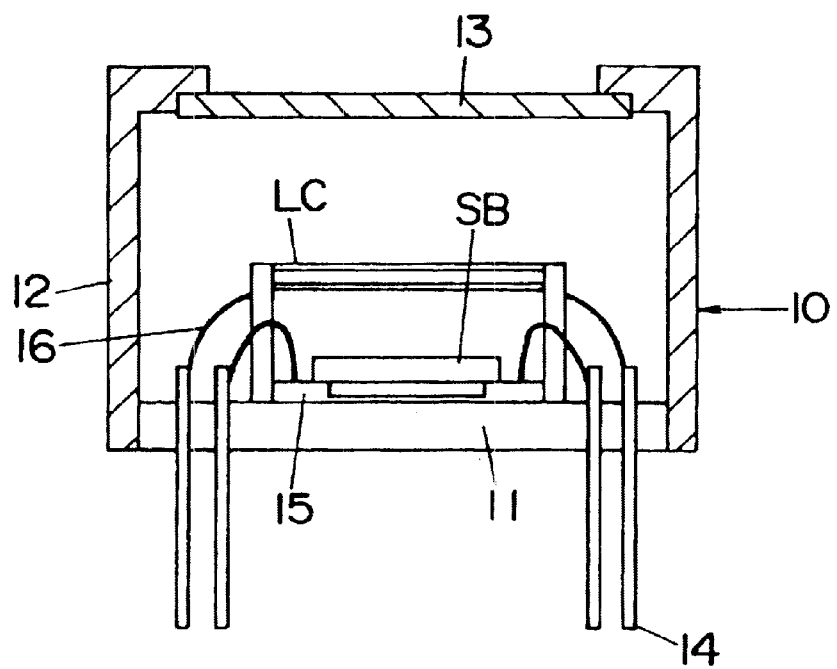
FIG. 24 is a sectional view of an illumination sensor used in the seventh embodiment of the invention.

The liquid crystal plate LC is placed between a translucent plate 13 and the solar battery SB in a package 10, as shown in FIG. 24. This means that the light reception face of the solar battery SB is covered with the liquid crystal plate LC. Therefore, ambient light is incident on the solar battery SB through the translucent plate 13 and the liquid crystal plate LC, namely, the ambient light passing through the translucent plate 13 is reduced appropriately by the liquid crystal plate LC before it is incident on the solar battery SB. A terminal pin 14 inserted into a base 11 is connected to a board 15 on which the solar battery SB, etc., is mounted by wire 16.

In the configuration of the embodiment, when the ambient light is bright as in FIG. 25A, the switching element SW is turned off because of the output voltage of the solar battery SB and the triac is held off as in FIG. 25B and the load L is not energized. At this time, power is supplied to the liquid crystal plate LC, thus the transmittance of the liquid crystal plate LC is high ("open" in FIG. 25C in the sense that the window portion of the liquid crystal plate LC for allowing light to pass through is open) and the quantity of light incident on the solar battery SB is increased. This means that a threshold value L1 for the ambient light is relatively low.

On the other hand, when the surroundings become dark and the ambient light lowers to the threshold value L1 at time t1 as in FIG. 25A and it is made impossible for output of the solar battery SB to maintain the off state of the switching element SW, the switching element SW is turned on and the triac Q is turned on as in FIG. 25B, thereby energizing and lighting the load L. At this time, power supply to the liquid crystal plate LC is cut off, thus the transmittance of the liquid crystal plate LC lowers ("closed" in FIG. 25C in the sense that the windowportion of the liquid crystal plate LC is closed) and the quantity of light incident on the solar battery SB is more decreased. This means that a threshold value L2 for the ambient light becomes relatively low. Thus, once the triac Q is turned on, light incident on the solar battery SB is reduced by the liquid crystal plate LC if the brightness level of the ambient light is a little increased, so that the triac Q becomes hard to be turned off and the load L can be maintained on.

Then, when the surroundings become bright and the ambient light reaches the threshold value L2 at time t2, the triac Q is turned off, the load L is turned off, and power is supplied from a power supply E to the liquid crystal plate LC, which is then placed in an open state. This means that hysteresis of difference ΔLx between the threshold values L1 and L2 is given to turning on/off the triac Q in response to change in the ambient light. The hysteresis characteristic can be adjusted by adjusting the dividing ratio of the resistors R7 and R8 for applying voltage to the liquid crystal plate LC. In the configuration of the embodiment, the solar battery SB and the liquid crystal plate LC are housed in the package 10, so that light of disturbance is not incident on the space between the liquid crystal plate LC and the solar battery SB and the light reduction characteristic of the liquid crystal plate LC can be adjusted with high accuracy.

In the embodiment, the liquid crystal plate LC is placed between the translucent plate 13 and the solar battery SB, but liquid crystal plate LC may be placed instead of the translucent plate 13.

Eighth Embodiment

In an eighth embodiment of the invention, a switching element 20 SW is made up of enhancement-type MOSFETs Q1 and Q2, as shown in FIG. 26. Therefore, the connection polarity of a solar battery SB is reverse to that in the seventh embodiment. The switching element SW is connected at one end (drain of MOSFET Q1) to a T2 terminal of a triac Q via a resistor R3 and to a gate of the triac Q and is connected at an opposite end (drain of MOSFET Q2) to a T1 terminal of the triac Q. This configuration is similar to that shown in FIG. 12 except for the portion for driving liquid crystal plate LC. The liquid crystal plate LC is connected in parallel to a resistor R8 as in the seventh embodiment shown in FIG. 23 and a series circuit of the resistor R8 and a resistor R7 is connected across a triac Q. Other components are similar to those in the seventh embodiment; according to the configuration of the eighth embodiment, hysteresis is also given to turning on/off the triac Q in response to the brightness of ambient light.

Ninth Embodiment

Figure 27:
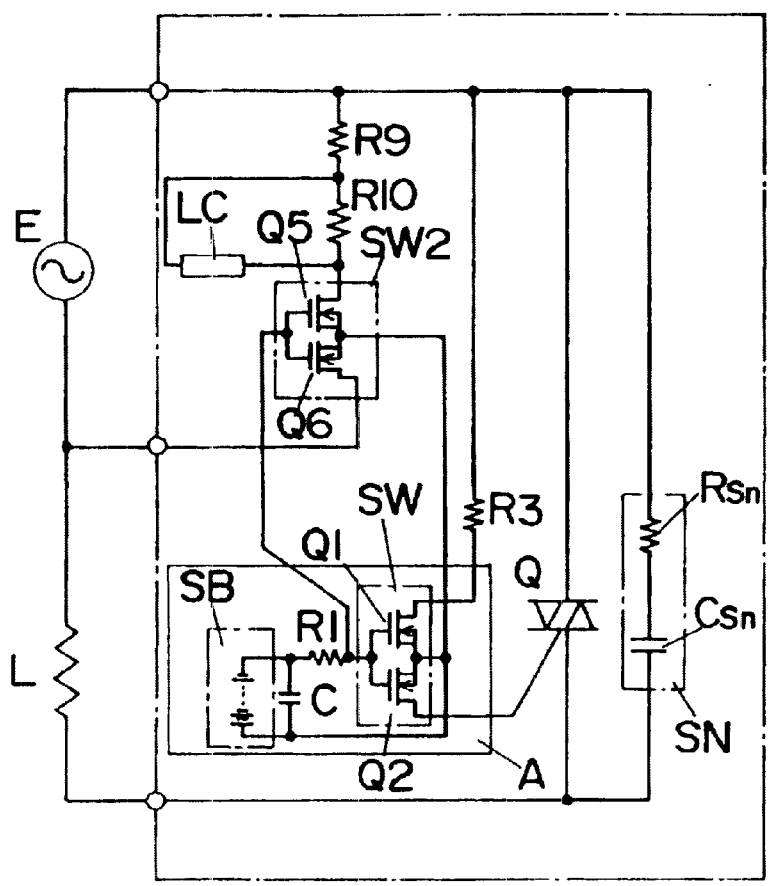
FIG. 27 is a circuit diagram to show a ninth embodiment of the invention.

In a ninth embodiment of the invention, as shown in FIG. 27, a switching element SW2 driven by a solar battery SB is provided for driving a liquid crystal plate LC aside from a switching element SW in an illumination sensor A. The switching element SW2 comprises two depletion-type (normally-on-type) MOSFETs Q5 and Q6 connected in inverse series and sources are connected and gates are connected in common. The gate of the switching element SW2 as a control terminal thereof is connected to the negative pole of the solar battery SB via a resistor R1 and the source is connected to the positive pole of the solar battery SB.

The switching element SW2 is connected to a power supply E via a series circuit of resistors R9 and R10 and the liquid crystal plate LC is connected in parallel to the resistor R10. The liquid crystal plate LC is of positive type wherein the transmittance when power is supplied is made lower than that when no power is supplied; the transmittance when the switching element SW2 is on is made lower than that when the switching element SW2 is off.

When the surroundings are bright, the switching element SW and a triac Q are off and a load L is off. At this time, the switching element SW2 is also off and thus no power is supplied to the liquid crystal plate LC from a power supply E, the transmittance of the liquid crystal plate LC is high, and a threshold value for ambient light is relatively low.

On the other hand, when the surroundings become dark and it is made impossible for output of the solar battery SB to maintain the off state of the switching element SW, the switching element SW is turned on and the triac Q is turned on and the load L is also turned on. At this time, the switching element SW2 is also turned on, thus power is supplied from the power supply E to the liquid crystal plate LC, the transmittance of the liquid crystal plate LC lowers, and the quantity of light incident on the solar battery SB is more decreased. This means that the threshold value for the ambient light becomes relatively high.

According to the described operation, in the embodiment, the threshold value for the ambient light can also be changed for giving hysteresis. This means that a similar advantage to that of the seventh embodiment can be provided. Other components are similar to those in the seventh embodiment. In the ninth embodiment, the liquid crystal plate LC of the positive type is used, but if the switching element SW2 is made up of enhancement-type MOSFETs rather than the depletion-type MOSFETs and the connection polarity of the gate and the source and the solar battery SB is reversed, the liquid crystal plate LC of the negative type can be used.

Tenth Embodiment

In a tenth embodiment of the invention, a light emitting element for making light incident on a solar battery SB aside from ambient light is added as a configuration for giving hysteresis to turning on/off a triac Q in response to the ambient light.

Figure 28:
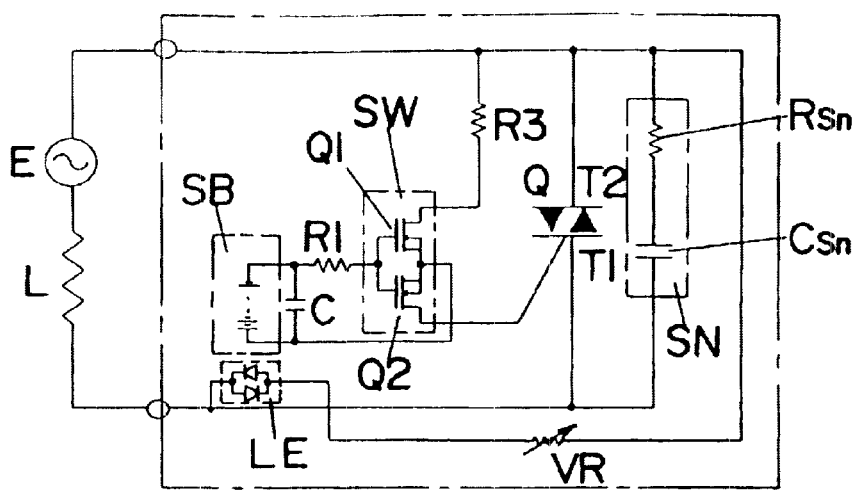
FIG. 28 is a circuit diagram to show a tenth embodiment of the invention.

That is, as shown in FIG. 28, a series circuit of a variable resistor VR for limiting a current and the light emitting element LE is connected across the triac Q and light from the light emitting element LE is made incident on the solar battery SB. An AC power supply is used as a power supply E and an alternating current flows into the light emitting element LE, thus the light emitting element LE used comprises two light emitting diodes connected in inverse parallel. This means that the light emitting element LE allows an electric current to flow in two ways. Bidirectional light emitting diode comprising a pair of light emitting diodes connected in reverse parallel and housed in one case may be used as the light emitting element LE. Since the series circuit of the variable resistor VR and the light emitting element LE is connected in parallel to the triac Q, if the triac Q is turned on, the light emitting element LE is turned off.

According to the described configuration, when the surroundings are bright, gate of MOSFET Q1, Q2 becomes a negative potential because of output voltage of the solar battery SB, thus a switching element SW is turned off and a gate signal is not given to a gate of the triac Q, which is held on. This means that a load L is not lighted. At this time, a current flows into the light emitting element LE, so that the light emitting element LE is turned on and the ambient light from the surroundings and light from the light emitting element LE are made incident on the solar battery SB. This means that the solar battery SB outputs larger power than that when only the ambient light exists. In other words, the brightness level of the ambient light to provide the minimum electromotive force of the solar battery SB to hold the switching element SW off becomes lower than that when the light emitting element LE does not exist.

On the other hand, when the surroundings become dark and it is made impossible for output of the solar battery SB to maintain the off state of the switching element SW, the switching element SW is turned on and a gate signal is given to the triac Q for turning on the triac Q. This means that power is supplied to the load L, which is then lighted. When the triac Q is turned on, no power is supplied to the light emitting element LE, thus the light emitting element LE is turned off and the quantity of light incident on the solar battery SB is more lessened. That is, once the triac Q is turned on, it is not turned off if the brightness level of the ambient light is a little increased, and the on state of the load L can be maintained.

In short, hysteresis is given to turning on/off the triac Q in response to the brightness of the ambient light and the brightness for turning off the triac Q is raised as compared with the brightness for turning on the triac Q. As the operation is performed, the triac Q once turned on becomes hard to be turned off if the brightness a little varies and the triac Q once turned off becomes hard to be turned on if the brightness a little varies. FIGS. 29A to 29E show the relation. FIG. 29A shows how the light emitting element LE is turned on and off, FIG. 29B shows change in the ambient light, FIG. 29C shows change in the quantity of light incident on the solar battery SB, FIG. 29D shows turning on and off the switching element SW, and FIG. 29E shows turning on and off the load L. As seen in FIGS. 29A to 29E, threshold value L2 for the brightness of ambient light when the load L is turned off becomes higher than threshold value L1 for the brightness of ambient light when the load L is turned on by ΔLx.

Figure 30:
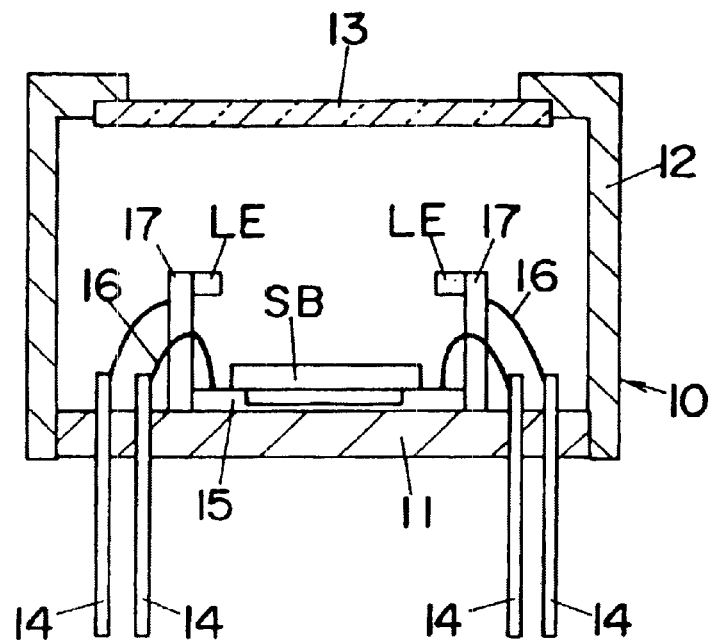
FIG. 30 is a schematic sectional view to show a package used in the tenth embodiment of the invention.

A board 15 comprising the solar battery SB, the switching element SW, a resistor R1, and a capacitor C is housed in a package 10 as shown in FIG. 30 together with the light emitting element LE. Ambient light is incident on the solar battery SB through a translucent plate 13 and light from the light emitting element LE placed on the upper part of a support bed 17 placed upright on a base 11 can also be incident on the solar battery SB. Other components are similar to those in the first embodiment.

As described above, the light emitting element LE turned off when the load L is turned on and turned on when the load L is turned off is provided and the light from the light emitting element LE as well as the ambient light is made incident on the solar battery SB, so that hysteresis can be given to the relationship between the surrounding brightness and turning on and off the triac Q and if the surrounding brightness varies, the load L can be maintained on or off. Since the brightness threshold value when the triac Q is turned on or off is changed, thereby preventing a malfunction, a malfunction caused by change speed of brightness as in a configuration wherein a delay circuit, etc., adjusts the response time does not occur and moreover good response to change in the brightness can be provided. The configuration wherein the current flowing into the light emitting element LE is adjusted by the variable resistor VR is adopted and the light quantity of the light emitting element LE when the surroundings are bright can be adjusted by the variable resistor VR and the hysteresis characteristic can be adjusted. Thus, adjustments can be made in response to the operating conditions.

Eleventh Embodiment

Figure 31:
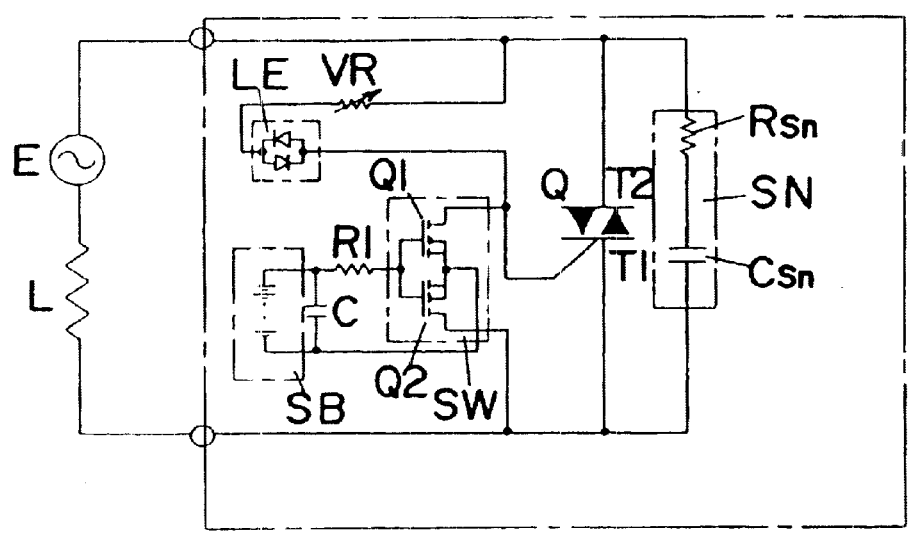
FIG. 31 is a circuit diagram to show an eleventh embodiment of the invention.

In an eleventh embodiment of the invention, as shown in FIG. 31, a series circuit of a light emitting element LE and a variable resistor VR is connected in series to a switching element SW and a series circuit of the light emitting element LE, the variable resistor VR, and the switching element SW is connected in parallel to a triac Q. The switching element SW is connected between a gate and a T1 terminal of the triac Q. MOSFETs Q1 and Q2 making up the switching element SW are of enhancement type and the positive polarity of a solar battery SB is connected to gate of MOSFET Q1, Q2 via a resistor R1 and when the quantity of light incident on the solar battery SB is small, the switching element SW is off. In the configuration, when the switching element SW is off, the triac Q is triggered through the variable resistor VR and the light emitting element LE, whereby the triac Q is turned on. That is, when the surroundings become dark, the triac Q is turned on and a load L is energized as in the tenth embodiment. At this time, no current flows into the light emitting element LE and thus the light emitting element LE is turned off.

On the other hand, when the surroundings are bright, the solar battery SB outputs a larger voltage. Thus, the switching element SW is turned on because of the output voltage of the solar battery SB. When the switching element SW is turned on, the triac Q is turned off, not energizing the load L. Since a current flows into the light emitting element LE through the variable resistor VR and the switching element SW, the light emitting element LE is turned on and light from the light emitting element LE together with ambient light is introduced into the solar battery SB. Consequently, hysteresis can be given to the relationship between the surrounding brightness and turning on and off the triac Q as in the tenth embodiment. In the configuration, the variable resistor VR for limiting a current into the light emitting element LE is also used as the resistor R3 in the tenth embodiment, so that the number of parts is decremented by one (resistor R3) as compared with the tenth embodiment. Other components are similar to those in the tenth embodiment.

Twelfth Embodiment

Figure 32:
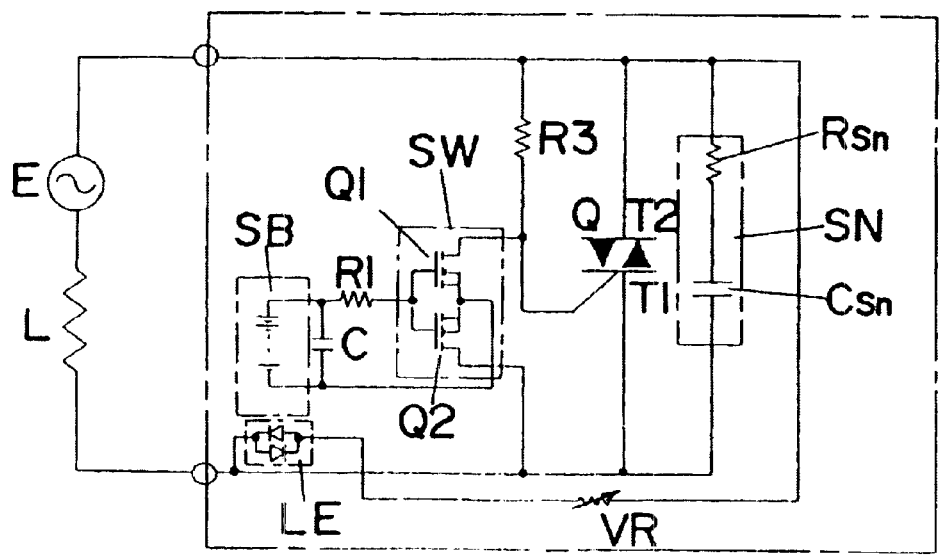
FIG. 32 is a circuit diagram to show a twelfth embodiment of the invention.

In a twelfth embodiment of the invention, as shown in FIG. 32, a series circuit of a light emitting element LE and a variable resistor VR and a series circuit of a resistor R3 and a switching element SW are connected in parallel to a triac Q, and the connection point of the resistor R3 and the switching element SW is connected to a gate of the triac Q. MOSFETs Q1 and Q2 making up the switching element SW are of enhancement type and the positive polarity of a solar battery SB is connected to gate of MOSFET Q1, Q2 via a resistor R1.

In the configuration, when the surroundings are bright, the switching element SW is turned on because of the output voltage of the solar battery SB. At this time, a current flows into the series circuit of the variable resistor VR and the light emitting element LE, turning on the light emitting element LE. This means that light from the light emitting element LE together with ambient light is incident on the solar battery SB. On the other hand, when the surroundings become dark, the electromotive force of the solar battery SB lowers and the switching element SW is turned off. At this time, the triac Q is turned on and a load L is energized. If the triac Q is turned on, no current flows into the light emitting element LE and thus the light emitting element LE is turned off.

As the operation is performed, hysteresis can be given to the relationship between the surrounding brightness and turning on and off the triac Q as in the tenth embodiment. Other components are similar to those in the tenth embodiment.

Thirteenth Embodiment

Figure 33:
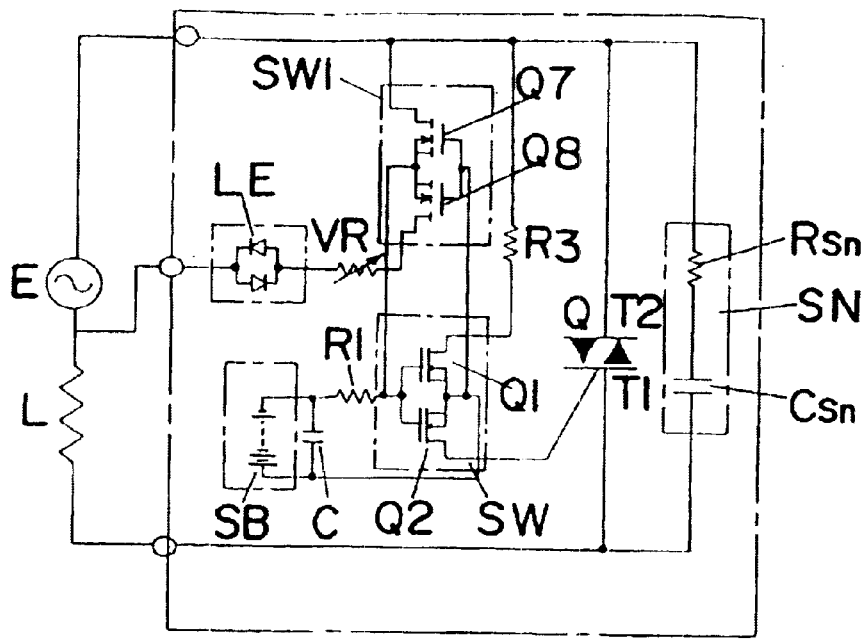
FIG. 33 is a circuit diagram to show a thirteenth embodiment of the invention.

In a thirteenth embodiment of the invention, as shown in FIG. 33, a series circuit of a resistor R3 and a switching element SW is connected in parallel to a triac Q and aside from the switching element SW, a switching element SW1 is added and a series circuit of the switching element SW1, a variable resistor VR, and a light emitting element LE is connected to a power supply E. MOSFETs Q1 and Q2 making up the switching element SW are of depletion type and MOSFETs Q7 and Q8 making up the switching element SW1 are of enhancement type. Gate of MOSFET Q1, Q2 making up the switching element SW is connected to the negative polarity of a solar battery SB via a resistor R1, and source of MOSFET Q1, Q2 is connected to the positive polarity of the solar battery SB. Gate of MOSFET Q7, Q8 making up the switching element SW1 is connected to the positive polarity of the solar battery SB, and source of MOSFET Q7, Q8 is connected to the negative polarity of the solar battery SB via the resistor R1.

In the configuration, when the surroundings are bright, the solar battery SB outputs a comparatively large voltage and the switching element SW is turned off, but the switching element SW1 is turned on, thus power is supplied from the power supply E via the variable resistor VR to the light emitting element LE, turning on the light emitting element LE. When the surroundings become dark and the output voltage of the solar battery SB lowers, the switching element SW is turned on, thus the triac Q is turned on and a load L is energized At this time, the switching element SW1 is turned off and thus the light emitting element LE is turned off. That is, hysteresis can be given to the relationship between the surrounding brightness and turning on and off the triac Q as in other embodiments.

In the thirteenth embodiment, since the current flowing into the light emitting element LE does pass through the load L, there is no current flowing through the load L to energize the light emitting element LE when the triac Q is off, and the configuration can also be used with such a load L operating with a minute current. Other components are similar to those in the tenth embodiment.

In the tenth to thirteenth embodiments, the light emitting element LE is housed in the package 10, but may be placed outside the package 10.

Fourteenth Embodiment

In the description of each embodiment, the triac Q is used as a switch element. In a fourteenth embodiment of the invention, an example wherein an electromagnetic relay is used as a switch element is shown.

Figure 34:
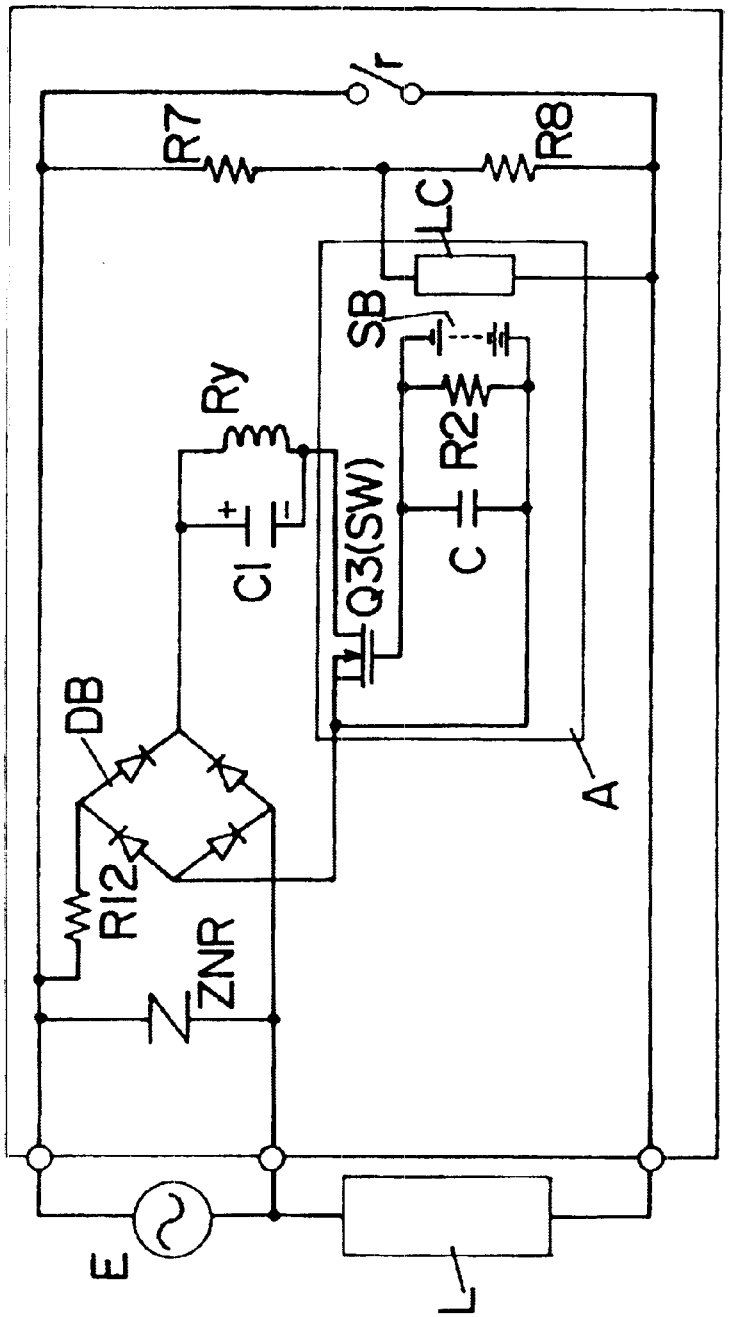
FIG. 34 is a circuit diagram to show a fourteenth embodiment of the invention.

An illumination sensor A used in the embodiment has a configuration wherein a resistor R2 and a capacitor are connected in parallel to a solar battery SB and the positive polarity of the solar battery SB is connected to a control terminal of a switching element SW, as shown in FIG. 34. A high resistor is used as the resistor R2. The switching element SW comprises depletion-type (normally-on-type) MOSFET Q3 and has a gate connected to the positive polarity of the solar battery SB as a control terminal and a source connected to the negative polarity of the solar battery SB. Further, a liquid crystal plate LC is superposed on the light reception face of the solar battery SB as in the seventh embodiment previously described with reference to FIG. 23. The liquid crystal plate LC comprises liquid crystal sandwiched between two transparent electrode glass substrates and a polarizing plate superposed on the surface and the back of a member comprising both transparent electrodes and crystal liquid superposed. This means that the liquid crystal plate LC has transmittance that can be changed in response to applied voltage between both transparent electrodes.

The switching element SW is connected in series to a relay coil Ry of an electromagnetic relay and a series circuit of the switching element SW and the relay coil Ry is connected between DC output terminals of a rectifier DB of a diode bridge for full-wave rectifying a power supply E of a commercial power supply. The electromagnetic relay is of DC-drive type wherein when a DC voltage of a working voltage or more is applied to the relay coil Ry, a contact r is turned on. A resistor R12 is connected in series to one AC input terminal of the rectifier DB and the power supply E is connected across a series circuit of the rectifier DB and the resistor R12. A surge absorber ZNR is connected in parallel to the series circuit of the rectifier DB and the resistor R12.

On the other hand, the contact r of the electromagnetic relay is inserted between the power supply E and a load L such as an illumination load. That is, the contact r is connected to a series circuit of the power supply E and the load L and power supply to the load L is turned on and off as the contact r is turned on and off. A smoothing capacitor C1 is connected in parallel to the relay coil Ry for smoothing output voltage of the rectifier DB for applying a roughly constant DC voltage to the relay coil Ry.

Further, a series circuit of resistors R7 and R8 is connected across the contact r and the liquid crystal plate LC is connected in parallel to one resistor R8. This means that the applied voltage to the liquid crystal plate LC becomes a voltage provided by dividing the voltage across the contact r through the resistors R7 and R8. The lower the applied voltage, the lower the transmittance of the liquid crystal plate LC. Therefore, the transmittance when the contact r is on becomes lower than that when the contact r is off.

Since the liquid crystal plate LC is superposed on the light reception face of the solar battery SB as described above, the quantity of light incident on the solar battery SB also changes with change in the transmittance of the liquid crystal plate LC. Moreover, when the switching element SW conducts and the contact r is turned on as the quantity of light incident on the solar battery SB is decreased, the transmittance of the liquid crystal plate LC is lowered; when the switching element SW is brought out of conduction and the contact r is turned off as the quantity of light incident on the solar battery SB is increased, the transmittance of the liquid crystal plate LC is raised. Thus, hysteresis is given to turning on/off the contact r in response to ambient light by the liquid crystal plate LC. In other words, if the contact r is turned on, it is maintained on and is made hard to be turned off; if the contact r is turned off, it is maintained off and is made hard to be turned on. Consequently, when the contact r is turned on in the night, etc., and the illumination load of the load L is lighted, if light is applied from headlights of an automobile, etc., the contact r is maintained on because the transmittance of the liquid crystal plate is lowered. Since the smoothing capacitor C1 is connected in parallel to the relay coil Ry, when the contact r is on as in the night, if light is applied from headlights of an automobile, etc., and the switching element SW is turned off, a current continues to flow into the relay coil Ry by the capacitor C1 and the contact r is maintained on, so that a malfunction of immediately turning off the contact r can be avoided.

Figure 35:
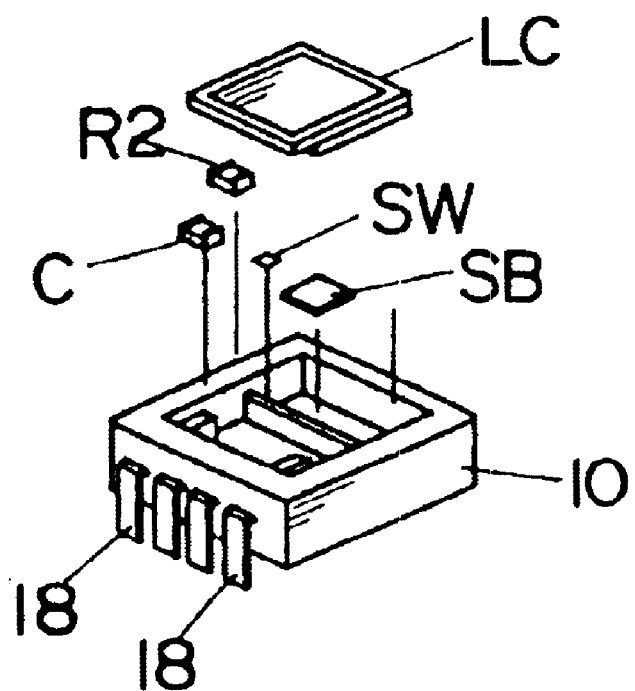
FIG. 35 is an exploded perspective view of an illumination sensor used in the fourteenth embodiment of the invention.

By the way, in the embodiment, as shown in FIG. 35, the solar battery SB, the resistor R, the capacitor C, the switching element SW, and the liquid crystal plate LC are housed in one package 10, thereby forming an illumination sensor A and the illumination sensor A is housed in a case 20 (see FIG. 36) together with other parts, thereby forming an electronic automatic on/off switch. The package 10 is made of a synthetic resin and is molded with a metal frame in one piece like a box with one face opened. The parts making up the illumination sensor A are installed in the frame in the package 10 and a part of the frame is drawn out from the package 10 to the outside, forming four flat connection terminals 18. Two of the four connection terminals 18 are connected to both ends of the switching element SW and the remaining two are connected to both ends of the liquid crystal plate LC.

Figure 36:
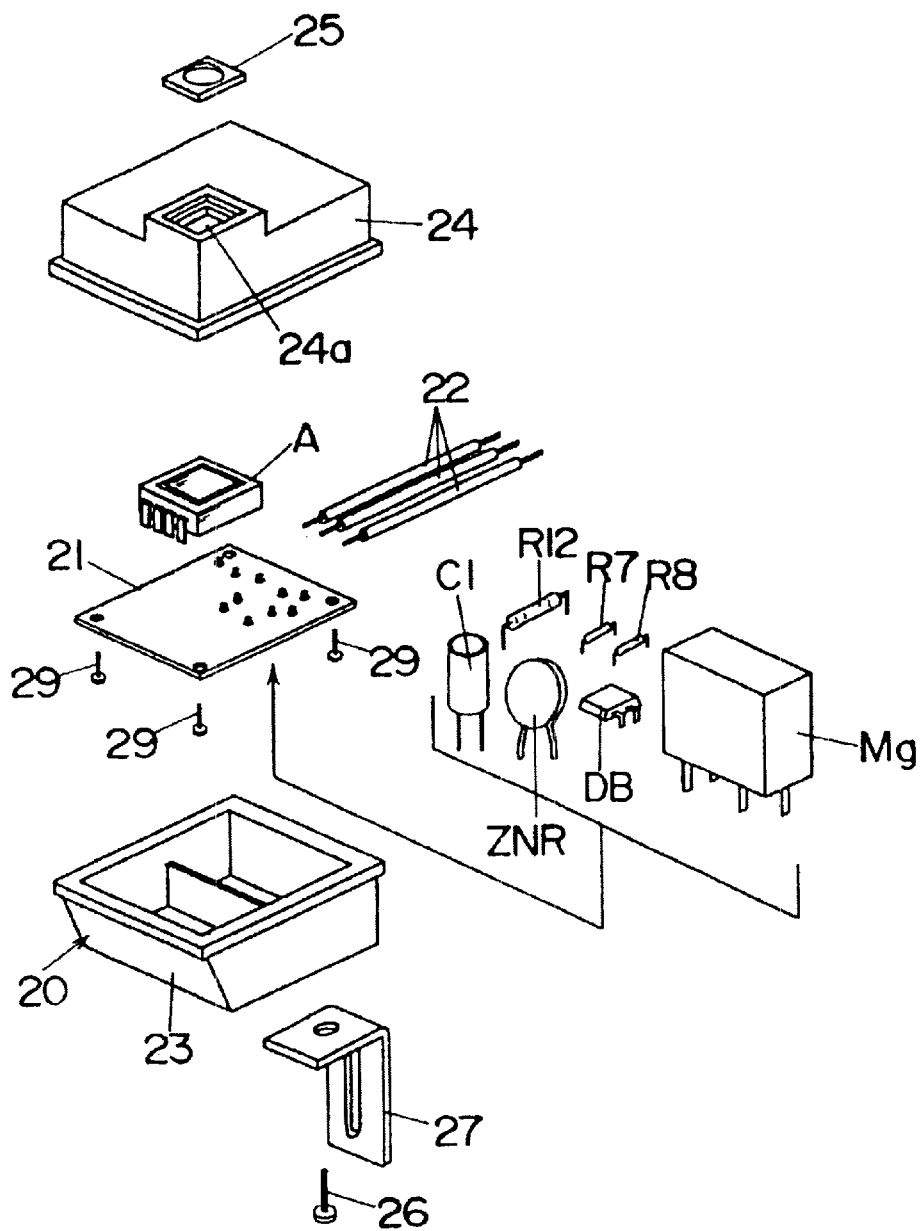
FIG. 36 is an exploded perspective view of the illumination sensor in FIG. 35.

As shown in FIG. 36, the illumination sensor A is mounted on a print-circuit board 21 and the surge absorber ZNR, the resistors R1, R7, and R8, the capacitor C, the rectifier DB, and the electromagnetic relay Mg containing the relay coil Ry and the contact r are also mounted on the print-circuit board 21. The illumination sensor A and other parts are mounted on opposite sides of the print-circuit board 21 and three electric lines 22 for connecting to the power supply E and the load L are connected to the print-circuit board 21.

The case 20 for housing the print-circuit board 21 is formed by joining a base 23 and a cover 24 each shaped like a box made of a synthetic resin. The print-circuit board 21 is fixed to the cover 24 with mounting screws 29. A window hole 24*a* is made in the part of the cover 24 corresponding to the front of the illumination sensor A and a light reception cover 25 is attached to the window hole 24*a*. Ambient light is incident on the illumination sensor A through the window hole 24*a*. A mounting bracket 27 is attached to the outside of the case 20 with a fixing screw 26. The mounting bracket 27 can be used to attach the case 20 to a house, a building, etc.

As described above, in the embodiment, the electromagnetic relay Mg is used to control energizing of the load L, so that a heat slinger is not required as compared with the case where the triac Q is used as the switch element, and consequently the case 20 is comparatively small-sized.

Fifteenth Embodiment

Figure 37:
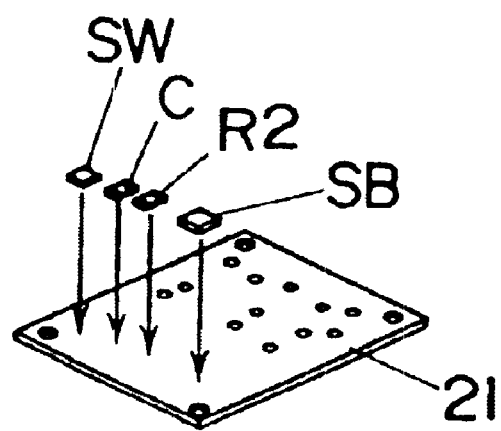
FIG. 37 is an exploded perspective view of an illumination sensor used in a fifteenth embodiment of the invention.
Figure 38:
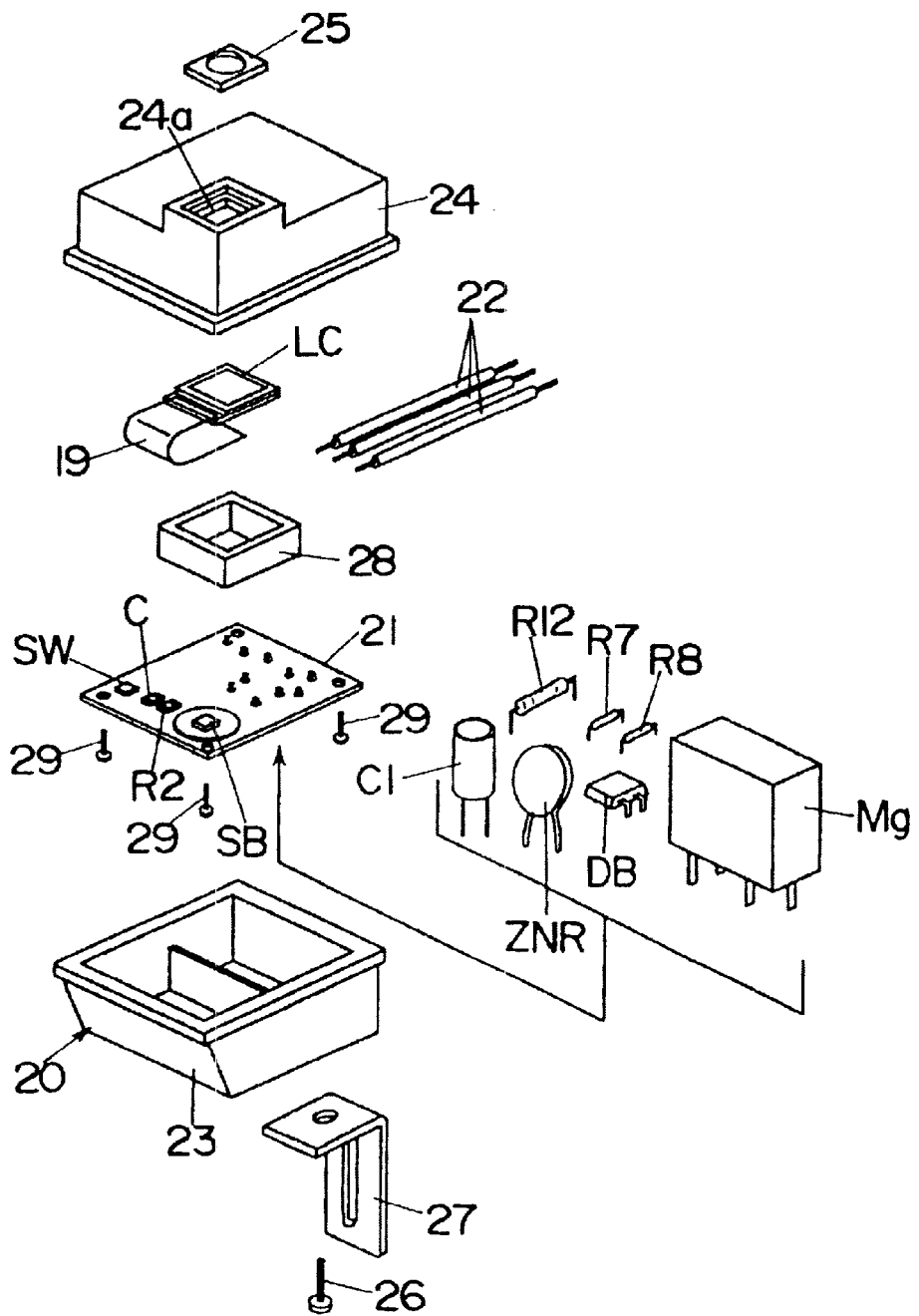
FIG. 38 is an exploded perspective view of the illumination sensor in FIG. 37.

In a fifteenth embodiment of the invention, as shown in FIG. 37, the parts making up an illumination sensor A except a liquid crystal plate LC are surface-mounted to a print-circuit board 21. As shown in FIG. 38, using a flexible board 19, the liquid crystal plate LC is connected to the print-circuit board 21. The liquid crystal plate LC is connected to a holding frame 28 made of a synthetic resin and the holding frame 28 is fixed to the print-circuit board 21. That is, the liquid crystal plate LC is supported by the holding frame 28 to the print-circuit board 21. Other components are similar to those in the fourteenth embodiment. The holding frame 28 may be fixed to a case 20 rather than the print-circuit board 21.

Sixteenth Embodiment

In the fourteenth embodiment, the electromagnetic relay Mg used is of DC-drive type and one MOSFET Q3 is used as the switching element SW; in a sixteenth embodiment of the invention, a switching element SW consisting of two MOSFETs Q1 and Q2 is used as in the first embodiment and an electromagnetic relay Mg used is of AC-drive type.

Figure 39:
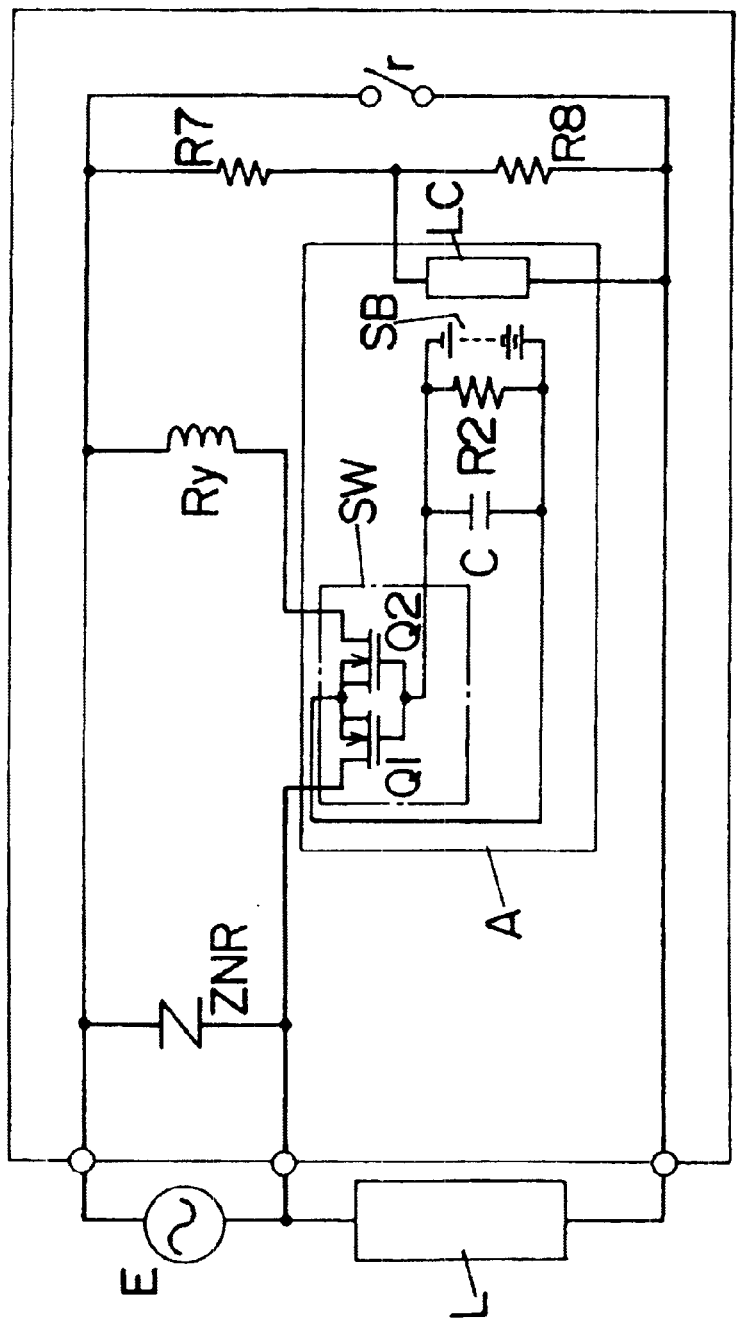
FIG. 39 is a circuit diagram to show a sixteenth embodiment of the invention.

That is, as shown in FIG. 39, the switching element SW comprises two depletion-type (normally-on-type) MOSFETs Q1 and Q2 connected in inverse series and sources are connected and gates are connected in common. The gate is connected to the negative pole of a solar battery SB as a control terminal and the source is connected to the positive pole of the solar battery SB.

The switching element SW is connected to a power supply E via a relay coil Ry of the electromagnetic relay Mg. The electromagnetic relay Mg is of AC-drive type wherein when an AC voltage of a working voltage or more is applied, a contact r is turned on. A surge absorber ZNR is connected in parallel to a series circuit of the relay coil Ry and the switching element SW. Other components are similar to those in the fourteenth embodiment.

In the configuration of the embodiment, an alternating current passes through the MOSFETs Q1 and Q2 connected in inverse series and therefore the characteristics of the MOSFETs Q1 and Q2 need to be matched so that the magnitude of the current flowing through both the MOSFETs Q1 and Q2 does not change with the direction, but a rectifier DB, a smoothing capacitor C1, and the like are not required and the number of parts is lessened. This means that it is made possible to make the unit smaller-sized than that in the fourteenth embodiment. Other points are similar to those in the fourteenth embodiment.

An illumination sensor A used in the sixteenth embodiment can be formed as shown in FIGS. 40A and 40B or 41A and 41B. In FIGS. 40A and 40B, the parts making up the illumination sensor A are installed in a metal frame 41 and are housed in a synthetic resin package 10 molded with the frame 41 in one piece, and the illumination sensor A has a similar configuration to that in the fourteenth embodiment. In FIGS. 41A and 41B, the parts making up the illumination sensor A are mounted on a print-circuit board 21 together with other parts, and a liquid crystal plate LC is connected to the print-circuit board 21 via a flexible board 19. The liquid crystal plate LC is supported by a holding frame 28 to the print-circuit board 21. Wire-bonding (not shown) is adopted whenever necessary for electric connection of the parts. The MOSFETs Q1 and Q2 are sealed by a seal member 43*a* made of an opaque resin and the solar battery SB is sealed by a seal member 43*b* made of a transparent resin.

Seventeenth Embodiment

Figure 42:
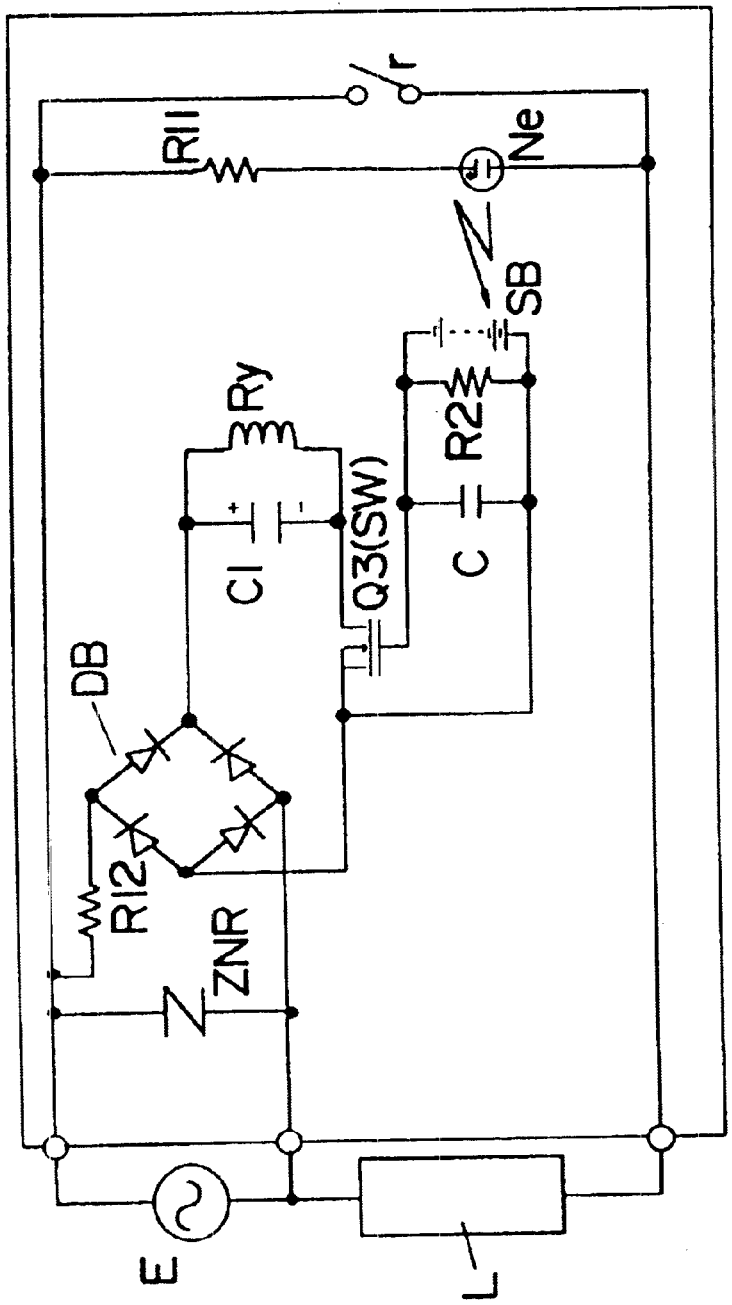
FIG. 42 is a circuit diagram to show a seventeenth embodiment of the invention.

In a seventeenth embodiment of the invention, hysteresis is given using a light emitting element rather than a liquid crystal plate LC. That is, the basic configuration in the embodiment is similar to that in the fifteenth embodiment; as shown in FIG. 42, in place of the resistors R7 and R8 and the liquid crystal plate LC in the fifteenth embodiment, a series circuit of a resistor R11 and a neon lamp Ne as a light emitting element is connected in parallel to a contract r. Other components are similar to those in the fourteenth embodiment.

Figure 43:
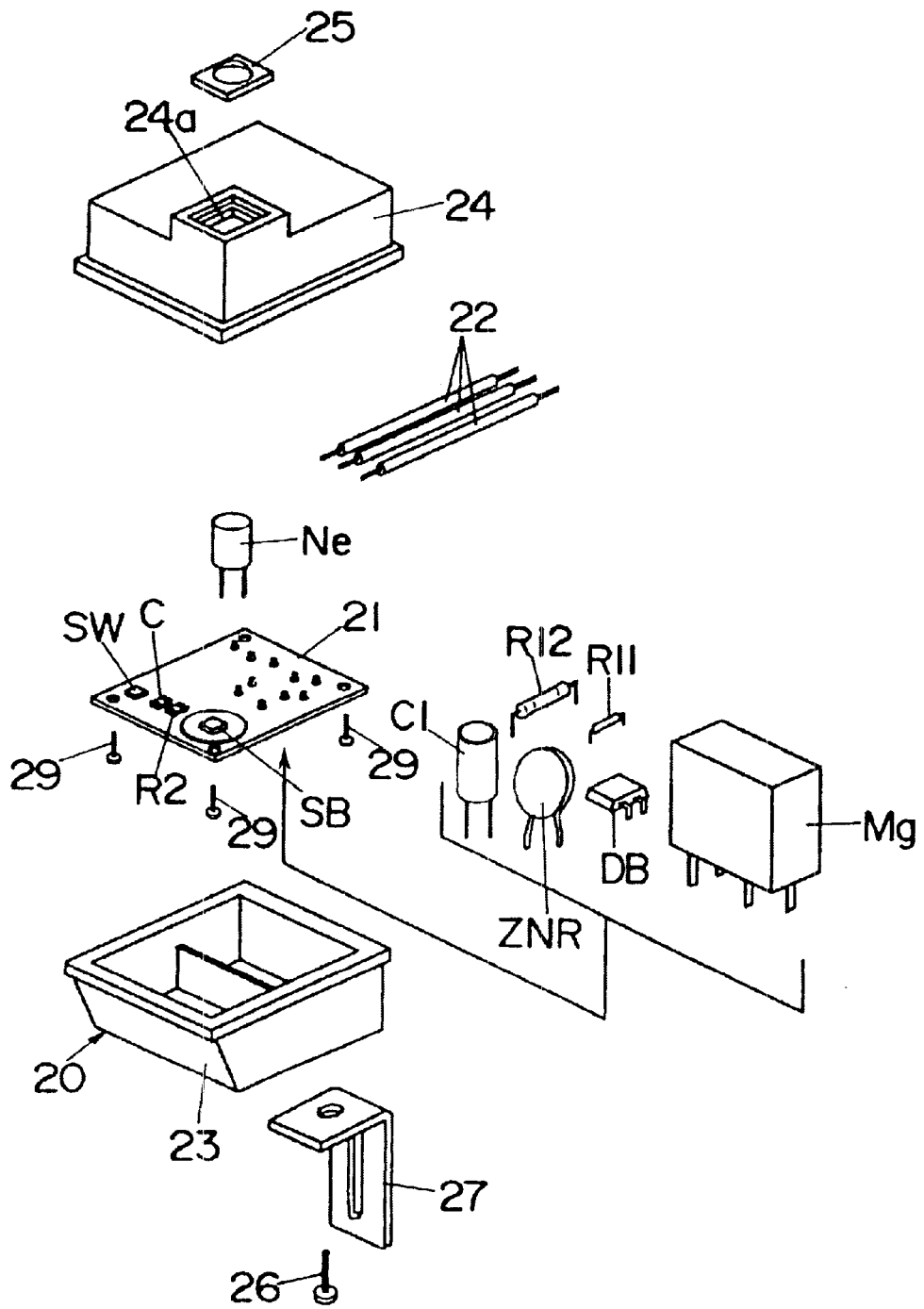
FIG. 43 is an exploded perspective view of an illumination sensor used in the seventeenth embodiment of the invention.

As shown in FIG. 43, the neon lamp Ne is mounted on a print-circuit board 21 and is placed so that light from the neon lamp Ne is incident on a solar battery SB. The parts making up an illumination sensor A are mounted on the print-circuit board 21 as in the fifteenth embodiment. As seen from the above-described connection relationship, the neon lamp Ne is turned on when the contact r is off; when the quantity of light incident on the solar battery SB produced by ambient light is large as in the daytime, the neon lamp Ne is turned on for further increasing the quantity of light incident on the solar battery SB. Therefore, an increase or a decrease in the light quantity produced by the neon lamp Ne can be added to an increase or a decrease in the quantity of ambient light and hysteresis can be given as a liquid crystal plate LC is used. Other components are similar to those in the fifteenth embodiment. The neon lamp Ne of a light emitting element may be fixed to a case 20 rather than the print-circuit board 21.

Eighteenth Embodiment

Figure 44:
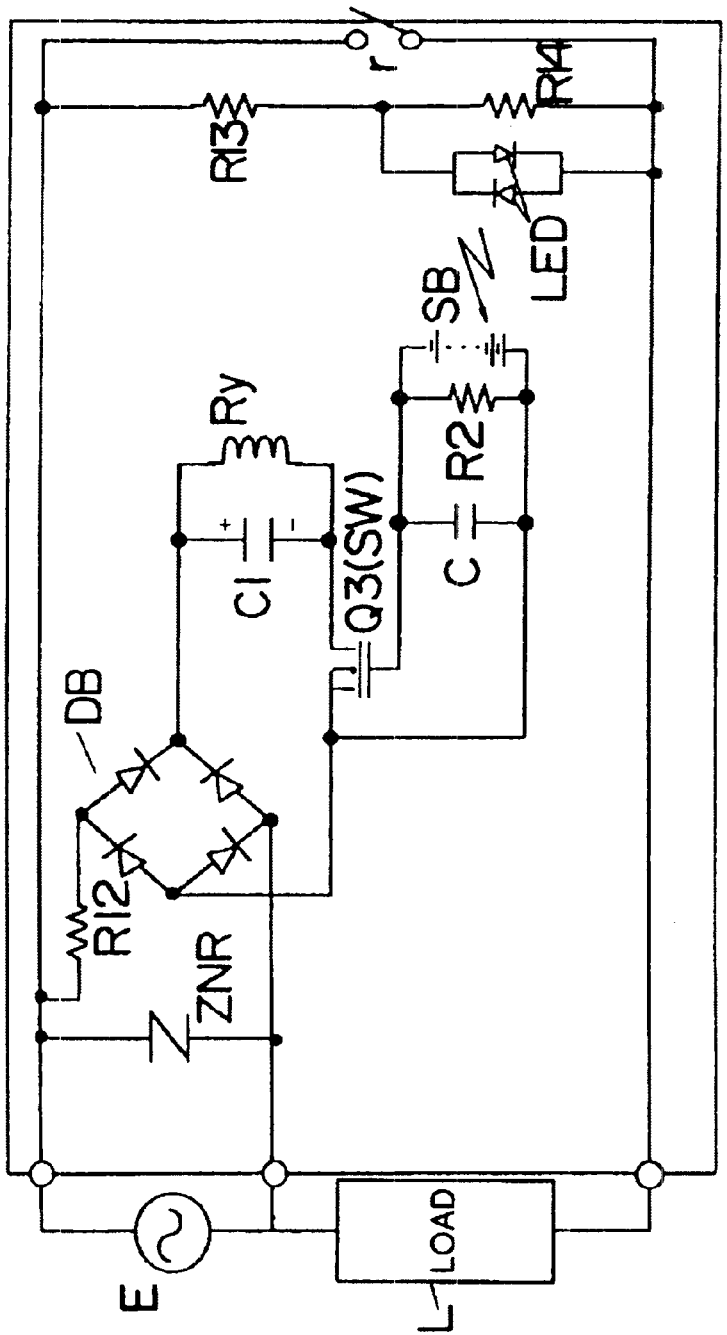
FIG. 44 is a circuit diagram to show an eighteenth embodiment of the invention.

In an eighteenth embodiment of the invention, as shown in FIG. 44, two light emitting diodes LEDs are used as a light emitting element. Both the light emitting diodes LEDs are connected in inverse parallel and are connected in parallel to a resistor R14. The resistor R14 is connected in series to a resistor R13 and a series circuit of the resistors R14 and R13 is connected in parallel to a contact r. Therefore, as in the seventeenth embodiment, when the contact r is off, the light emitting diode LED can be turned on, and when the surroundings are bright, the quantity of light incident on a solar battery SB can be more increased. Since the light emitting diodes LEDs are connected in inverse parallel, either light emitting diode LED is always turned on in response to an alternating current. Other components are similar to those in the seventeenth embodiment.

Nineteenth Embodiment

In each embodiment described below, an illumination sensor forming a part of an electronic automatic on/off switch used together with a switch element (triac Q or electromagnetic relay Mg) will be discussed.

Figure 45:
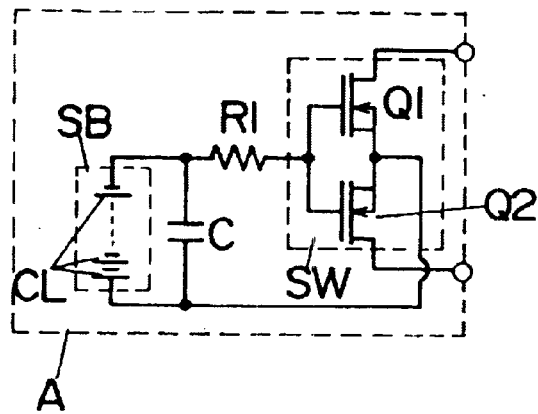
FIG. 45 is a circuit diagram to show a nineteenth embodiment of the invention.

An illumination sensor A shown in a nineteenth embodiment of the invention has the configuration used in the first embodiment, etc. As shown in FIG. 45, it comprises a solar battery SB as a photovoltaic element for detecting the surrounding brightness, and the solar battery SB comprises a plurality of cells CL connected in series. A switching element SW comprises two depletion-type (normally-on-type) MOSFETs Q1 and Q2 connected in inverse series and sources are connected and gates are connected in common. A capacitor C is connected in parallel to the solar battery SB and the negative pole of the solar battery SB is connected to the gates of both MOSFETs Q1 and Q2 via a resistor R1. The positive pole of the solar battery SB is connected to the sources of both MOSFETs Q1 and Q2.

When the surroundings are bright, the gate potential of the MOSFET Q1, Q2 becomes lower than the source potential because of output of the solar battery SB, thus the switching element SW is turned off. On the other hand, when the surroundings become dark and it is made impossible for the output of the solar battery SB to maintain the switching element SW off, the switching element SW is turned on. The capacitor C is placed on the input side of the switching element SW. Thus, when the brightness is temporarily changed as the brightness is changed because of headlights when an automobile passes through the neighborhood, the switching element SW is not turned off and a malfunction of the switching element SW is prevented.

Twentieth Embodiment

Figure 46:
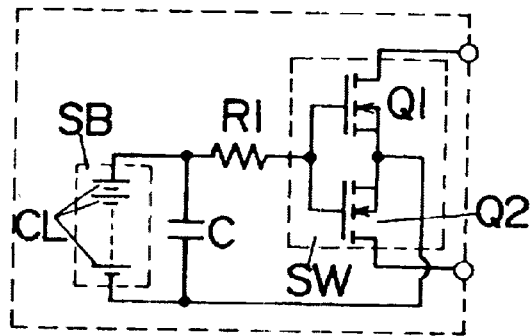
FIG. 46 is a circuit diagram to show a twentieth embodiment of the invention.

An illumination sensor A shown in a twentieth embodiment of the invention has the configuration used in the second embodiment, etc. As shown in FIG. 46, a switching element SW comprises two enhancement-type (normally-off-type) MOSFETs Q1 and Q2 connected in inverse series and sources are connected and gates are connected in common. A capacitor C is connected in parallel to a solar battery SB and the negative pole of the solar battery SB is connected to the gates of both MOSFETs Q1 and Q2 via a resistor R1. The positive pole of the solar battery SB is connected to the sources of both MOSFETs Q1 and Q2.

When the surroundings are bright, the output voltage of the solar battery SB is increased and the switching element SW is turned on. On the other hand, when the surroundings are dark, the output voltage of the solar battery SB is lessened and the switching element SW is turned off. This means that the relationship of turning on and off the switching element SW with the brightness of ambient light becomes opposite to that in the nineteenth embodiment. Other components are similar to those in the nineteenth embodiment.

Twenty-first Embodiment

Figure 47:
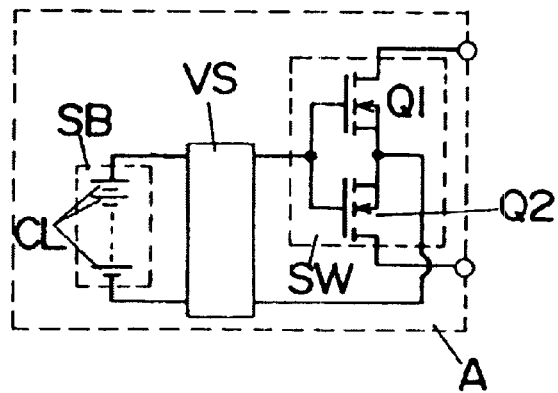
FIG. 47 is a circuit diagram to show a twenty-first embodiment of the invention.

An illumination sensor A shown in a twenty-first embodiment of the invention has the configuration used in the third embodiment, etc. However, as shown in FIG. 47, a switching element SW comprises two enhancement-type MOSFETs Q1 and Q2 connected in inverse series as in the sixth embodiment. That is, a voltage supervisory circuit VS for giving hysteresis so as to make a brightness threshold value applied when the surroundings become bright and the switching element SW is switched on from the off state higher than that applied when the surroundings become dark and the switching element SW is switched off from the on state is placed between a solar battery SB and the switching element SW.

Therefore, when the surroundings become dark and the switching element SW is switched on from the off state, the brightness threshold value when the switching element SW is switched off from the on state becomes high and once the switching element SW is turned on, it becomes hard to be turned off. Conversely, when the surroundings become bright and the switching element SW is switched off from the on state, the brightness threshold value when the switching element SW is switched on from the off state becomes low and once the switching element SW is turned off, it becomes hard to be turned on. Such hysteresis is given, whereby a malfunction of the switching element because of variation in the surrounding brightness can be prevented.

The configuration of the embodiment makes it possible to turn on and off the switching element SW without delay in response to change in the brightness of ambient light as compared with the configuration of the nineteenth or twentieth embodiment wherein the capacitor C is connected in parallel to the solar battery SB for preventing a malfunction of the switching element caused by transient change in the brightness. For example, if another illumination blinks while the load L of an illumination load is lighted, the load L is lighted until the capacitor C is charged, but when the capacitor C is charged, a malfunction of turning off the load L is caused to occur. In contrast, in the configuration of the twenty-first embodiment, it is made possible to circumvent such a malfunction because the on/off state of the load L is changed only if change in the brightness of ambient light becomes comparatively large.

Twenty-second Embodiment

An illumination sensor A shown in a twenty-second embodiment of the invention has a similar configuration to that used in the seventh embodiment, etc. That is, the illumination sensor A of the embodiment comprises a liquid crystal plate LC disposed so as to cover the light reception face of a solar battery SB.

Figure 48:
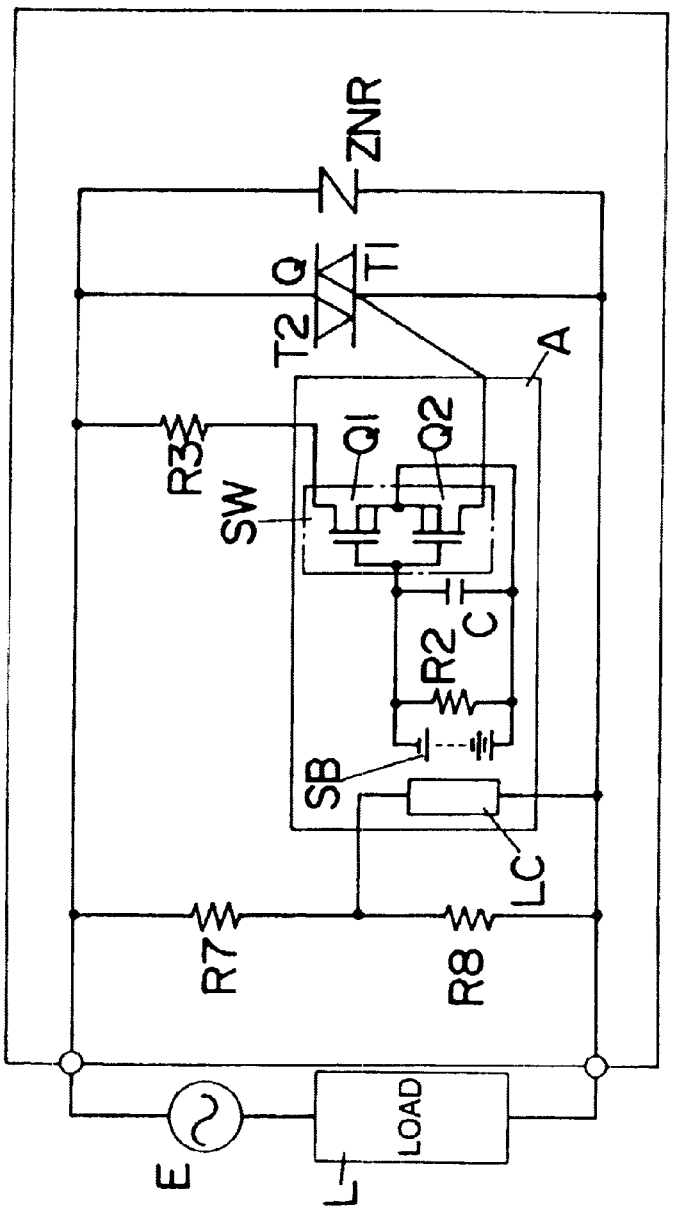
FIG. 48 is a circuit diagram to show a twenty-second embodiment of the invention.

An electronic automatic on/off switch using the illumination sensor A of the embodiment assumes a circuit shown in FIG. 48. The illumination sensor A uses a solar battery SB as a photovoltaic element for generating an output voltage responsive to the brightness of ambient light. The solar battery SB comprises a plurality of cells connected in series and the cells CL are arranged like a matrix on one plane of one substrate.

A resistor R2 and a capacitor C are connected in parallel to the solar battery SB and further the negative electrode of the solar battery SB is connected to a control terminal of a switching element SW. A high resistor is used as the resistor R. The switching element SW comprises two depletion-type (normally-on-type) MOSFETs Q1 and Q2 connected in inverse series and sources are connected and gates are connected in common. The gate is connected to the positive pole of the solar battery SB as a control terminal and the source is connected to the negative pole of the solar battery SB.

Figure 49:
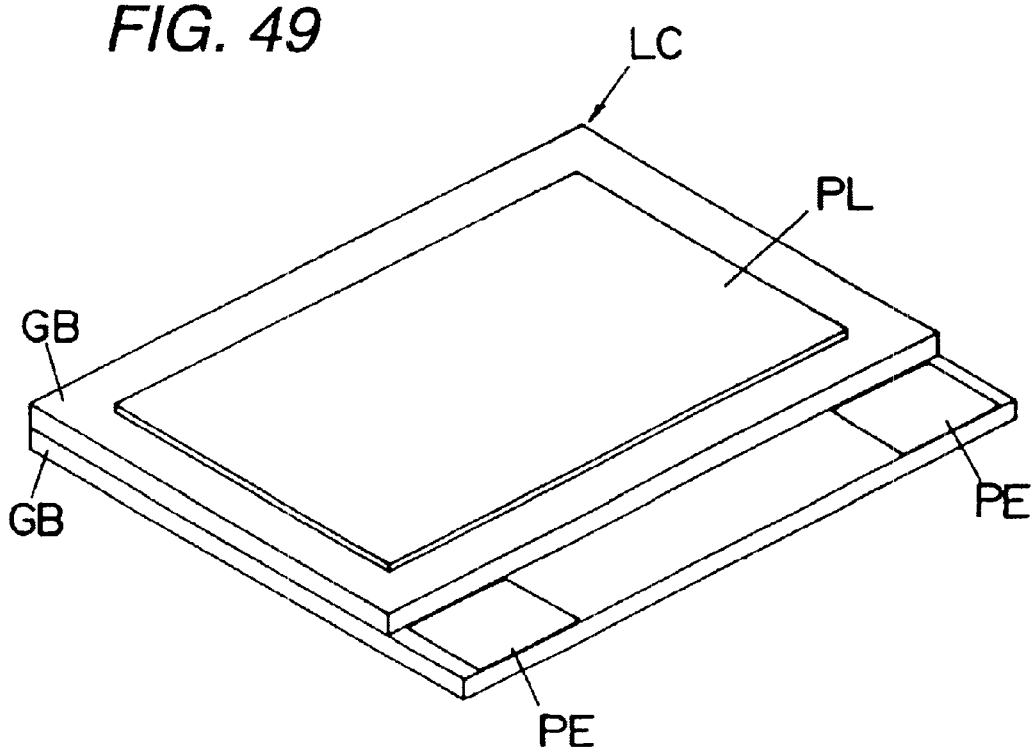
FIG. 49, is a perspective view to show a liquid crystal plate used in the twenty-second embodiment of the invention.

The liquid crystal plate LC is superposed on the light reception face of the solar battery SB. The liquid crystal plate LC comprises liquid crystal sandwiched between two transparent electrode glass substrates GB and a polarizing plate PL is deposited on the surface and back of the liquid crystal plate LC, as shown in FIG. 49. According to the configuration, the liquid crystal plate LC has transmittance that can be changed in response to applied voltage between transparent electrodes placed on both the glass substrates GB. A part of one glass substrate GB is extended as compared with the other glass substrate GG and electrodes PE made of transparent electrode (ITO film) are formed in the extension.

Figure 50:
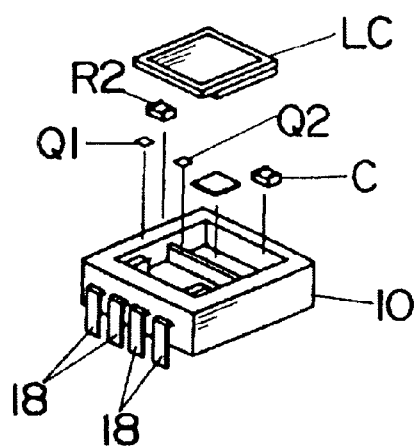
FIG. 50 is an exploded perspective view of the liquid crystal plate in FIG. 49.

The illumination sensor A comprises a package 10 for housing the solar battery SB, the liquid crystal plate LC (polarizing plates PL), the resistor R2, the capacitor C, and the switching element SW. This means that the parts are housed in the box-like package 10 made of a synthetic resin with one face opened, as shown in FIG. 50. The package 10 is molded with a metal frame 41 in one piece for installing the parts making up the illumination sensor A (solar battery SB, resistor R2, capacitor C, MOSFETs Q1 and Q2, and liquid crystal plate LC). On a part of the frame 41, four connection terminals 18 on one side of the package 10 are placed in a row. Two of the four connection terminals 18 are connected to both ends of the switching element SW and the remaining two are connected to both ends of the liquid crystal plate LC. Wire-bonding (not shown) is adopted whenever necessary for connection of the frame 41 and the parts. In the package 10, the MOSFETs Q1 and Q2 are sealed by a seal member 43a made of an opaque resin and the solar battery SB is sealed by a seal member 43b made of a transparent resin.

The electronic automatic on/off switch using the illumination sensor A of the embodiment has a basic configuration similar to the configuration in the seventh embodiment; a surge absorber ZNR is connected in parallel to a triac Q instead of connecting a snubber circuit SN in parallel. However, no substantial difference exists in operation.

Since the liquid crystal plate LC is superposed on the light reception face of the solar battery SB in the configuration of the twenty-second embodiment, the quantity of light incident on the solar battery SB also changes with change in the transmittance of the liquid crystal plate LC. Moreover, when the switching element SW conducts and the triac Q is turned on as the quantity of light incident on the solar battery SB is decreased, the transmittance of the liquid crystal plate LC is lowered; when the switching element SW is brought out of conduction and the triac Q is turned off as the quantity of light incident on the solar battery SB is increased, the transmittance of the liquid crystal plate LC is raised. Thus, hysteresis characteristic is given to turning on/off the triac Q in response to ambient light by the liquid crystal plate LC. In other words, if the triac Q is turned on, it is maintained on and is made hard to be turned off; if the triac Q is turned off, it is maintained off and is made hard to be turned on. Here, the ratio of the light quantity when the triac Q makes an off-to-on state transition to the light quantity when the triac Q makes an on-to-off state transition is called hysteresis magnification (=light quantity (off to on)/light quantity (on to off)). Now, assuming that the light quantity when the triac Q makes an off-to-on state transition is constant, the higher the hysteresis magnification, the less the light quantity when the triac Q makes an on-to-off state transition; thus the function of maintaining the triac Q on is high.

Consequently, when the triac Q is turned on in the night, etc., and the illumination load of a load L is lighted, if light is applied from the illumination load, headlights of an automobile, etc., the triac Q is maintained on because the transmittance of the liquid crystal plate is lowered. Further, since the capacitor C is connected in parallel to the solar battery SB, when the triac Q is on as in the night, if light is applied from headlights of an automobile, etc., and the voltage across the solar battery SB rises, the switching element SW can be maintained out of conduction while the capacitor C is charged, and a malfunction of immediately turning off the triac Q can be avoided.

Here, combinations of the spectral characteristic of the transmittance of the liquid crystal plate LC and the spectral sensitivity characteristic of the solar battery SB will be discussed specifically. The spectral characteristic of the transmittance of the liquid crystal plate LC and the spectral sensitivity characteristic of the solar battery SB are set as in FIGS. 51A and 51B respectively. (1) in FIG. 51A indicates the transmittance of the liquid crystal plate LC when the triac Q is off and (2) indicates the transmittance of the liquid crystal plate LC when the triac Q is on.

Figure 51A:
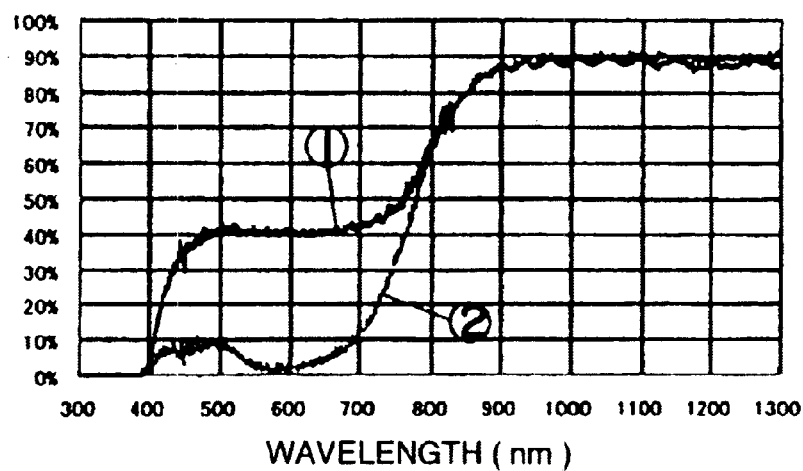
FIGS. 51A and 51B are schematic representations of the operation in the twenty-second embodiment of the invention.

That is, the spectral characteristic as in FIG. 51A is given to the transmittance of the liquid crystal plate LC; a visible light area has transmittance lower than an infrared light area and moreover when applied voltage is changed for changing the transmittance, change in the transmittance in the visible light area becomes larger than change in the transmittance in near-infrared light area. That is, the transmittance characteristic is set so that the transmittance of the liquid crystal plate LC is almost constant in the infrared light area with the wavelength 900 nm or more regardless of whether the triac Q is on or off and that the transmittance largely changes in the visible light area. The fact that sunlight of natural light much contains near-infrared light area and infrared light area in addition to visible light area although the light quantity in the visible light area is fairly larger than that in the near-infrared light area in a fluorescent lamp, an HID lamp, etc., generally used for illumination is used to lessen change in the transmittance of the liquid crystal plate LC for the natural light and to enlarge change in the transmittance of the liquid crystal plate LC for the illumination light.

Figure 51B:
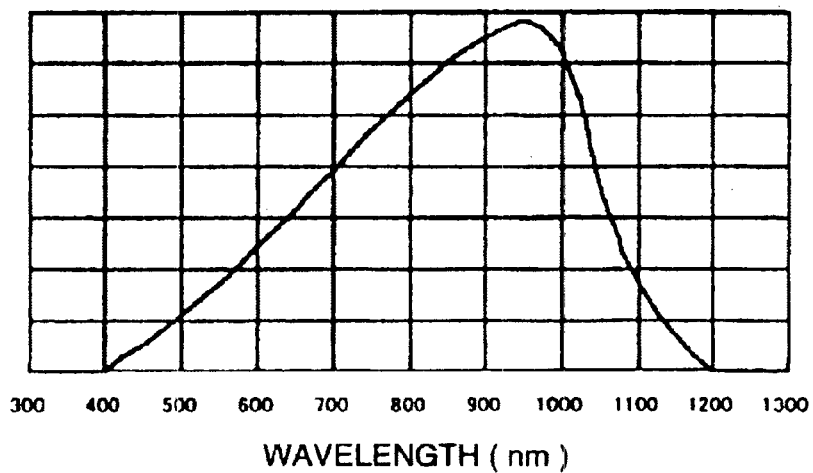

On the other hand, as shown in FIG. 51B, a solar battery SB having a sensitivity wavelength range of 400 to 1200 nm (visible light area to infrared light area) and a peak wavelength of about 950 nm (near-infrared light area) is used. Such a solar battery SB is provided by a monocrystalline silicon solar battery. This means that the solar battery SB has the sensitivity wavelength range from visible light area to infrared light area and the peak wavelength becomes near-infrared light area.

Consequently, the combined sensitivity of the liquid crystal plate LC and the solar battery SB becomes comparatively high in the near-infrared light area regardless of whether the triac Q is on or off and in the visible light area, the combined sensitivity becomes low on the triac Q is on, and becomes high when the triac Q is off.

Figure 52A:
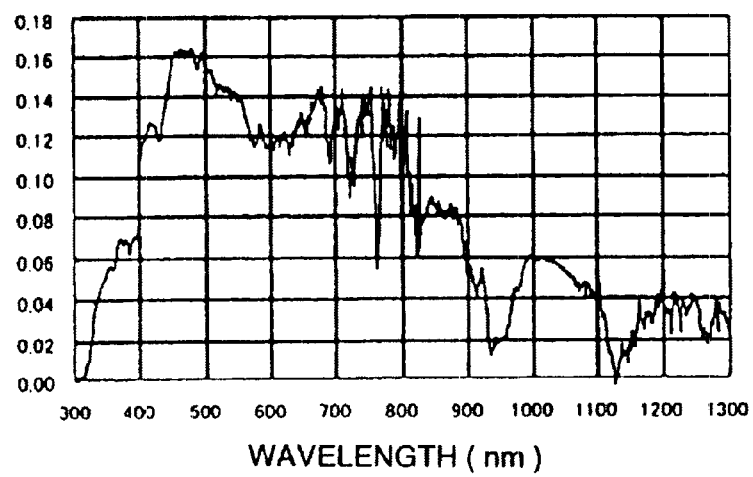
FIGS. 52A and 52B are schematic representations of the operation in the twenty-second embodiment of the invention.
Figure 52B:
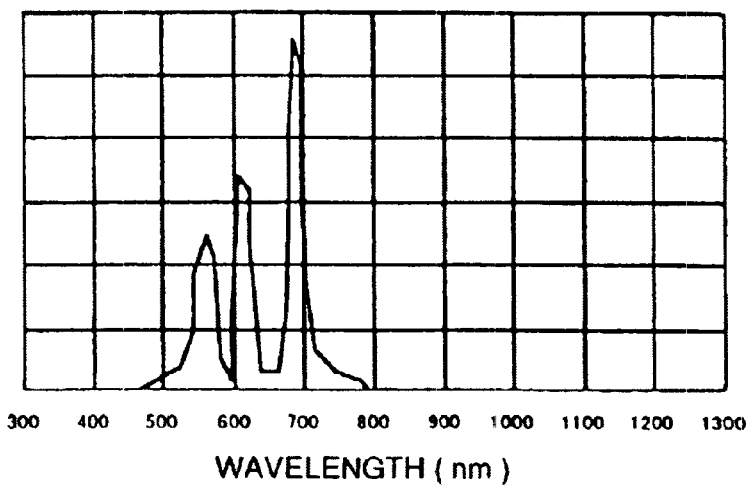
Figure 53A:
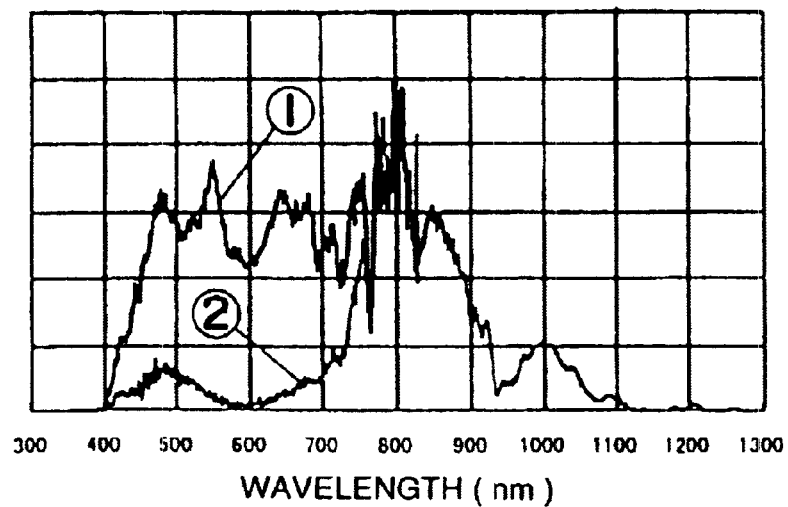
FIGS. 53A and 53B are schematic representations of the operation in the twenty-second embodiment of the invention.
Figure 53B:
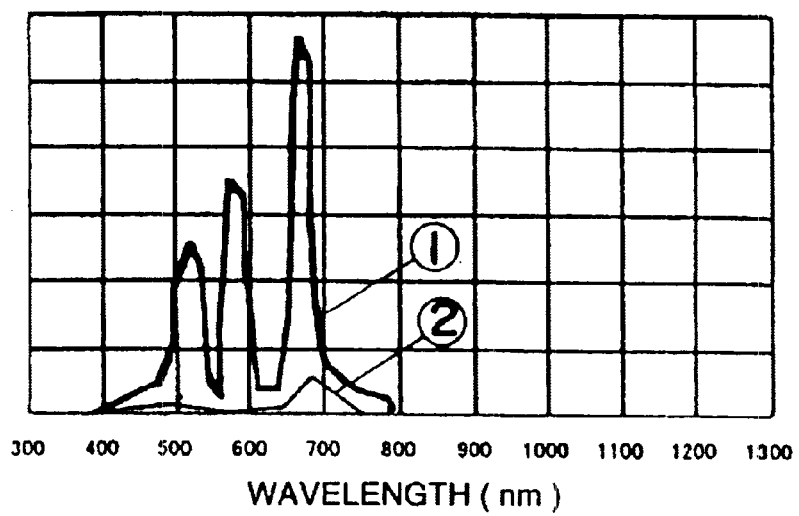

The sunlight has a spectral characteristic as in FIG. 52A and the fluorescent lamp has a spectral characteristic as in FIG. 52B, thus outputs of the solar battery SB become as shown in FIGS. 53A and 53B. (1) in FIG. 53A, 53B indicates the output when the triac Q is off and (2) indicates the output when the triac Q is on. For the sunlight, in the visible light area, the output voltage of the solar battery SB changes as the triac Q is turned on and off, but little changes in the near-infrared light area; for the light of the fluorescent lamp, the output voltage of the solar battery SB changes largely as the triac Q is turned on and off because the most part is the visible light area.

As seen from the characteristics in FIGS. 53A and 53B, if illumination light is incident in the night, etc., the output voltage of the solar battery SB does not rise and consequently, the triac Q is maintained on. In contrast, as the sunlight is incident at the crack of dawn, a comparatively large output voltage is generated from the solar battery SB because of light in the near-infrared light area and the triac Q is immediately turned off. If the sunlight is decreased in the evening, both light in the visible light area and light in the near-infrared light area are decreased, thus the triac Q is immediately turned on.

Figure 54:
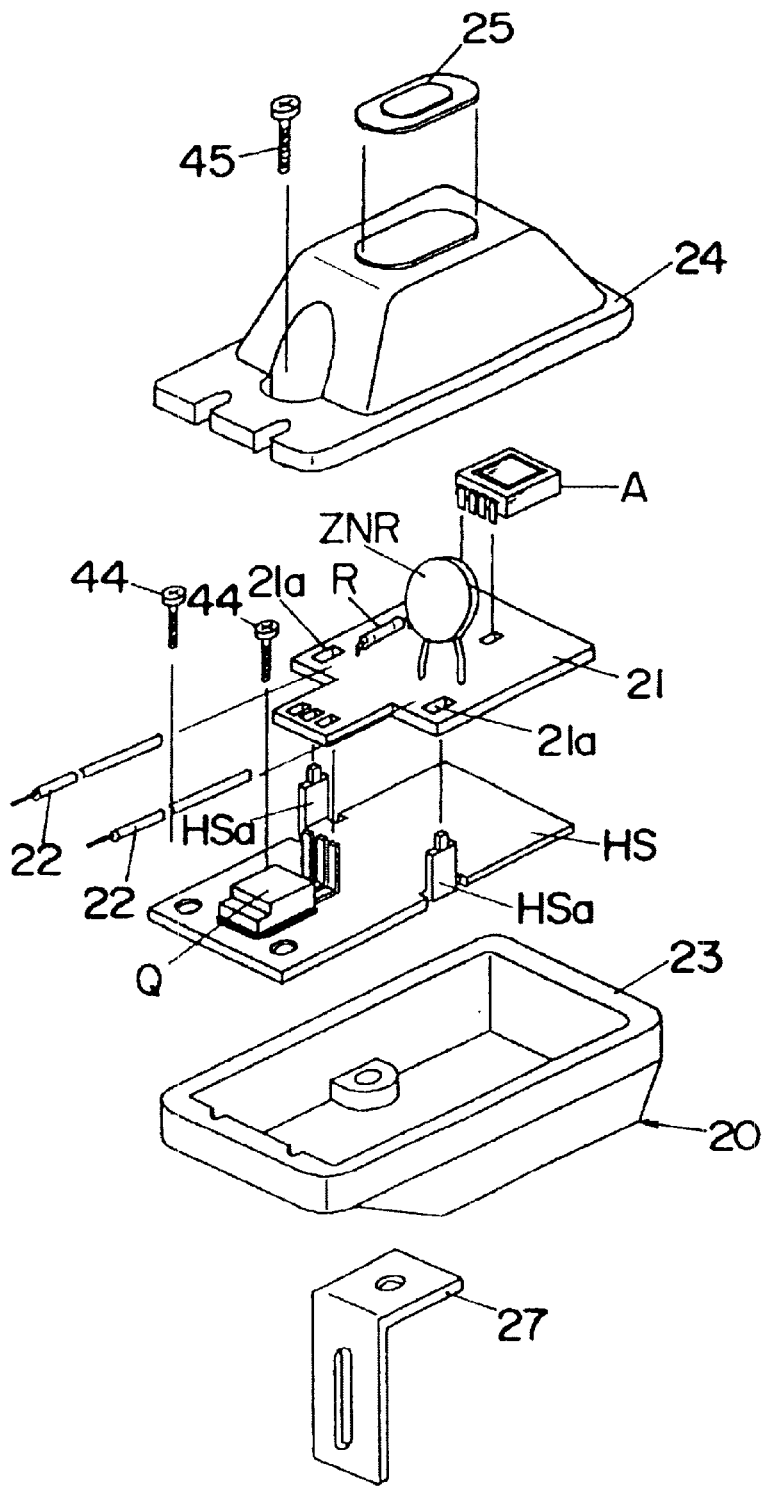
FIG. 54 is an exploded perspective view of an automatic on/off switch using the illumination sensor shown in FIG. 48.

As shown in FIG. 54, the illumination sensor A is mounted on a print-circuit board 21 together with the surge absorber ZNR, resistors R1, R2, and R3 (in the figure, only one is shown as resistor R) and is housed in a case 20 together with the triac Q to which a heat slinger HS is attached. A pair of coupling legs HSa is projected on the heat slinger HS and the tips of the coupling legs HSs are inserted into coupling holes 21a made in the print-circuit board 21 and are joined by caulking or soldering. A lead of the triac Q is soldered to the print-circuit board 21. In this state, the heat slinger HS is fixed to the case 20 with a pair of mounting screws 44. Two electric lines 22 connected to a series circuit of an AC power supply AC and the load L is also connected to the print-circuit board 21.

The case 20 for housing the print-circuit board 21 is formed by joining a base 23 and a cover 24 each shaped like a box made of a synthetic resin with an assembling screw 45. A light reception cover 25 is attached to the part of the cover 24 corresponding to the front of the illumination sensor A and ambient light is incident on the illumination sensor A through the light reception cover 25. A mounting bracket 29 is attached to the outside of the case 20 so that the mounting bracket 29 can be used to attach the case 20 to a house, a building, etc.

As described above, in the embodiment, change in the transmittance of the liquid crystal plate LC for the natural light is lessened and change in the transmittance of the liquid crystal plate LC for the illumination light is enlarged. Thus, the hysteresis magnification for the natural light can be made small and the hysteresis magnification for the illumination light can be made large. Consequently, when the triac Q is turned on in the night, etc., for lightening the illumination light of the load L, if light is incident from headlights of an automobile, etc., the transmittance of the liquid crystal plate LC is very low and the triac C is maintained on. In contrast, when the quantity of the sunlight is increased at the crack of dawn, it is made possible to immediately turn off the triac Q because the transmittance of the liquid crystal plate LC for the natural light is low. In short, a quick response is made to the natural light and control of the load L responsive to change in the surrounding brightness can be executed rapidly; a slow response is made to change in the brightness for the natural light, whereby a malfunction of the load L caused by the headlights of an automobile or any other illumination can be prevented.

Twenty-third Embodiment

Figure 55A:
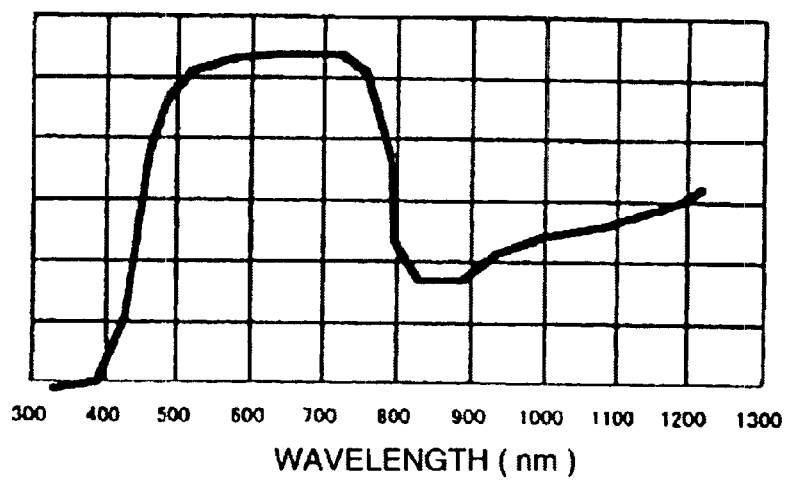
FIGS. 55A and 55B are schematic representations of the operation to show a twenty-third embodiment of the invention.

In a twenty-third embodiment of the invention, a filter is used in addition to the liquid crystal plate LC in the twenty-second embodiment. The filter used in the twenty-third embodiment has transmittance different in a visible light area and an infrared light area, namely, has almost constant transmittance in the visible light area and has transmittance in near-infrared light area lower than that in the visible light area, as shown in FIG. 55A.

Figure 55B:
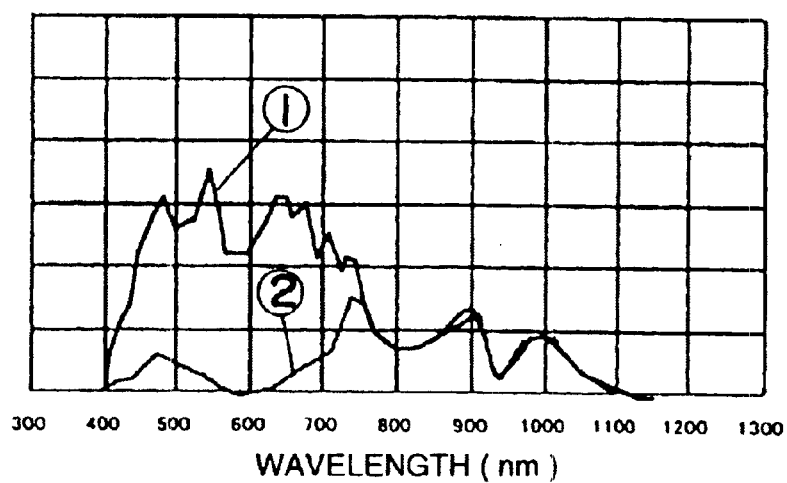

Such a filter is placed in the incidence path of ambient light on the solar battery SB in the twenty-second embodiment, whereby the output voltage of the solar battery SB responsive to the natural light changes as shown in FIG. 55B with respect to the light wavelength. That is, output as in FIG. 53A is provided from the characteristics of the solar battery SB and the liquid crystal plate LC in response to the natural light as in FIG. 52A and thus the output of the solar battery SB becomes as shown in FIG. 55B by adding a filter having the characteristic as in FIG. 55A. Consequently, the hysteresis magnification for the natural light can be adjusted in response to the characteristic of the filter. (1) in FIG. 55B indicates the output when a triac Q is off and (2) indicates the output when the triac Q is on. Other components are similar to those in the twenty-second embodiment.

Twenty-fourth Embodiment

Figure 56A:
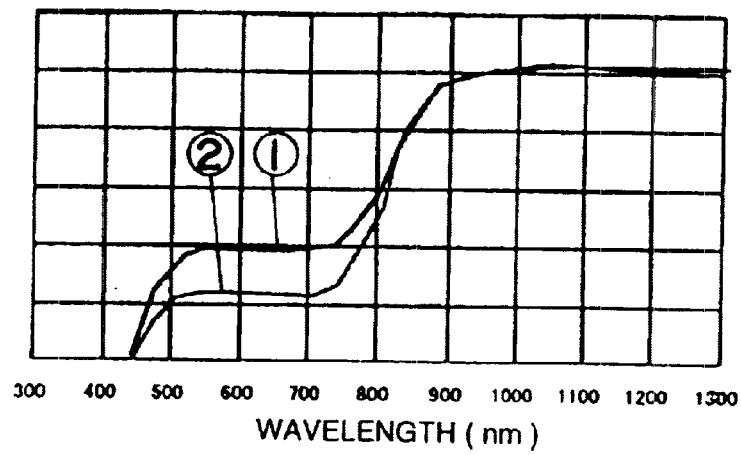
FIGS. 56A and 56B are schematic representations of the operation to show a twenty-fourth embodiment of the invention.
Figure 56B:
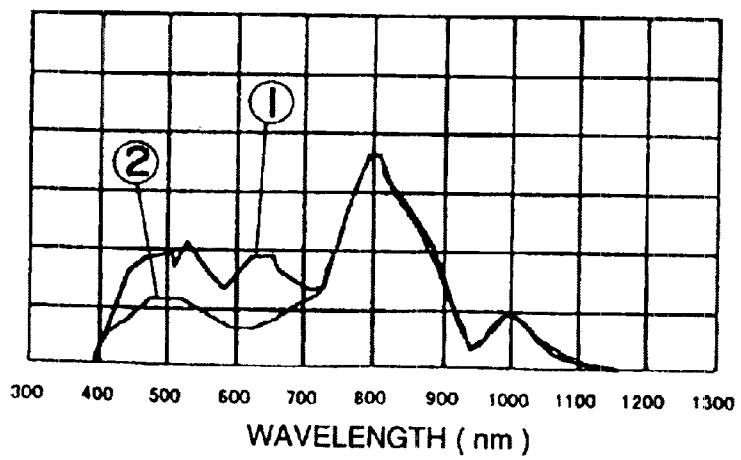

As mentioned in the description of the twenty-second embodiment, a polarizing plate PL is disposed on either side of the liquid crystal plate LC and thus the relative angle of the vibration face of light passing through both the polarizing plates PL is set appropriately, whereby the transmittance containing the liquid crystal plate LC and the polarizing plates PL can be adjusted. For simplicity, vibration face change of light while the light passes through the liquid crystal plate LC is ignored. That is, assuming that the light vibration face before the liquid crystal plate LC equals that after the liquid crystal plate LC, when the vibration faces of light passing through both the polarizing plates PL match, the transmittance of the polarizing plate PL is roughly 100% and as the angle difference between the vibration faces is increased, the transmittance is decreased. For example, when the vibration faces of light passing through both the polarizing plates PL match, the transmittance of the liquid crystal plate LC and the polarizing plate PL becomes as in FIG. 51A and therefore the output voltage of solar battery SB becomes as shown in FIG. 53A. In contrast, if an angle difference exists between the vibration faces of light passing through both the polarizing plates PL, the transmittance of the liquid crystal plate LC and the polarizing plate PL becomes a characteristic, for example, as in FIG. 56A and therefore the output voltage of the solar battery SB becomes a characteristic as shown in FIG. 56A. (1) in FIG. 56 indicates the characteristics when a triac Q is off and (2) indicates the characteristics when the triac Q is on. Thus, the polarizing plates PL make it possible to adjust the whole transmittance without changing the transmittance change tendency with respect to the wavelength. For example, when a filter is used as in the twenty-third embodiment and the hysteresis magnification in the visible light area is too large, the hysteresis magnification can be adjusted in a proper range if the relative positional relationship between the polarizing plates PL is adjusted appropriately. Other components are similar to those in the twenty-second embodiment.

Twenty-fifth Embodiment

In each embodiment described above, a monocrystalline silicon solar battery is used as the solar battery SB. Since the monocrystalline silicon solar battery has a spectral sensitivity characteristic different from the luminosity characteristic of a human being, a sense of incongruity may be produced for a response of the illumination sensor A. If a response close to the luminosity characteristic of a human being is required, it is possible that an amorphous solar battery is used as the solar battery SB as mentioned in the description of the first embodiment, etc.

Figure 57:
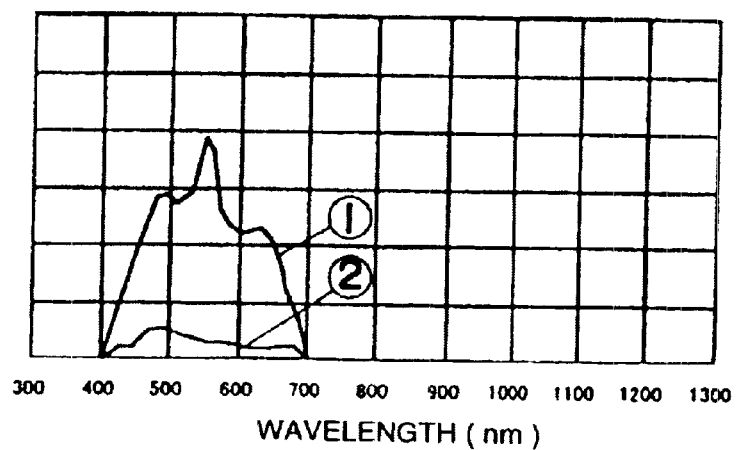
FIGS. 57A and 57B are schematic representations of the operation to show a twenty-fifth embodiment of the invention.
Figure 58A:
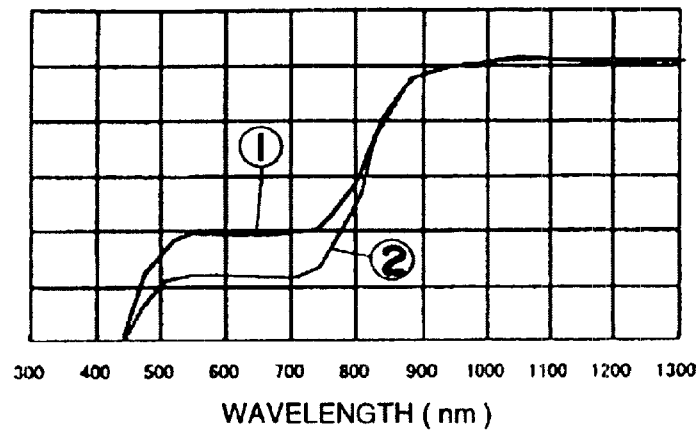
FIGS. 58A and 58B are schematic representations of the operation in the twenty-fifth embodiment of the invention.
Figure 58B:
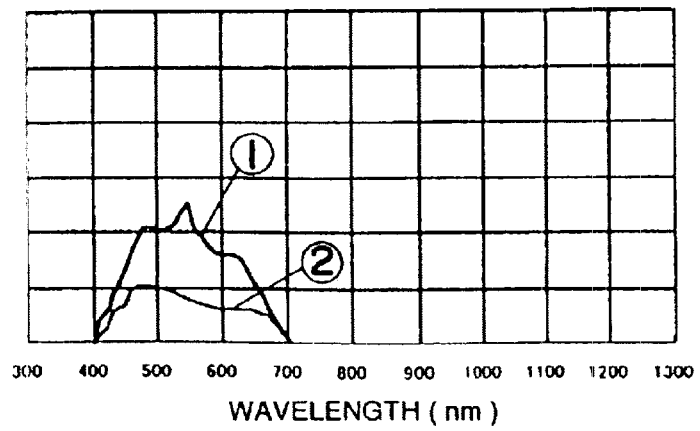

Here, assuming that the spectral characteristic of the transmittance of liquid crystal plate LC becomes as shown in FIG. 51A, the output voltage of the solar battery SB becomes as in FIG. 57. (1) in FIG. 57 indicates the output when a triac Q is off and (2) indicates the output when the triac Q is on. As seen in FIG. 57, if the amorphous solar battery is used, the hysteresis magnification becomes very large in a visible light area. Then, if the transmittance is adjusted by adjusting the relative positions of polarizing plates PL as in the twenty-fourth embodiment, it is made possible to set the total transmittance of the liquid crystal plate LC and the polarizing plates PL as in FIG. 58A, and the output characteristic of the solar battery SB in response to the natural light having the spectral characteristic shown in FIG. 52A becomes as in FIG. 58B. (1) in FIG. 58 indicates the characteristics when a triac Q is off and (2) indicates the characteristics when the triac Q is on. This means that the hysteresis magnification can be decreased. Other components are similar to those in the twenty-second embodiment.

Twenty-sixth Embodiment

Figure 59:
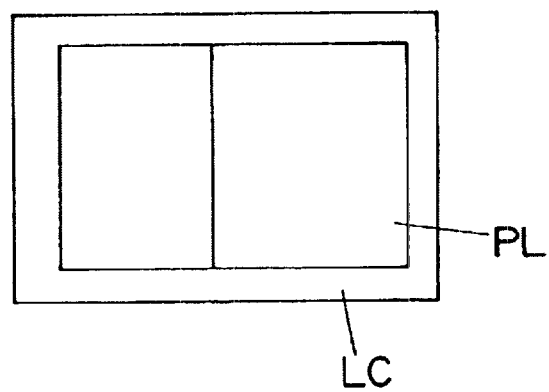
FIG. 59 is a schematic main part diagram to show a twenty-sixth embodiment of the invention.

In a twenty-sixth embodiment of the invention, the control portion of transmittance using a polarizing plate PL is a part of the view field range of a solar battery SB. That is, the polarizing plates PL placed corresponding to all region of the view field range of the solar battery SB are used in the twenty-fourth embodiment, etc.; in the twenty-sixth embodiment of the invention, light is reduced with a polarizing plate PL only in a partial region of the view field range of the solar battery SB as shown in FIG. 59. In other words, light is not reduced with the polarizing plate PL in the remaining region of the view field range of the solar battery SB. That is, while light is reduced with the polarizing plate PL, the light quantity is less lowered than that when the light is reduced in all region of the solar battery SB, and the whole sensitivity can be enhanced. Other components are similar to those in the twenty-second embodiment.

Twenty-seventh Embodiment

Figure 60:
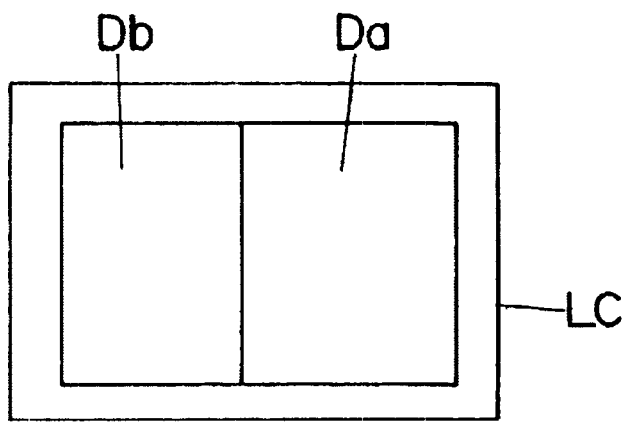
FIG. 60 is a schematic main part diagram to show a twenty-seventh embodiment of the invention.

In a twenty-seventh embodiment of the invention, the control portion of transmittance using a liquid crystal plate LC is a part of the view field range of a solar battery SB. That is, the transmittance of the liquid crystal plate LC is changed in all region of the view field range of the solar battery SB are used in the twenty-second embodiment, etc.; in the twenty-seventh embodiment of the invention, light passes through the liquid crystal plate LC only in a partial region of the view field range of the solar battery SB as shown in FIG. 60 (the passing-through region is indicated by Da). Light does not pass through the liquid crystal plate LC in the remaining region Db of the view field range of the solar battery SB. Such a liquid crystal plate LC can be provided by placing no electrode in the region where light is not allowed to pass through. Other components are similar to those in the twenty-second embodiment.

Twenty-eighth Embodiment

In a twenty-eighth embodiment of the invention, an illumination sensor A comprising a liquid crystal plate LC superposed on the light reception face of a solar battery SB is provided with a control circuit consisting of resistors R1 and R2, a capacitor C, and a diode D1, placed between the solar battery SB and a switching element SW. That is, the resistor R2 is connected in parallel to the solar battery SB and a series circuit of the resistor R1 and the capacitor C is connected in parallel to the resistor R2. Further, the diode D1 is connected in parallel to the resistor R1. The control circuit is inserted between the solar battery SB and the switching element SW and adjusts a response of the switching element SW to change in the output voltage of the solar battery SB.

The switching element SW comprises two depletion-type MOSFETs Q1 and Q2 connected in inverse series and sources are connected and gates are connected in common. The positive pole of the solar battery SB is connected to the source of the MOSFET Q1, Q2 and the negative pole of the solar battery SB is connected to the gate of the MOSFET Q1, Q2 via the parallel circuit of the resistor R1 and the diode D1. This means that the capacitor is connected between the gate and the source of the MOSFET Q1, Q2. The illumination sensor A of the embodiment has four connection terminals P1 to P4 and the switching element SW is connected at one end (drain of MOSFET Q1) to the connection terminal P2 and is connected at an opposite end (drain of MOSFET Q2) to the connection terminal P3. The liquid crystal plate LC is connected at one end to the connection terminal P1 and at another end to the connection terminal P4.

Figure 62A:
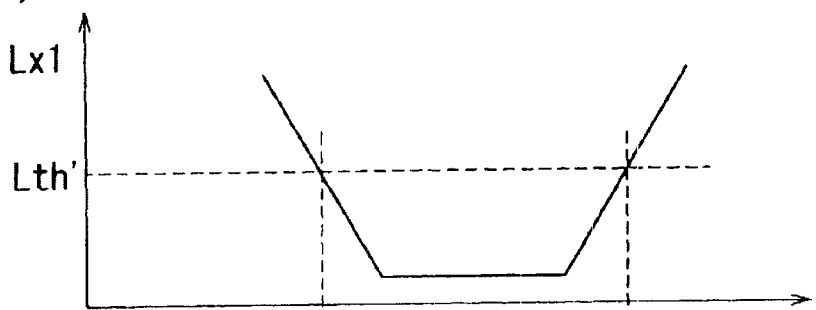
FIG. 62 is a schematic representation of the operation of an illumination sensor in the twenty-eighth embodiment of the invention.
Figure 62B:
Figure 62C:
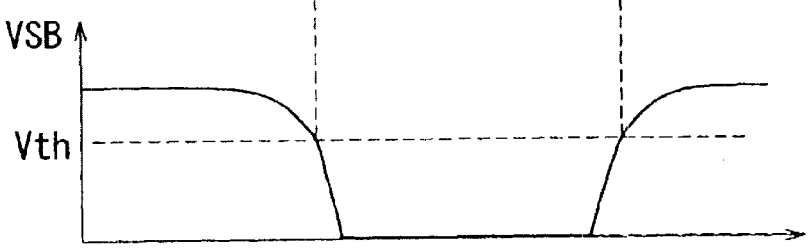

The operation of the illumination sensor A basically is similar to that of the illumination sensor A used in the seventh embodiment of the invention and will be briefly discussed. FIG. 62A shows ambient light brightness L×1, FIG. 62B shows drain-source impedance Z1 of the MOSFET Q1, Q2, and FIG. 62C shows output voltage VSB of the solar battery SB. FIGS. 62A to 62C show the operation of the illumination sensor A with no liquid crystal plate LC provided.

When the ambient light brightness L×1 exceeds a predetermined value Lth, the gate potential of the MOSFET Q1, Q2 becomes a negative potential because of the output voltage VSB of the solar battery SB and the absolute value of the output voltage VSB of the solar battery SB becomes larger than a threshold voltage Vth of the MOSFET Q1, Q2, turning off the MOSFET Q1, Q2 (namely, turning off the switching element SW). On the other hand, when the ambient light brightness L×1 falls below the predetermined value Lth, the absolute value of the output voltage VSB of the solar battery SB becomes smaller than the threshold voltage Vth and the MOSFET Q1, Q2 cannot be maintained off, then the drain-source impedance Z1 of the MOSFET Q1, Q2 is lowered rapidly and the MOSFET Q1, Q2 is turned on (namely, the switching element SW is turned on). That is, as the output voltage VSB of the solar battery SB is decreased or increased in response to the ambient light brightness L×1, the drain-source impedance Z1 of the MOSFET Q1, Q2 is changed rapidly in the vicinity of the threshold voltage Vth of the MOSFET Q1, Q2.

Here, the resistor R2 of high resistance is connected across the solar battery SB and a current flows into the resistor R2 from the solar battery SB and a voltage is generated across the resistor R2, whereby the output voltage VSB of the solar battery SB is set. Since the capacitor C is connected between the gate and the source of the MOSFET Q1, Q2, applied voltage to the gate of the MOSFET Q1, Q2 becomes stable. The series circuit of the capacitor C and the resistor R1 is connected in parallel to the solar battery SB and the capacitor C and the resistor R1 make up an integration circuit. Thus, if the output voltage VSB of the solar battery SB is changed temporarily because of temporarily change in the ambient light, the voltage across the capacitor does not change and pulse light can be prevented from causing the MOSFET Q1, Q2 to malfunction. The diode D1 is a diode for discharging the capacitor C.

Figure 63:
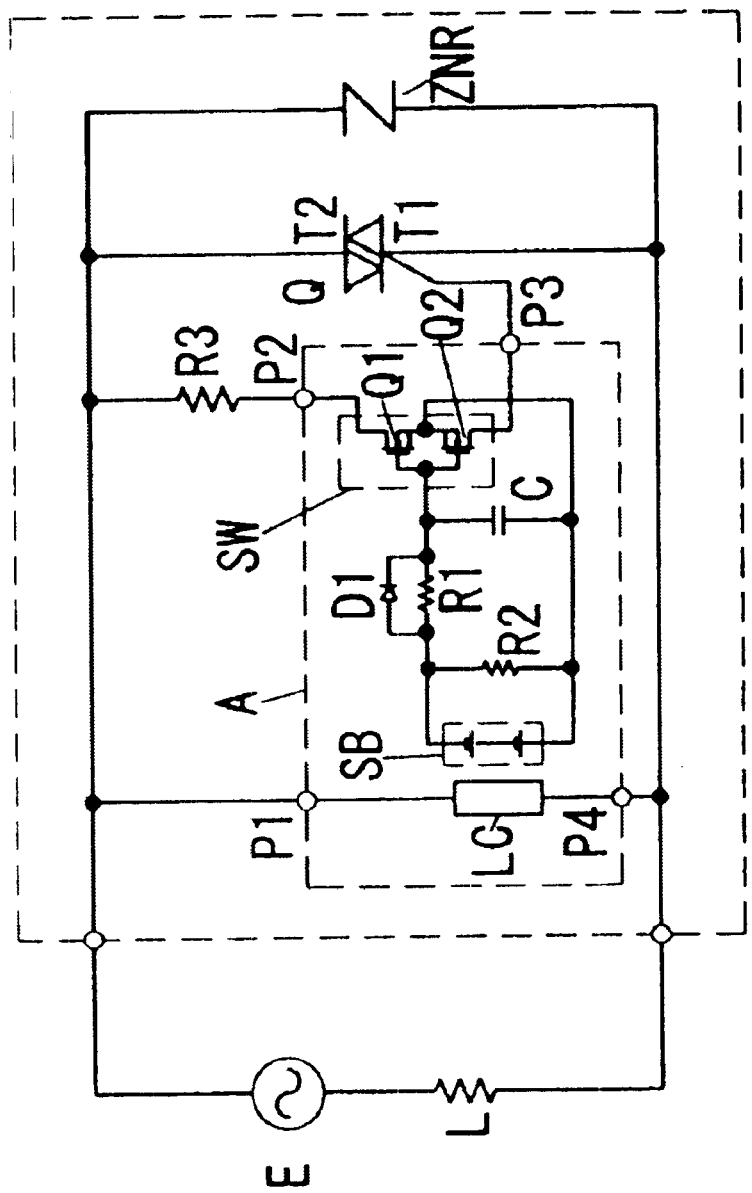
FIG. 63 is a circuit diagram to show an electronic automatic on/off switch using the illumination sensor shown in FIG. 62.

The illumination sensor A of the embodiment can be used with an electronic automatic on/off switch in the form shown in FIG. 63. The electronic automatic on/of f switch shown in FIG. 63 basically is similar to that of the twenty-second embodiment previously described with reference to FIG. 48 except that in the twenty-eighth embodiment, resistors R7 and R8 are omitted as the configuration for applying the voltage across a triac Q to the liquid crystal plate LC.

Therefore, the operation of the illumination sensor A of the embodiment is also similar to that of the twenty-second embodiment. That is, FIG. 64A shows the ambient light brightness L×1 and illumination L×2 after light passes through the liquid crystal plate LC, FIG. 64B shows the operation state of the triac Q, FIG. 64C shows the drain-source impedance Z1 of the MOSFET Q1, Q2, and FIG. 64D shows the output voltage VSB of the solar battery SB.

In the electronic automatic on/off switch shown in FIG. 63, the connection terminal P2 of the illumination sensor A (namely, the drain of the MOSFET Q1) is connected to a T2 terminal of the triac Q via a resistor R3 and the connection terminal P3 is connected to a gate of the triac Q. The connection terminal P1 of the illumination sensor A is connected to the T2 terminal of the triac Q and the connection terminal P4 is connected to a T1 terminal of the triac Q. That is, the liquid crystal plate LC is connected between the T2 and T1 terminals of the triac Q. The liquid crystal plate LC used here has transmittance made lower as the voltage across the liquid crystal plate LC is smaller. This means that when the triac Q is on, the voltage applied across input terminal of the liquid crystal plate LC becomes almost 0 V and the transmittance is lowered.

When the ambient light brightness L×1 is large and the switching element SW is off, the triac Q is not triggered and is held off. At this time, voltage is applied across the input terminal of the liquid crystal plate LC and the liquid crystal plate LC has high transmittance. On the other hand, when the surroundings become dark and the illumination L×2 after light passes through the liquid crystal plate LC becomes darker than the predetermined threshold value Lth, the output voltage VSB of the solar battery SB becomes lower than the threshold voltage Vth of the MOSFET Q1, Q2 and the MOSFET Q1, Q2 cannot be maintained off, then the drain-source impedance Z1 of the MOSFET Q1, Q2 is lowered rapidly and the switching element SW is turned on. At this time, the triac Q is triggered through the switching element SW and is turned on. When the triac Q is turned on, the voltage applied across the input terminal of the liquid crystal plate LC becomes almost 0 V, thus the liquid crystal plate LC is switched from the high transmittance state to a low transmittance state. This means that the quantity of light incident on the light reception part of the solar battery SB is further lowered and the switching element SW and the triac Q make the off-to-on state transition completely.

Then, when the surroundings again become bright and the illumination L×2 after light passes through the liquid crystal plate LC becomes brighter than the predetermined threshold value Lth, the output voltage VSB of the solar battery SB becomes higher than the threshold voltage Vth of the MOSFET Q1, Q2 and the drain-source impedance Z1 of the MOSFET Q1, Q2 is increased rapidly and the switching element SW is turned off. In this state, the triac Q is not triggered and thus is turned off. When the triac Q is turned off, voltage is applied across the input terminal of the liquid crystal plate LC and the liquid crystal plate LC is switched from the low transmittance state to a high transmittance state. This means that the quantity of light incident on the light reception part of the solar battery SB is further increased and the switching element SW and the triac Q are turned off completely.

Thus, when the switching element SW is off, the liquid crystal plate LC has the transmittance raised for increasing the quantity of light incident on the light reception part of the solar battery SB; when the switching element SW is on, the liquid crystal plate LC has the transmittance lowered for decreasing the quantity of light incident on the light reception part of the solar battery SB. Therefore, the ambient light brightness L×2 when the switching element SW is switched off from the on state becomes higher as compared with the ambient light brightness L×1 when the switching element SW is switched on from the off state, and hysteresis can be given to the brightness threshold value of the ambient light.

Figure 61:
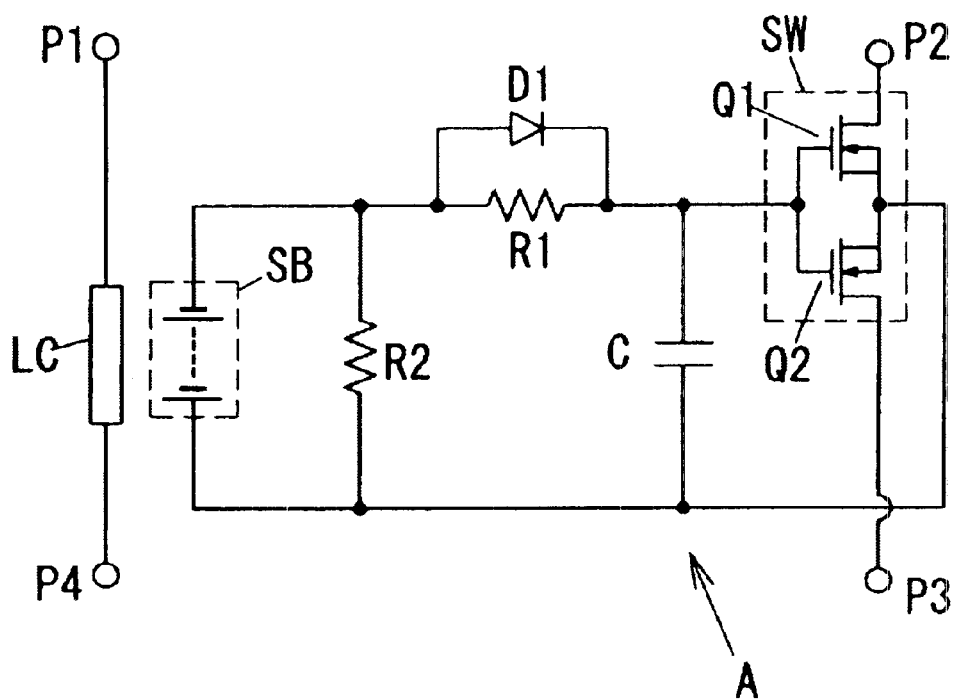
FIG. 61 is a circuit diagram to show a twenty-eighth embodiment of the invention.
Figure 65B:
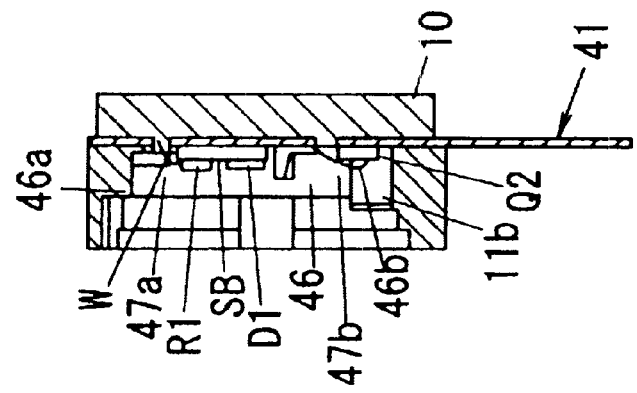
FIGS. 65A and 65B show the illumination sensor shown in FIG. 62.
Figure 65A:
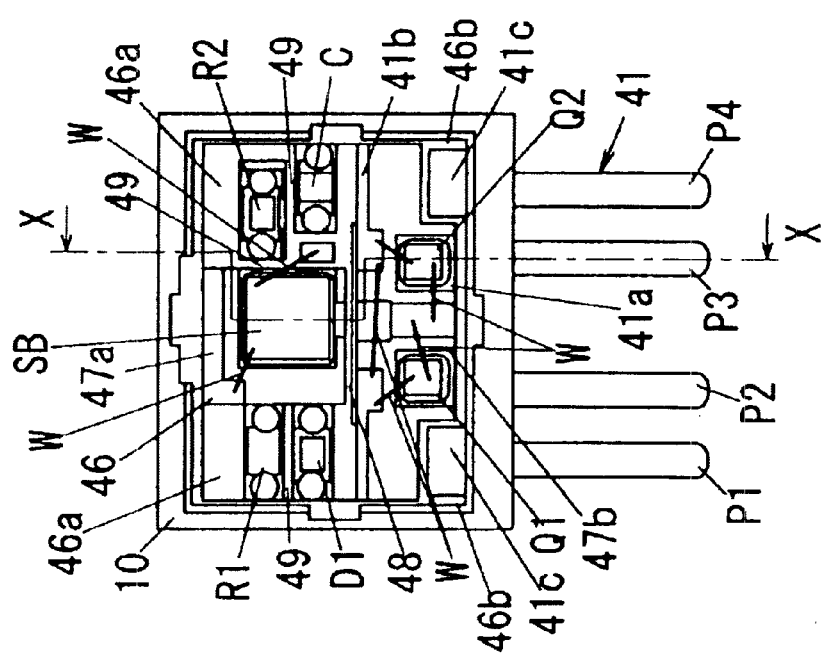
Figure 66A:
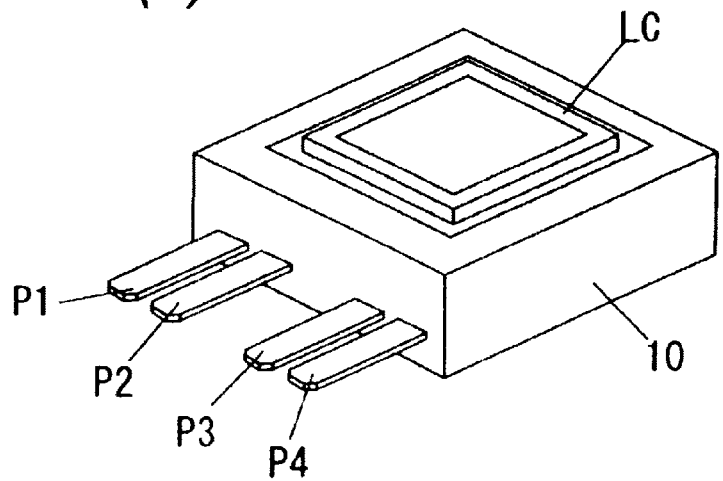
FIGS. 66A and 66B show the illumination sensor shown in FIG. 62.
Figure 66B:
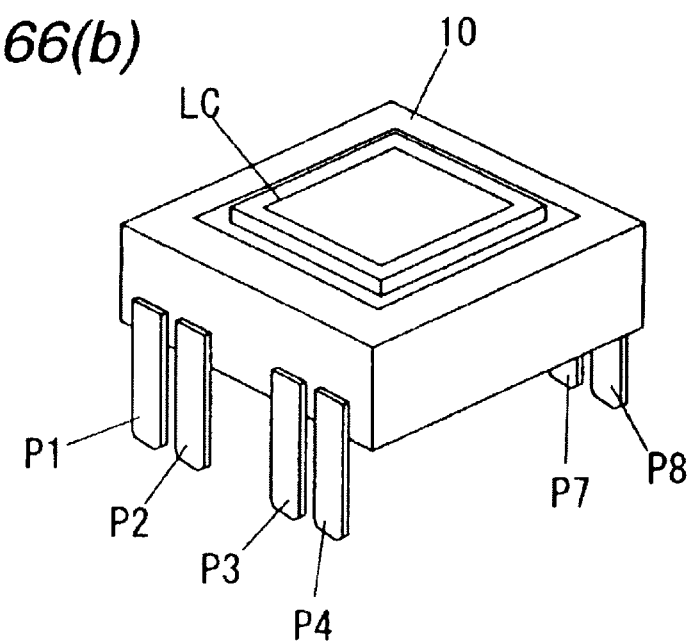
Figure 68:
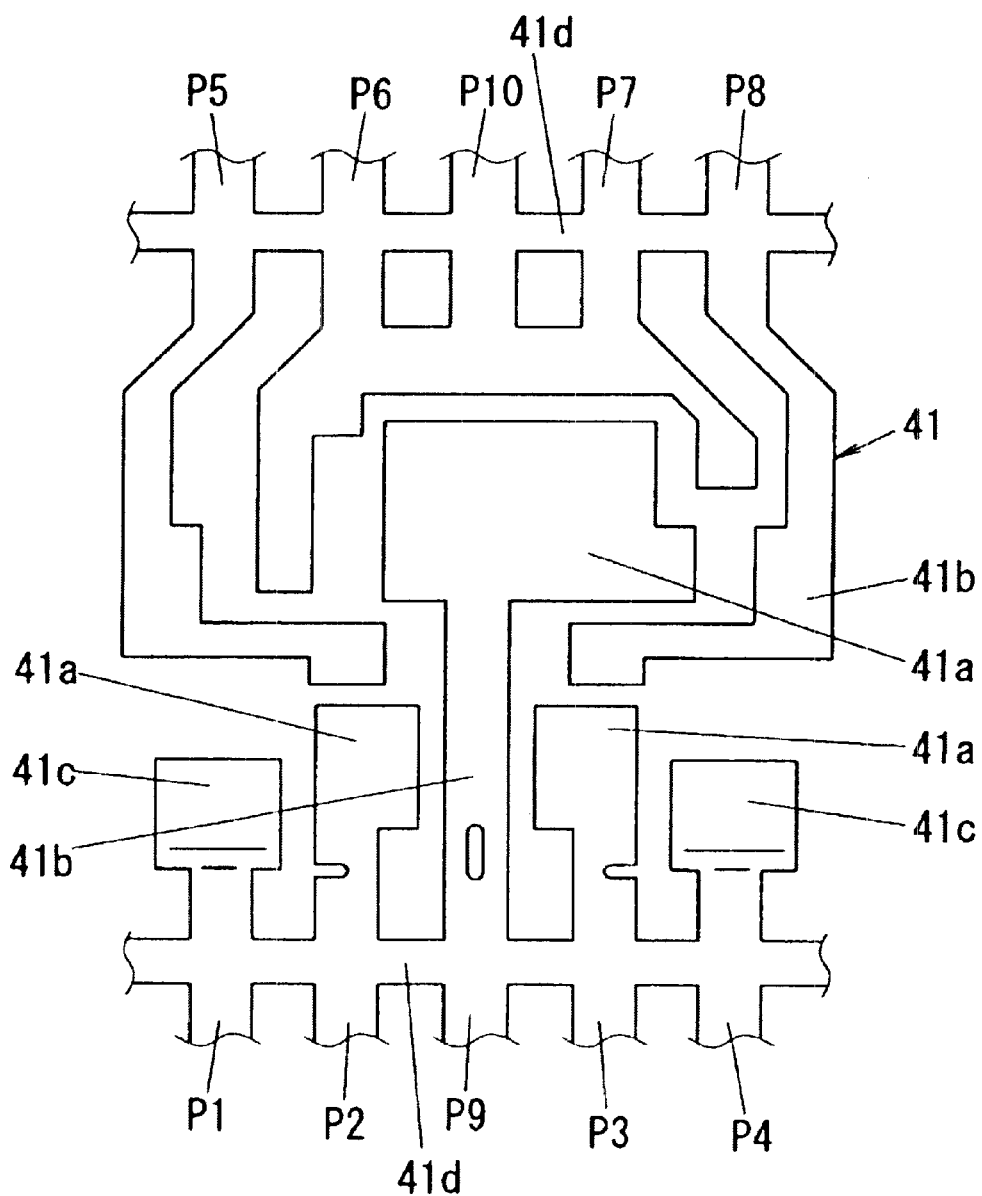
FIG. 68 is a plan view of a frame used with the illumination sensor.

Next, the structure of the illumination sensor A will be discussed. As shown in FIGS. 65 to 67, a package 10 of the illumination sensor A is a molded-resin article shaped roughly like a rectangular parallelepiped and is molded with a metal frame 41 in one piece. The frame 41 is formed to the shape shown in FIG. 68 by stamping and further bending a metal sheet having electric conductivity. That is, it is formed with a plurality of element mounting parts 41a where elements are mounted, connection terminals P1 to P4, wiring parts 41b forming electric paths between the element mounting parts 41a and the connection terminals P1 to P4, terminal parts 41c to which the input terminal of the liquid crystal plate LC is electrically connected, and dummy terminals P5 to P8 reserved for future use of the package 10 as a DIP (dual-in-line package) as in FIG. 66B. Further, dummy terminals P9 and P10 are also provided. When the elements are mounted on the frame 41 formed to such a shape, the circuit shown in FIG. 61 is formed. The frame 41 is formed like a rectangle or a hoop, the elements can be mounted and the package 10 can be molded in a continuous process at the quantity production time, and the costs can be reduced. At the stage, the connection terminals P1 to P4 and the dummy terminals P5 to P8 are continuous via connection pieces 41d and the connection pieces 41d are cut out at a later step.

The package 10 is formed on one side with a recess 46 for mounting the elements and the element mounting parts 41a and the wiring parts 41b of the frame 41 are exposed to the bottom of the recess 46. The connection terminals P1 to P4 are projected to the outside from one end face of the package 10 as the form of an SIC (single-in-line package) as in FIG. 66A.

The recess 46 is formed on inner sides with step parts 46a and 46b and when the liquid crystal plate LC is attached to the package 10, the peripheral surface of the liquid crystal plate LC abuts the inner sides of the recess 46 and the rear of the liquid crystal plate LC abuts the step parts 46a and 46b, so that the liquid crystal plate LC is positioned in the package 10, as shown in FIG. 67B. Since the package 10 is molded with the frame 41 in one piece and the elements are mounted on the element mounting parts 41a of the frame 41, the relative positions between the solar battery SB and the liquid crystal plate LC can be determined easily. The terminal parts 41c formed by bending one end of each of the connection terminals P1 and P4 are disposed in the step parts 46b placed in the inner side of the recess 46 on the projection side of the connection terminals P1 and P4. When the liquid crystal plate LC is attached to the package 10, an electrode PE made of an ITO film placed on the rear of the liquid crystal plate LC is connected electrically to the terminal part 41C, for example, with a conductive adhesive.

Figure 69:
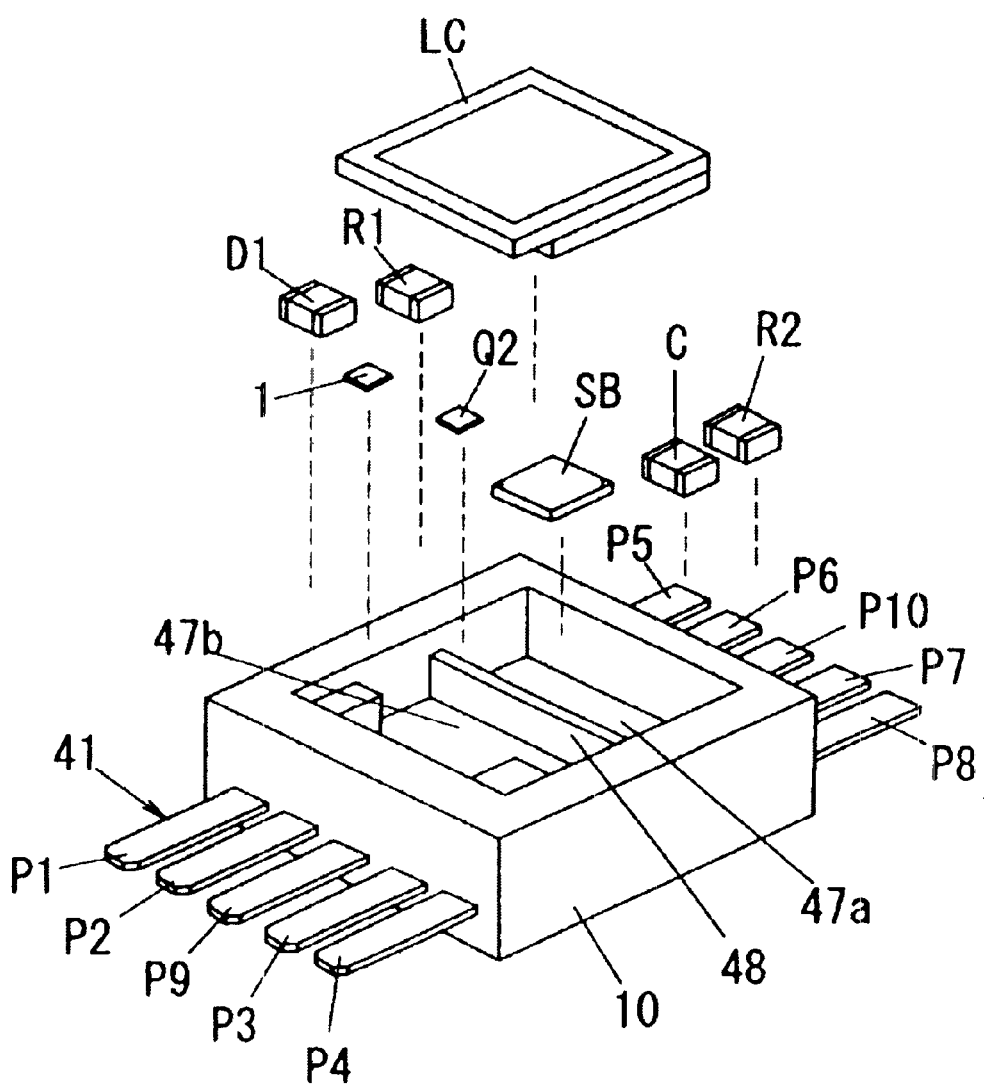
FIG. 69 is an exploded perspective view of the illumination sensor.
Figure 70:
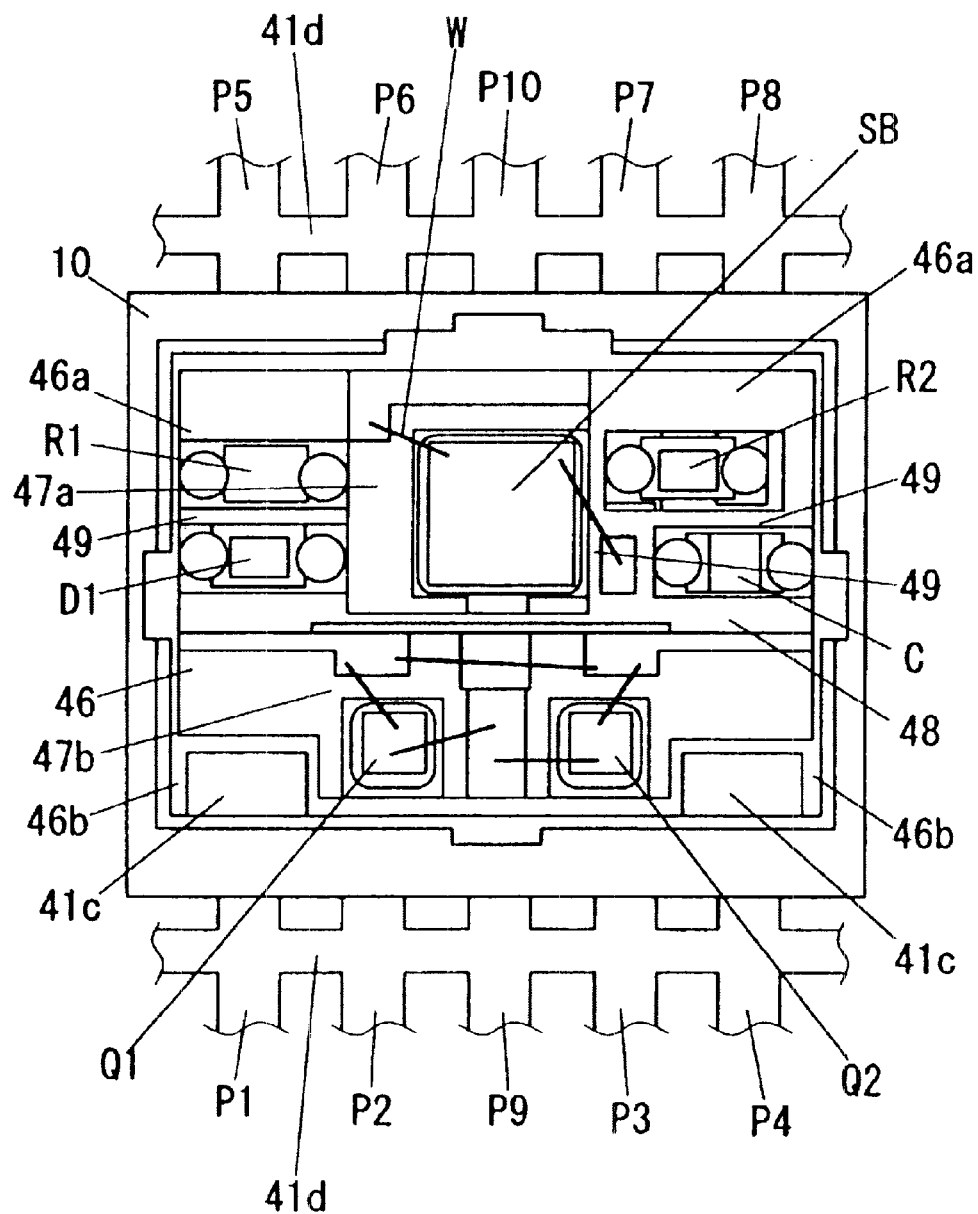
FIG. 70 is a plan view of the illumination sensor before connection pieces are cut out.

When the package 10 is molded with the frame 41 in one piece with a mold material and then the electric parts of the resistors R1 and R2, the capacitor C, the diode D1, the MOSFETs Q1 and Q2, and the solar battery SB are mounted on the element mounting parts 41a of the frame 41 exposed in the recess 46 of the package 10 as shown in FIGS. 69 and 70, the electric parts are connected electrically via the frame 41. Electrodes are provided across the surface-mounted parts of the resistors R1 and R2, the capacitor C, the diode D1, etc., and the surface-mounted parts are mounted across the two element mounting parts 41a of the frame 41. The MOSFETs Q1 and Q2 and the solar battery SB are die-bonded to the element mounting parts 41a of the frame 41 and are electrically connected to the wiring parts 41b of the frame 41 via wire (bonding wire) W. Then, the connection pieces 41d connecting the connection terminals P1 to P4 and the dummy terminals P5 to P10 are cut out to form the package 10 as a SIP. To make the package 10 a DIP, the connection pieces 41d connecting the connection terminals P1 to P4 and the dummy terminals P5 to P8 and the dummy terminals P9 and P10 are cut out.

By the way, the package 10 is formed with a separation wall 48 for separating the recess 46 into a first housing chamber 47a for housing the solar battery SB and a second housing chamber 47b for housing the switching element SW, namely, the MOSFETs Q1 and Q2. The resistors R1 and R2, the capacitor C, the diode D1, and the solar battery SB are mounted on the first housing chamber 47a. The package 10 is formed with partition walls 49 for separating the electric parts. Since the electric parts are separated by the partition walls 49, the mounting positions of the electric parts do not largely shift and moreover solder and conductive adhesive (for example, silver paste or the like) for electrically connecting the terminals of the electric parts to the element mounting parts 41a are not drawn into the mounting positions of other electric parts, so that the reliability of the electric connection is enhanced.

Figure 71:
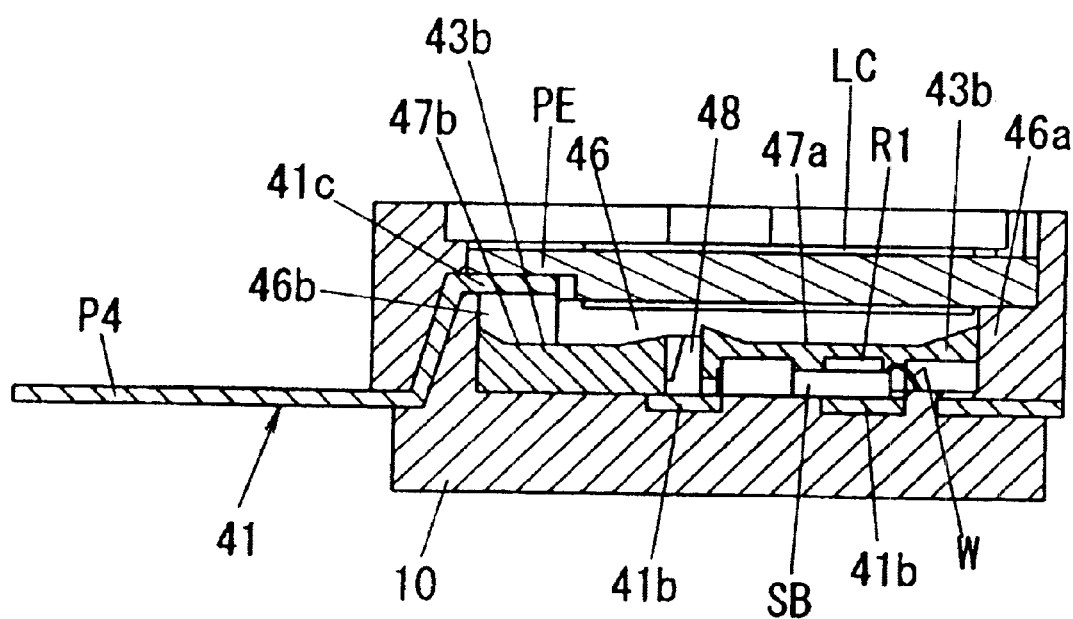
FIG. 71 is a sectional view of the illumination sensor.

With the electric parts installed in the package 10, the first housing chamber 47a for housing the solar battery SB is filled with a seal member 43b made of a transparent resin and the second housing chamber 47b for housing the MOSFETs Q1 and Q2 is filled with a seal member 43a made of a lightproof resin, as shown in FIG. 71.

Since the MOSFETs Q1 and Q2 is thus filled with the seal member 43a having a lightproof property, light is not incident on the MOSFET Q1 or Q2 and degradation of the MOSFETs Q1 and Q2 caused by incidence of light can be prevented and degradation of the MOSFETs Q1 and Q2 caused by the surrounding environment (ambient humidity, suspended gas proper to the installation place, etc.,) can be prevented. Since the solar battery SB is sealed with the seal member 43b having a translucent property, degradation of the solar battery SB caused by the surrounding environment can be prevented while light is allowed to be incident on the solar battery SB. Moreover, the first housing chamber 47a where the solar battery SB is mounted and the second housing chamber 47b where the MOSFETs Q1 and Q2 are mounted are filled with different seal members 43b and 43a; the first and second housing chambers 47a and 47b are separated by the separation wall 48, so that the two seal members 43a and 43b are not mixed. Therefore, the accident in which the seal member 43a having a lightproof property is drawn into the solar battery SB for decreasing the quantity of light incident on the light reception part of the solar battery for lowering the output voltage thereof can be prevented, and the state in which the electric parts are not completely sealed because each seal member 43a, 43b is drawn into any other portion, whereby the liquid level of the seal member 43a, 43b is lowered can be prevented from occurring.

Figure 72A:
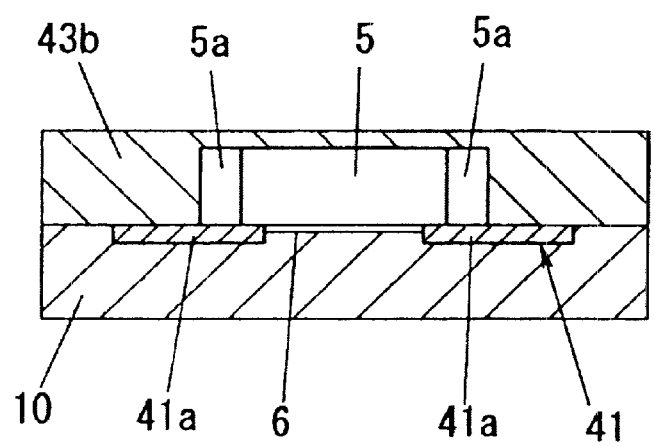
FIG. 72A is a sectional view of the main part of a comparison example and FIG. 72B is a sectional view of the main part of the illumination sensor.
Figure 72B:
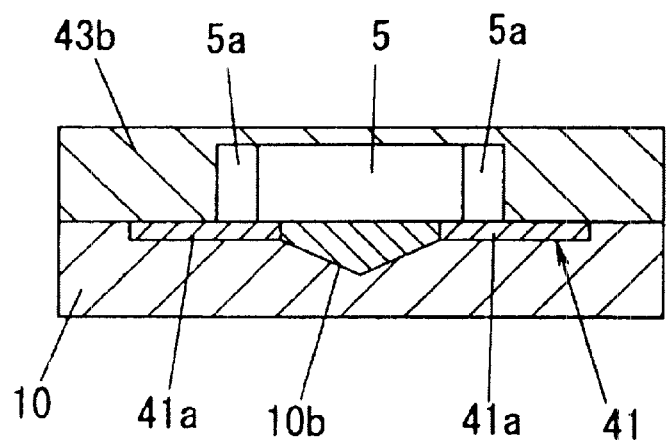

By the way, when terminal parts 5a and 5a placed at both ends of a surface-mounted part such as the resistor R1 (chip part) are electrically connected to the element mounting parts 41a of the frame 41 and the surface-mounted part 5 is mounted across the two element mounting parts 41a, a minute gap 6 may occur between the surface-mounted part 5 and the package 10, as shown in FIG. 72A. If the gap 6 is formed, the seal member 43b is hard to enter the gap 6 and complete seal is not provided; it is feared that the insulating resistance of the surface-mounted part 5 may be degraded. The top and the sides of the surface-mounted part 5 are sealed with the seal member 43b, but the bottom is not filled with the seal member 43b, thus when the seal member 43 is cured, it is feared that a single-side stress may occur on the surface-mounted part 5, destroying the electric connection part of the surface-mounted part 5 and the element mounting part 41a.

Then, the package 10 is formed with a recess 10b in the part opposed to the surface-mounted part 5 between the terminal parts 5a and 5a, whereby the seal member 43 is allowed to flow into the recess 10b. According to the structure, the surface-mounted part 5 can be reliably sealed with the seal member 43b and the insulating resistance of the surface-mounted part 5 can be prevented from being degraded. Since the seal member 43b covers the full face of the surface-mounted part 5, a stress is not applied to the surface-mounted part 5 from one direction when the seal member 43b is cured.

Figure 73:
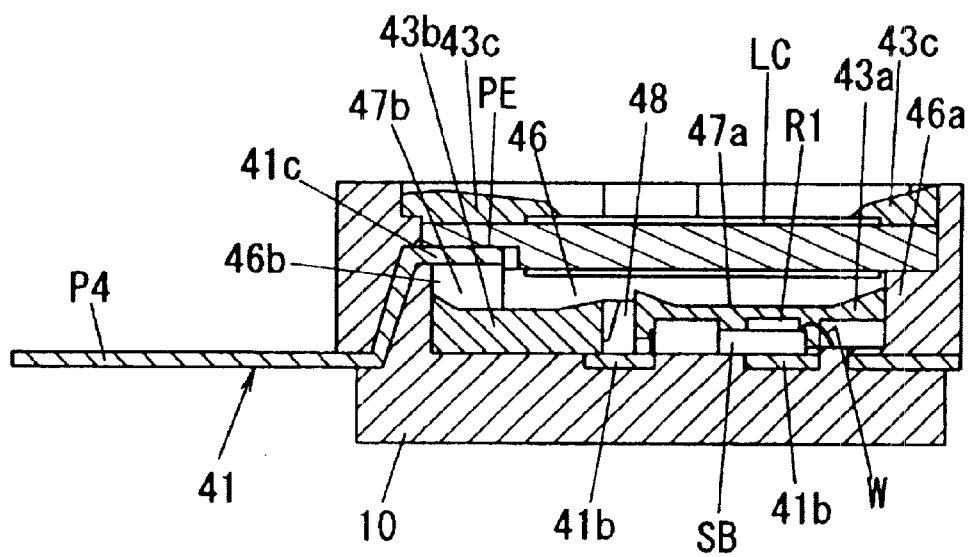
FIG. 73 is a sectional view of the illumination sensor to show a seal state of the liquid crystal plate.
Figure 74:
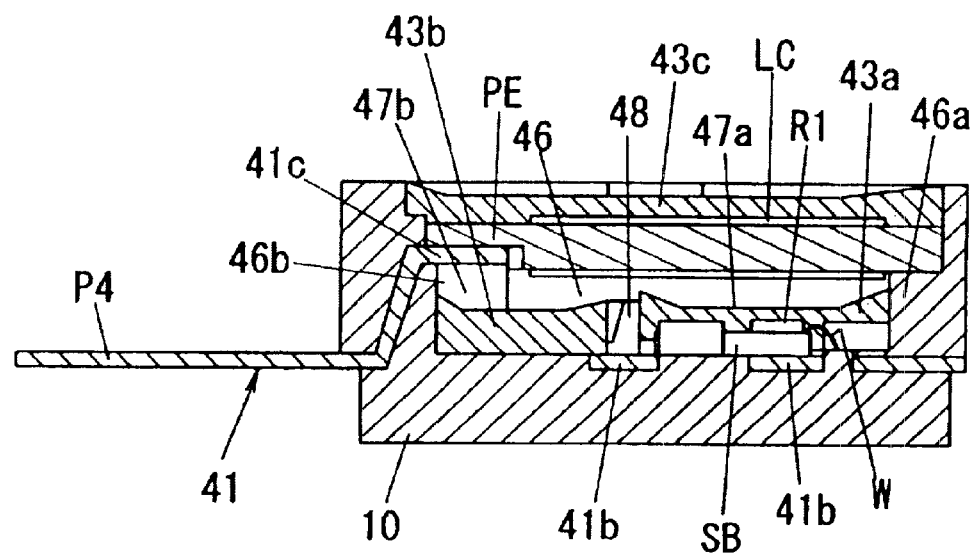
FIG. 74 is a sectional view of the illumination sensor to show another seal state of the liquid crystal plate.
Figure 75:
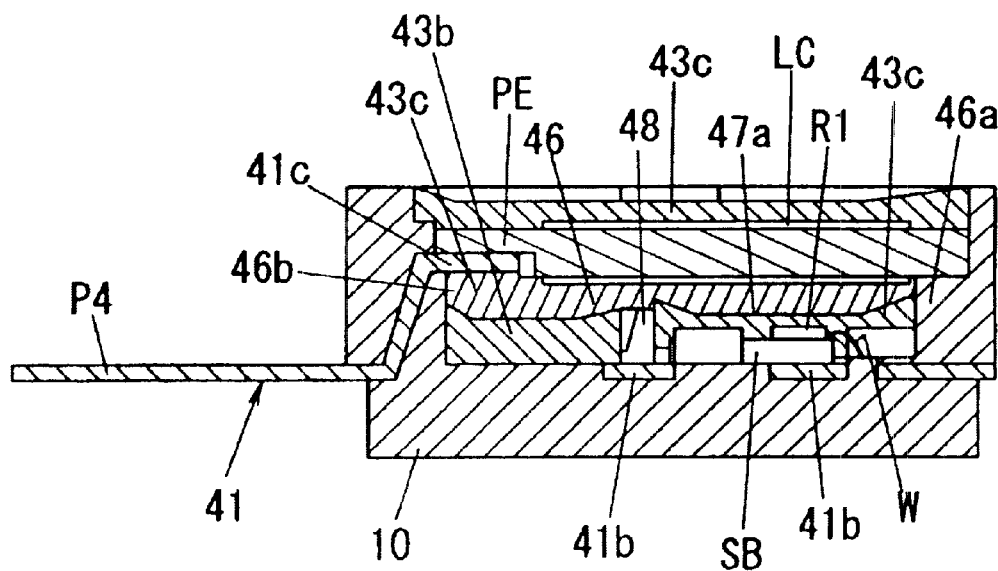
FIG. 75 is a sectional view of the illumination sensor to show still another seal state of the liquid crystal plate.

Since the liquid crystal plate LC is easily affected by humidity, the periphery of the window of the liquid crystal plate LC and the gap between the recess 46 of the package 10 and the liquid crystal plate LC are sealed with seal members 43c having a translucent property on the face of the liquid crystal plate LC on which ambient light is incident as shown in FIG. 73, whereby the liquid crystal plate LC can be prevented from being degraded due to the ambient humidity. The full face of the liquid crystal plate LC on which ambient light is incident may be sealed with the seal member 43c having a translucent property, as shown in FIG. 74 or the full face of the liquid crystal plate LC on which ambient light is incident may be sealed with the seal member 43c having a translucent property and the seal member 43c may be poured through a through hole (not shown) made in the package 10 into the space surrounded by the liquid crystal plate LC and the package 10 for fully sealing the surface and the back of the liquid crystal plate LC, as shown in FIG. 75.

Figure 76:
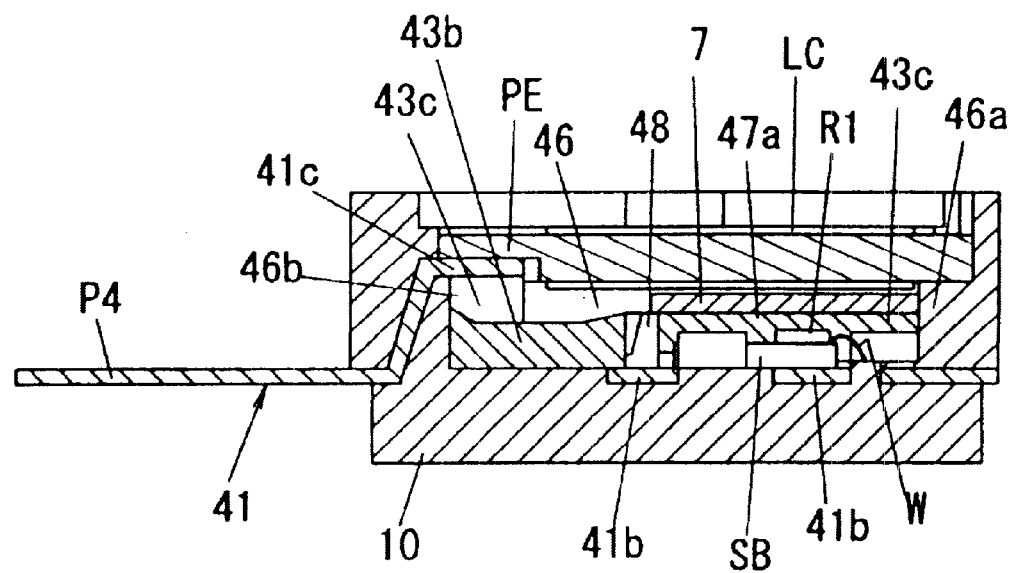
FIG. 76 is a sectional view of the illumination sensor to show an attachment state of a filter.
Figure 77:
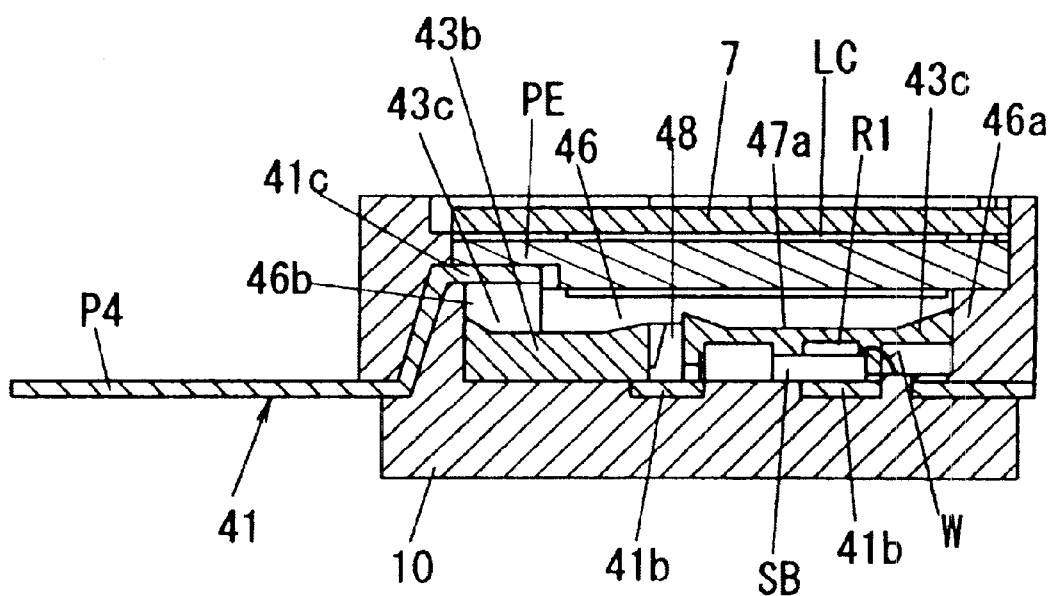
FIG. 77 is a sectional view of the illumination sensor to show another attachment state of the filter.

Alternatively, a flat filter 7 may be placed between the liquid crystal plate LC and the light reception part of the solar battery SB for correcting the spectral characteristic of light incident on the light reception part of the solar battery SB, as shown in FIG. 76. Such a filter 7 is provided, whereby if the solar battery SB has sensitivity to light in a specific wavelength region, it can be provided with sensitivity to light in any desired wavelength region by correcting the spectral characteristic of ambient light. The filter 7 has also a function as a lid for covering the first housing chamber 47a surrounded by the partition wall 48 and the inner sides of the recess 46 and can prevent the seal member 43b filled in the first housing chamber 47a from flowing out. The filter 7 may be placed in the package 10 so as to cover the face of the liquid crystal plate LC on the ambient light side, as shown in FIG. 77; in the composition, sensitivity to light in any desired wavelength region can also be provided through the filter 7 correcting the spectral characteristic of ambient light.

As described above, the electric parts making up the illumination sensor A are housed in the package 10 made of a molded-resin article and thus can be miniaturized as compared with the case where they are housed in discrete housings, and the whole of the illumination sensor A can be miniaturized. In addition, the step of installing the electric parts in the housings separately need not be executed, so that the manufacturing cost of the illumination sensor A can be reduced. Since the wiring length between the solar battery SB and the MOSFETs Q1 and Q2 is shortened, external radiation noise can be prevented from causing the MOSFETs Q1 and Q2 to malfunction, and resistance to noise is enhanced.

Twenty-ninth Embodiment

In the twenty-eighth embodiment, the electric parts are mounted in the frame 41 with which the package 10 is molded in one piece. In a twenty-ninth embodiment of the invention, resistors R1 and R2, a capacitor C, a diode D1, MOSFETs Q1 and Q2, and a solar battery SB are mounted on a frame 41, then the MOSFETs Q1 and Q2 and electrodes of the solar battery SB and wiring parts 41b of the frame 41 are electrically connected by wire W, then the MOSFETs Q1 and Q2 are sealed with a seal member 43a made of a lightproof resin and a package 10 is molded (transfer-molded) with the frame 41 in one piece with a mold material having a translucent property (for example, epoxy resin), as shown in FIGS. 78A and 78B. Other components are similar to those in the twenty-eighth embodiment.

Thus, the electric parts making up an illumination sensor are packed in the package 10 made of a molded-resin article and the package 10 is formed after the electric parts are mounted on the frame 41. Thus, there is no restriction of walls of the package 10, etc., at the mounting time and the packing density of the electric parts can be raised and consequently, the illumination sensor can be more miniaturized.

In the embodiment, the MOSFETs Q1 and Q2 are sealed with a seal member 43b having a lightproof property; however, in the frame 41, a mold part may be formed of a mold material having a lightproof property in the mounting part of the MOSFETs Q1 and Q2 for shading and sealing the MOSFETs Q1 and Q2.

Thirtieth Embodiment

Figure 79:
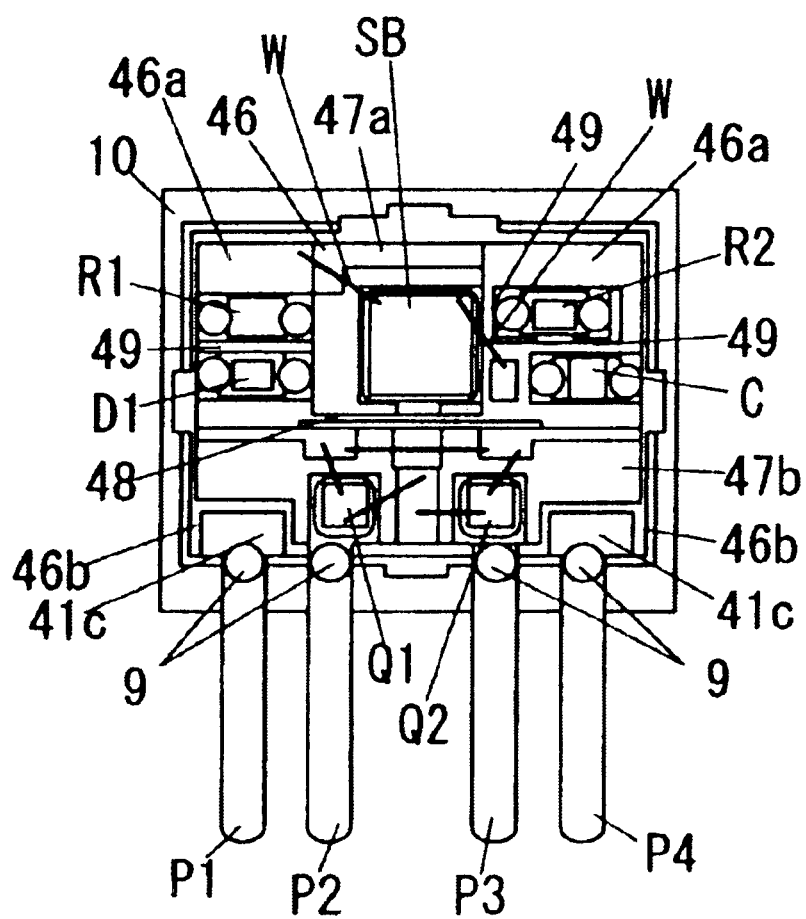
FIG. 79 is a plan view with a liquid crystal plate removed in a thirtieth embodiment of the invention.

In the first embodiment, the electric parts are mounted in the frame 41 with which the package 10 is molded in one piece. In a thirtieth embodiment of the invention, a package 10 is formed of a MID (Molded Interconnection Device); electric parts are surface-mounted on the package 10 and connection terminals P1 to P4 are electrically and mechanically connected to the package 10 by solder 9, then the electric parts are sealed with a seal member having a translucent property in a recess 46 of the package 10 and a liquid crystal plate LC is fixed on the front of the package 10, as shown in FIG. 79. Since the package 10 is formed with element mounting parts 41a and wiring parts 41b stereoscopically, a wiring pattern of a shape incompatible with stamping or bending a frame 41 can be formed; the wiring parts 41b for electrically connecting the electric parts can be miniaturized and the whole illumination sensor can be miniaturized. Other components are similar to those in the twenty-eighth embodiment.

Thirty-first Embodiment

Figure 80A:
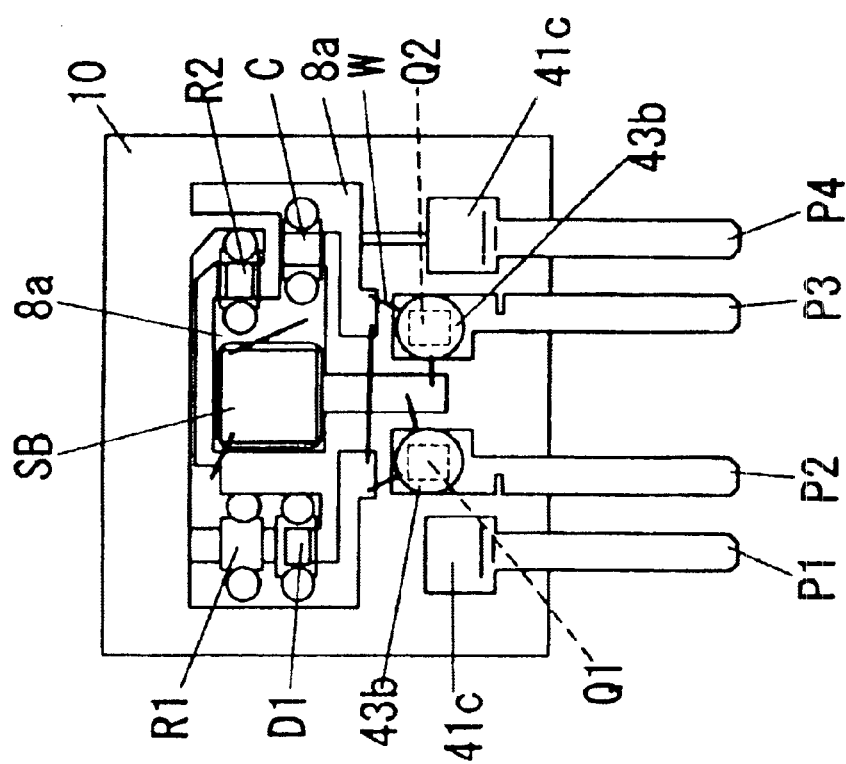
FIGS. 80A and 80B show a thirty-first embodiment of the invention.
Figure 80B:
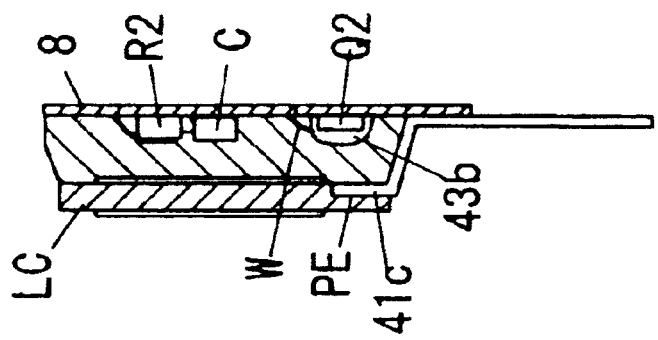
Figure 81:
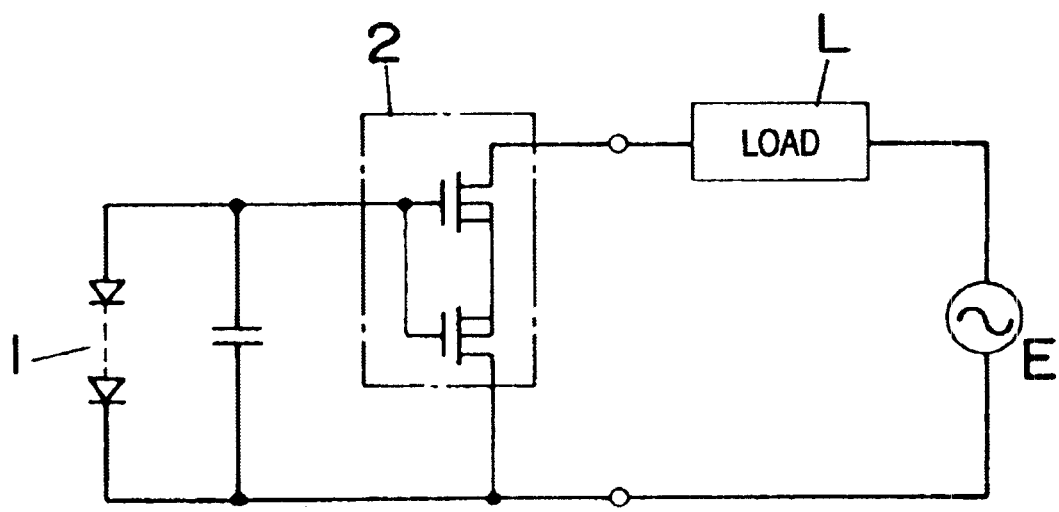
FIG. 81 is a circuit diagram to show an example in a related art.

In the twenty-eighth embodiment, the electric parts are mounted in the frame 41 with which the package 10 is molded in one piece. In a thirty-first embodiment of the invention, connection terminals are electrically and mechanically connected by solder or with a conductive adhesive to one end part of a print-circuit board 8 formed with a wiring pattern 8a for electrically connecting electric parts, then resistors R1 and R2, a capacitor C, a diode D1, MOSFETs Q1 and Q2, and a solar battery SB are surface-mounted on one side of the print-circuit board 8 and the MOSFETs Q1 and Q2 and electrodes of the solar battery SB and the wiring pattern 8a are electrically connected by wire W, then the MOSFETs Q1 and Q2 are sealed with a seal member 43b having a lightproof property and the whole of the print-circuit board 8 is molded with a mold material having a translucent property (for example, epoxy resin) for forming a package 10, as shown in FIGS. 80A and 80B. Here, a liquid crystal plate LC is placed on the front of the package 10 opposed to the light reception part of the solar battery SB. In the embodiment, the elements are mounted on the print-circuit board 8, so that the circuit pattern can be changed comparatively easily and illumination sensors of various specifications can be provided at low costs. Other components are similar to those in the twenty-eighth embodiment.

According to a first aspect of the present invention, there is provided an illumination sensor comprising a photovoltaic element made of a solar battery for generating a voltage responsive to brightness of ambient light and a switching element comprising MOSFET being turned on or off in response to the output voltage of the photovoltaic element for opening or closing a separately provided switch element. A solar battery is used as the photovoltaic element, whereby a circuit for applying a bias voltage as with a photodiode need not be provided and moreover a power supply is not required for controlling the switching element; this is an advantage of the illumination sensor. Moreover, MOSFET is used as the switching element, so that low power is consumed and the switching element can be turned on and off by output of a small-sized solar battery. That is, the switching element is opened and closed, whereby it is made possible to control the high-voltage, high-capacity switch element. Further, the illumination sensor has also the advantage that CdS cells are not used and thus the ill effect of cadmium on the environment is not produced.

In a second aspect of the present invention, in the illumination sensor as the first aspect of the present invention, the switching element is made up of two MOSFETs with sources connected and gates connected in common. Thus, the switching element can be used for an AC power supply.

In a third aspect of the present invention, in the illumination sensor as the first aspect of the present invention, the photovoltaic element is a solar battery comprising a plurality of cells each having a pin structure connected in series on a single plane, the cells being formed on a single substrate. Thus, the output voltage of the photovoltaic element can be enlarged without increasing the number of parts at the assembling time.

In a fourth aspect of the present invention, in the illumination sensor as the first aspect of the present invention, an amorphous silicon solar battery having a sensitivity wavelength range of 400 to 700 nm, a peak wavelength in the vicinity of 500 nm, and a spectral sensitivity characteristic closely similar to the luminosity characteristic of a human being is used as the solar battery. Thus, the operation of the switching element in response to the brightness of ambient light can be matched with the luminosity characteristic of a human being and control with no sense of incongruity is enabled. Moreover, an amorphous silicon solar battery is used, so that easy formation is enabled at comparatively low temperature on a comparatively inexpensive substrate of glass, silicon, etc., and costs can be reduced.

In a fifth aspect of the present invention, the illumination sensor as the first aspect of the present invention further includes a light quantity adjustment member being placed in at least a part of an incidence path of ambient light on a light reception face of the photovoltaic element and having transmittance controlled by an external signal generated in response to opening or closing the switch element. Since the light quantity adjustment member having transmittance controlled by an external signal responsive to turning on or off the switching element controlled in response to the brightness of ambient light is placed in the incidence path of ambient light on the photovoltaic element, it is made possible to give hysteresis to the relationship between the brightness of the ambient light and turning on/off the switching element. That is, an external signal is given so as to decrease the transmittance of the light quantity adjustment member when the ambient light is decreased, whereby it is made possible to lower the sensitivity when the quantity of the ambient light is small, and it is made possible to set so as to prevent a malfunction if light of headlights of an automobile, etc., is incident in the night. Since a delay element need not be placed between the solar battery and the switching element, when light quantity change of the ambient light is sufficiently large, the transmittance of the light quantity adjustment member can be immediately raised with no delay.

In a sixth aspect of the present invention, in the illumination sensor as the fifth aspect of the present invention, the light quantity adjustment member has a transmittance-type liquid crystal plate having transmittance changed in response to the strength of an electric field applied to liquid crystal. A liquid crystal plate is used as the light quantity adjustment member; it is driven by an electric field and has very large impedance and thus consumes small power. That is, the switching element is driven by the output voltage of the photovoltaic element and the power required for the external signal for controlling the light quantity adjustment member is small, so that the illumination sensor can be operated with extremely small power. A polarizing plate is placed on each of the surface and the back of the liquid crystal plate and the transmittance of the polarizing plates and the liquid crystal plate is set based on the relative angle of a vibration face of light passing through the polarizing plates. Since the transmittance is adjusted based on the positional relationship of the vibration face of light passing through the polarizing plates, it is made possible to make whole adjustment of the quantity of light incident on the photovoltaic element.

In a seventh aspect of the present invention, in the illumination sensor as the fifth aspect of the present invention, a monocrystalline silicon solar battery having a sensitivity wavelength range across a visible light area and a near-infrared light area and a peak wavelength in an infrared light area is used as the photovoltaic element and the liquid crystal plate used has a transmittance characteristic different between the visible light area and the infrared light area. The light quantity adjustment member has a transmittance-type liquid crystal plate having transmittance changed in response to the strength of an electric field applied to liquid crystal. A liquid crystal plate is used as the light quantity adjustment member; it is driven by an electric field and has very large impedance and thus consumes small power. That is, the switching element is driven by the output voltage of the photovoltaic element and the power required for the external signal for controlling the light quantity adjustment member is small, so that the illumination sensor can be operated with extremely small power. It is made possible to enlarge hysteresis for illumination light and lessen hysteresis for natural light by combining the spectral sensitivity characteristic of the photovoltaic element and the transmittance characteristic of the liquid crystal plate. That is, it is made possible to give a hysteresis characteristic such that no response is made if illumination light or light of headlights is incident as ambient light in the night and that a response is made immediately if the sunlight is incident at the crack of dawn.

In an eight aspect of the present invention, in the illumination sensor as the fourth aspect of the present invention, a filter having transmittance different in a visible light area and an infrared light area is added to the incidence path of ambient light on the light reception face of the photovoltaic element. According to the configuration, the quantity of light incident on the photovoltaic element can be adjusted in response to the wavelength of light and it is made possible to provide any desired hysteresis characteristic.

In a ninth aspect of the present invention, the illumination sensor as the first aspect of the present invention further includes a control circuit being inserted between the photovoltaic element and the switching element for adjusting a response of the switching element to change in the output voltage of the photovoltaic element. Thus, the illumination sensor has the advantage that the response of the switching element to the output of the photovoltaic element can be adjusted.

In a tenth aspect of the present invention, the illumination sensor as the first aspect of the present invention further includes a package made of a molded article of a synthetic resin, the package being formed with connection terminals for connecting to an external circuit in one piece. The connection terminals are projected on the package for easy mounting. Since the electric parts forming the illumination sensor are housed in the package of a molded article made of a synthetic resin, the illumination sensor can be miniaturized and moreover when the illumination sensor is built in any other unit, discrete electric parts need not be built in and the illumination sensor can be handled as one part. Moreover, the wiring length of the photovoltaic element and the switching element can be shortened by miniaturizing the illumination sensor, and external radiation noise can be prevented from causing the switching element to malfunction.

In an eleventh aspect of the present invention, in the illumination sensor as the tenth aspect of the present invention, the package is molded with a metal frame in one piece at the same time, the frame being formed with parts mounting parts where the connection terminals and electric parts are mounted and wiring parts forming electric paths between the connection terminals and the parts mounting parts. The electric parts are mounted on the frame and the package is molded with the frame in one piece at the same time, so that manufacturing is easy and it is made possible to miniaturize as compared with the case for use with a print-circuit board, etc.

In a twelfth aspect of the present invention, the illumination sensor as the eleventh aspect of the present invention further includes a first seal member having a translucent property for sealing the photovoltaic element and a second seal member having a lightproof property for sealing the switching element. Both the photovoltaic element and the switching element are sealed with the seal members, whereby degradation caused by humidity, etc., can be suppressed and moreover the switching element is sealed with the seal member having a lightproof property, so that a malfunction or degradation caused by drawing light into the switching element can be prevented.

In a thirteenth aspect of the present invention, in the illumination sensor as the eleventh aspect of the present invention, the package is provided with a separation wall for separating the mounting part of the switching element and the mounting part of the photovoltaic element and a first seal member having a lightproof property for sealing the switching element and a second seal member having a translucent property for sealing the photovoltaic element are separated through the separation wall. The switching element is sealed with the seal member not allowing light to pass through, so that the switching element can be prevented from being degraded because of the surrounding environment, and the photovoltaic element is sealed with the seal member having a translucent property, so that the photovoltaic element can be prevented from being degraded because of the surrounding environment. Further, the mounting part of the switching element and the mounting part of the photovoltaic element are separated by the separation wall, thus the seal member having a lightproof property for sealing the switching element and the seal member having a translucent property for sealing the photovoltaic element are not mixed; the accident in which the seal member having a lightproof property is drawn into the photovoltaic element for decreasing the quantity of light incident on the light reception face of the photovoltaic element can be prevented, and the state in which the elements are not completely sealed because each seal member is drawn into any other portion, whereby the amount of the seal member is lowered can be prevented from occurring.

In a fourteenth aspect of the present invention, in the illumination sensor as the eleventh aspect of the present invention, a light quantity adjustment member having transmittance controlled by an external signal generated in response to opening or closing the switch element is attached to the package so as to overlap at least a part of a light reception face of the photovoltaic element and is mounted on the parts mounting part and is electrically connected to the connection terminal. An external control signal is input to the light quantity adjustment member, whereby the quantity of light passing through the light quantity adjustment member and incident on the light reception face of the photovoltaic element can be adjusted; for example, when the switching element is off, the quantity of light passing through the light quantity adjustment member is lowered, whereby hysteresis can be given to the response of the switching element to the brightness of ambient light when the switching element is turned on and off.

In a fifteenth aspect of the present invention, in the illumination sensor as the fourteeth aspect of the present invention, the light quantity adjustment member has a transmittance-type liquid crystal plate having transmittance changed in response to the strength of an electric field applied to liquid crystal and comprises a translucent seal member for sealing at least the periphery on the incidence side of ambient light on the liquid crystal plate. The liquid crystal plate is vulnerable to the surrounding environment (particularly, humidity), but at least the periphery of the liquid crystal plate is sealed with the seal member, so that the liquid crystal plate can be prevented from being degraded due to humidity.

In a sixteenth aspect of the present invention, in the illumination sensor as the fourteenth, the light quantity adjustment member has a filter having a spectral transmittance characteristic different from that of the photovoltaic element, the filter being attached to the package so as to be opposed to the light reception face of the photovoltaic element. Since the spectral characteristic of light incident on the photovoltaic element is corrected through the filter, the photovoltaic element can be provided with sensitivity to light in any desired wavelength area.

In a seventeenth aspect of the present invention, the illumination sensor as the first aspect of the present invention further includes a print-circuit board being formed with a wiring pattern for surface-mounting electric parts and provided with connection terminals for connecting to an external circuit and a package made of a translucent synthetic resin, integral with the print-circuit board so as to cover the side of the print-circuit board on which the photovoltaic element is mounted. The electric parts forming the illumination sensor are mounted on the print-circuit board and thus can be easily mounted and the circuit pattern can be changed comparatively easily; illumination sensors of various specifications can be provided at low costs.

In an eighteenth aspect of the present invention, in the illumination sensor as the tenth aspect of the present invention, the package is a MID formed with parts mounting parts for mounting electric parts and wiring parts forming electric paths between the parts mounting parts and the connection terminals by metal plating. It is made possible to place the electric parts stereoscopically and the illumination sensor can be miniaturized.

According to a nineteenth aspect of the present invention, there is provided an electronic automatic on/off switch comprising a photovoltaic element made of a solar battery for generating a voltage responsive to brightness of ambient light, a switching element comprising MOSFET being turned on or off upon reception of the output voltage of the photovoltaic element, and a switch element being inserted between an AC power supply and a load and controlled by the switching element so as to energize the load when brightness detected by the photovoltaic element is equal to or less than a stipulated value. Since the brightness of ambient light is detected by the solar battery, the load on the environment at the manufacturing time or at the discard time is lessened as compared with use of CdS cells and moreover the solar battery produces a comparatively large output per area, thus MOSFET of voltage drive type consuming low power can be reliably driven without using an additional power supply or drive circuit. Moreover, when the brightness of ambient light is equal to or less than a stipulated value, namely, the surroundings become dark, the load is energized through the switch element separately provided from the switching element, so that it is not necessary to allow a load current to flow into the MOSFET, and if the load current is large, an inexpensive element having a smaller rated current capacity than the load current can be used as the switching element. Since the switch element is controlled by the switching element, an electromagnetic relay or a three-terminal bidirectional thyristor which has a comparatively large basic-angle current capacity and is comparatively inexpensive can be used as the switch element, and costs can be reduced as compared with the case where large-capacity MOSFET is used.

In the invention as a twentieth aspect of the present invention, in the electronic automatic on/off switch as the nineteenth aspect of the present invention, the switch element is an electromagnetic relay having a contact inserted between power supply and the load and a relay coil inserted between the power supply and the switching element. The load is controlled by the electromagnetic relay, thus heat is little generated, a radiator plate required as a three-terminal bidirectional thyristor is used is not required, and a noise prevention circuit part is not required either. That is, the electronic automatic on/off switch can be more miniaturized and reduced in costs as compared with the case where a three-terminal bidirectional thyristor is used as the switch element.

In a twenty-first aspect of the present invention, in the electronic automatic on/off switch as the nineteenth aspect of the present invention, the switching element is made up of two MOSFETs with sources connected and gates connected in common. Thus, to adopt a configuration of supplying an alternating current to the switching element, a current can be prevented from flowing into the switching element through a parasitic diode of MOSFET when MOSFET is off, and the switching element can be turned off reliably.

In a twenty-second aspect of the present invention, in the electronic automatic on/off switch as the nineteenth aspect of the present invention, the photovoltaic element is a solar battery comprising a plurality of cells each having a pin structure connected in series on a single plane, the cells being formed on a single substrate. The switching element is controlled based on the output voltage of the series circuit of the cells, whereby sensitivity can be enhanced and the solar battery can be handled as one part comprising a plurality of cells, so that the number of parts at the assembling time is not increased.

In a twenty-third aspect of the present invention, in the electronic automatic on/off switch as the nineteenth aspect of the present inventing, an amorphous silicon solar battery having a sensitivity wavelength range of 400 to 700 nm, a peak wavelength in the vicinity of 500 nm, and a spectral sensitivity characteristic closely similar to the luminosity characteristic of a human being is used as the solar battery. The amorphous silicon solar battery is used, so that easy formation is enabled at comparatively low temperature on a comparatively inexpensive substrate of glass, silicon, etc., and costs can be reduced. Since the spectral sensitivity characteristic is made closely similar to the luminosity characteristic of a human being, it is made possible to control the load almost matching the luminosity of a human being, and a sense of incongruity is not produced in control of the load.

According to a twenty-fourth aspect of the present invention, there is provided an electronic automatic on/off switch comprising a photovoltaic element for generating a voltage responsive to brightness of ambient light, a voltage supervisory circuit being driven by the output voltage of the photovoltaic element and generating a binary signal in response to larger-than or smaller-than relation between reference voltage and the output voltage of the photovoltaic element, a switching element being turned on or off in response to the binary signal of the voltage supervisory circuit, and a switch element being inserted between a power supply and a load for turning on or off power supply to the load in response to turning on or off the switching element. Since the response time of the switching element to change in the output voltage of the photovoltaic element is not adjusted, a malfunction is not caused by the change speed of brightness and moreover responsivity to change in the brightness can be enhanced.

In a twenty-fifth aspect of the present invention, in the electronic automatic on/off switch as the twenty-fourth aspect of the present invention, the voltage supervisory circuit comprises a reference voltage generation circuit for generating the reference voltage and a comparator for comparing the output voltage of the photovoltaic element with the reference voltage with respect to the larger-than or smaller-than relation. The threshold value of brightness for operating the switching element can be set with accuracy.

In a twenty-sixth aspect of the present invention, in the electronic automatic on/off switch as the twenty-fifth aspect, a series circuit of a plurality of diodes connected to the photovoltaic element via a resistor is used as the reference voltage generation circuit. Thus, the reference voltage can be generated in a simple circuit configuration.

In a twenty-seventh of the present invention, in the electronic automatic on/off switch as the twenty-fifth aspect of the present invention, the comparator comprises a feedback resistor for giving hysteresis to a threshold value for the output voltage of the photovoltaic element. Thus, hysteresis is provided for the threshold value of brightness when the load is turned on/off, so that the load can be prevented from malfunctioning due to variation in the surrounding brightness.

In a twenty-eighth aspect of the present invention, in the electronic automatic on/off switch as the twenty-fifth asepct of the present invention, a threshold value switching element being turned on or off based on output of the comparator for giving hysteresis to a threshold value for the output voltage of the photovoltaic element is connected in parallel to at least some of the plurality of diodes. The threshold value switching element can be turned on or off, thereby changing the reference voltage for giving hysteresis to the threshold value of brightness when the load is turned on/off.

In a twenty-ninth aspect of the present invention, in the electronic automatic on/off switch as the twenty-fifth aspect of the present invention, the photovoltaic element is made of a solar battery comprising a plurality of cells connected in series and wherein a threshold value switching element being turned on or off based on output of the comparator for giving hysteresis to a threshold value for the output voltage of the photovoltaic element is connected in parallel to at least some of the plurality of cells. Thus, the threshold value switching element can be turned on or off, thereby changing the electromotive force of the solar battery for providing hysteresis for the threshold value of brightness when the load is turned on/off.

In a thirtieth aspect of the present invention, the electronic automatic on/off switch as the nineteenth aspect of the present invention further includes a light emitting element for allowing light different from ambient light to be incident on the photovoltaic element and increasing the light quantity when the switch element is off as compared with that when the switch element is on. When the surroundings are bright, the light emitting element is turned on, thereby allowing the ambient light and the light from the light emitting element to be incident on the photovoltaic element at the same time; when the surroundings are dark and bidirectional thyristor is turned on for energizing the load, the light emitting element is turned off. Thus, hysteresis can be given to the surrounding brightness and turning on/off the bidirectional thyristor and the on/off state of the bidirectional thyristor is not changed due to minute variation in the brightness of ambient light, namely, the operation of turning on/off the thyristor is stabilized.

In a thirty-first aspect of the present invention, in the electronic automatic on/off switch as the thirtieth aspect of the present invention, a series circuit of the light emitting element and a variable resistor is connected in parallel to the switch element. Thus, when the surroundings are bright, the light emitting element is turned on, thereby allowing the ambient light and the light from the light emitting element to be incident on the photovoltaic element at the same time; when the surroundings are dark and bidirectional thyristor is turned on for energizing the load, the light emitting element is turned off. Thus, hysteresis can be given to the surrounding brightness and turning on/off the bidirectional thyristor and the on/off state of the bidirectional thyristor is not changed due to minute variation in the brightness of ambient light, namely, the operation of turning on/off the thyristor is stabilized. Moreover, the variable resistor is connected in series to the light emitting element, thus if the variable resistor is adjusted, the light emitting quantity of the light emitting element is adjusted and the hysteresis characteristic can be adjusted easily.

In a thirty-second aspect of the present invention, in the electronic automatic on/off switch as the thirtieth aspect of the present invention, a series circuit of the light emitting element, a variable resistor, and the switching element is connected in parallel to the switch element. Thus, when the surroundings are bright, the light emitting element is turned on, thereby allowing the ambient light and the light from the light emitting element to be incident on the photovoltaic element at the same time; when the surroundings are dark and bidirectional thyristor is turned on for energizing the load, the light emitting element is turned off. Thus, hysteresis can be given to the surrounding brightness and turning on/off the bidirectional thyristor and the on/off state a of the bidirectional thyristor is not changed due to minute variation in the brightness of ambient light, namely, the operation of turning on/off the thyristor is stabilized. Moreover, the variable resistor is connected in series to the light emitting element, thus if the variable resistor is adjusted, the light emitting quantity of the light emitting element is adjusted and the hysteresis characteristic can be adjusted easily.

In a thirty-three aspect of the present invention, the electronic automatic on/off switch as the thirtieth aspect of the present invention further includes a metal frame mounting the photovoltaic element and the switching element and a package made of a synthetic resin, molded with the frame in one piece at the same time, wherein the light emitting element is attached to the package and connection terminals formed continuously on the metal frame in one piece are projected from the package. Thus, the connection terminals are projected on the package, so that mounting is easy.

In a thirty-fourth aspect of the present invention, the electronic automatic on/off switch as the nineteenth aspect of the present invention further includes a light quantity adjustment member being placed in at least a part of an incidence path of ambient light on a light reception face of the photovoltaic element and having transmittance lowered when the switch element is on as compared with that when the switch element is off. Once the on or off state of the switch element is changed, the on or off state can be made hard to be changed if the brightness of ambient light varies, and hysteresis can be given to turning on or off the switch element in response to the brightness of ambient light.

In a thirty-fifth aspect of the present invention, in the electronic automatic on/off switch as the thirty-fourth aspect of the present invention, the light quantity adjustment member has a transmittance-type liquid crystal plate having transmittance changed in response to the strength of an electric field applied to liquid crystal. Thus, the applied voltage to the liquid crystal plate is adjusted, whereby the hysteresis characteristic can be adjusted.

In a thirty-sixth aspect of the present invention, the electronic automatic on/off switch as the thirty-fifth aspect of the present invention further includes a base having one side to which the photovoltaic element and the switching element are attached and a cover for covering the one side of the base, the cover being provided in a part with a translucent plate for allowing ambient light to be incident on the photovoltaic element, wherein the liquid crystal plate is disposed between the photovoltaic element and the translucent plate. Since the photovoltaic element and the liquid crystal plate are housed in the space closed by the base and the cover, the effect of stray light is hard to receive and it is made possible to set the hysteresis characteristic for ambient light with accuracy.

In a thirty-sixth aspect of the present invention, the electronic automatic on/off switch as the thirty-fifth aspect of the present invention further includes a base having one side to which the photovoltaic element and the switching element are attached and a cover for covering the one side of the base, the cover being provided with the liquid crystal plate in a part for allowing ambient light to be incident on the photovoltaic element. The space between the photovoltaic element and the liquid crystal plate becomes the space closed by the base and the cover, so that the effect of stray light is hard to receive and it is made possible to set the hysteresis characteristic for ambient light with accuracy.

In a thirty-eighth aspect of the present invention, the electronic automatic on/off switch as the thirty-fifth aspect of the present invention further includes a metal frame mounting the photovoltaic element and the switching element and a package made of a synthetic resin, molded with the frame in one piece at the same time, wherein the liquid crystal plate is attached to the package so as to overlap a light reception face of the photovoltaic element and connection terminals formed continuously on the metal frame in one piece are projected from the package. The metal frame and the synthetic resin package are molded in one piece at the same time, the frame is provided with the connection terminals, and the parts are mounted on the frame, so that any other circuit board is not required and the electronic automatic on/off switch can be miniaturized.

In a thirty-ninth aspect of the present invention, the electronic automatic on/off switch as the thirty-fifth aspect of the present invention further includes a print-circuit board mounting the photovoltaic element and the switching element, a holding frame made of a synthetic resin for holding the liquid crystal plate, and a case for housing at least the print-circuit board, wherein the holding frame is fixedly secured to either of the print-circuit board and the case. Since the print-circuit board is used, mounting work is easy and moreover the holding frame holding the liquid crystal plate is fixedly secured to either of the print-circuit board and the case, thus the liquid crystal plate can be positioned reliably.

In a thirty-ninth aspect of the present invention, in the electronic automatic on/off switch as twentieth aspect of the present invention, the power supply is an AC power supply, the electromagnetic relay is of AC-drive type, wherein the switching element is made up of two MOSFETs with sources connected and gates connected in common, and the drain of one MOSFET is connected to one end of a series circuit of the power supply and the relay coil and the drain of the other MOSFET is connected to an opposite end of the series circuit. Since two MOSFETs are connected in inverse series, a current does not flow through a parasitic diode when MOSFET is off, and an alternating current can be shut off. Consequently, a simple circuit configuration is compatible with an AC power supply.

In a forty-first aspect of the present invention, in the electronic automatic on/off switch as the twentieth aspect of the present invention, the power supply is an AC power supply and the electromagnetic relay is of DC-drive type, further including a rectifier being inserted between a series circuit of the drain and source of the MOSFET and the relay coil and the power supply and a smoothing capacitor being connected in parallel to the relay coil. The number of parts is increased as compared with the case where two MOSFETs are used, but an inexpensive DC electromagnetic relay can be used, the number of MOSFETs may be one, and it is not necessary to consider variations in the MOSFET characteristic. Moreover, the smoothing capacitor is used, whereby the delay time between the instant at which the switching element is turned off and the instant at which the contact of the electromagnetic relay is turned off can be set; for example, if the strong light of headlights of an automobile, etc., is applied for a short time in the night, the contact of the electromagnetic relay does not respond to the light, so that a malfunction can be prevented.

What is claimed is:

1. An illumination sensor comprising:
    a photovoltaic element defined by a solar battery for generating an output voltage responsive to brightness of ambient light;
    a switching element defined by MOSFET turned on/off in response to the output voltage of said photovoltaic element for opening/closing a separately provided switch element; and
    a light quantity adjustment member placed in at least a part of an incidence path of ambient light on a light reception face of said photovoltaic element and having transmittance controlled by an external signal generated in response to opening/closing the switch element.

2. The illumination sensor as claimed in claim 1 wherein said switching element is defined by two MOSFETs with sources connected and gates connected in common.

3. The illumination sensor as claimed in claim 1 wherein said photovoltaic element is a solar battery including a plurality of cells each having a pin structure connected in series on a single plane, and the cells are formed on a single substrate.

4. The illumination sensor as claimed in claim 1, further comprising:
    a liquid crystal plate;
    a polarizing plate placed on each of a front and a back of the liquid crystal plate, the transmittance of the polarizing plates and the liquid crystal plate being set based on the relative angle of a vibration face of light passing through the polarizing plates,
    wherein the light quantity adjustment member has a transmittance-type liquid crystal plate having transmittance changed in response to the strength of an electric field applied to liquid crystal.

5. The illumination sensor as claimed in claim 1, wherein a monocrystalline silicon solar battery having a sensitivity wavelength range across a visible light area and a near-infrared light area and a peak wavelength in an infrared light area is used as said photovoltaic element the light quantity adjustment member has a transmittance-type liquid crystal plate having transmittance changed in response to the strength of an electric field applied to liquid crystal, and
    wherein the liquid crystal plate used has a transmittance characteristic different between the visible light area and the infrared light area.

6. The illumination sensor as claimed in claim 1, further comprising:
    a filter having transmittance different in a visible light area and an infrared light area added to the incidence path of ambient light on the light reception face of said photovoltaic element.

7. The illumination sensor as claimed in claim 1 further comprising:
    a control circuit inserted between said photovoltaic element and said switching element for adjusting a response of said switching element to change in the output voltage of said photovoltaic element.

8. The illumination sensor as claimed in claim 1, further comprising:
    a print-circuit board formed with a wiring pattern for surface-mounting electric parts and provided with connection terminals for connecting to an external circuit and a package made of a translucent synthetic resin, integral with the print-circuit board so as to cover the side of the print-circuit board on which said photovoltaic element is mounted.

9. The illumination sensor as claimed in claim 1 further comprising:
    a package made of a molded article of a synthetic resin, the package formed with connection terminals for connecting to an external circuit in one piece.

10. The illumination sensor as claimed in claim 9, wherein the package is a MID formed with parts mounting parts for mounting electric parts and wiring parts forming electric paths between the parts mounting parts and the connection terminals by metal plating.

11. The illumination sensor as claimed in claim 9, wherein the package is molded with a metal frame in one piece at the same time, the frame being formed with parts mounting parts where the connection terminals and electric parts are mounted and wiring parts forming electric paths between the connection terminals and the parts mounting parts.

12. The illumination sensor as claimed in claim 11, further comprising:
    a first seal member having a translucent property for sealing said photovoltaic element and a second seal member having a lightproof property for sealing said switching element.

13. The illumination sensor as claimed in claim 11, wherein the package is provided with a separation wall for separating the mounting part of said switching element and the mounting part of said photovoltaic element, and
    wherein a first seal member having a lightproof property for sealing said switching element and a second seal member having a translucent property for sealing said photovoltaic element are separated through the separation wall.

14. The illumination sensor as claimed in claim 11, wherein the light quantity adjustment member is attached to the package so as to overlap at least a part of a light reception face of said photovoltaic element and is mounted on the parts mounting part and is electrically connected to the connection terminal.

15. The illumination sensor as claimed in claim 14, wherein the light quantity adjustment member has a transmittance-type liquid crystal plate having transmittance changed in response to the strength of an electric field applied to liquid crystal and includes a translucent seal member for sealing at least the periphery on the incidence side of ambient light on the liquid crystal plate.

16. The illumination sensor as claimed in claim 14, wherein the light quantity adjustment member has a filter having a spectral transmittance characteristic different from that of said photovoltaic element, and the filter is attached to the package so as to be opposed to the light reception face of said photovoltaic element.

* * * * *

UNITED STATES PATENT AND TRADEMARK OFFICE
CERTIFICATE OF CORRECTION

PATENT NO. : 6,670,597 B1
DATED : December 30, 2003
INVENTOR(S) : Kitamura et al.

It is certified that error appears in the above-identified patent and that said Letters Patent is hereby corrected as shown below:

<u>Column 56,</u>
Line 66, add -- 17. The illumination sensor as claimed in claim 1, wherein an amorphous silcon solar battery having a sensitivity wavelength range of 400 to 700 nm, a peak wavelength in the vicinity of 500 nm, and a spectral sensitivity characteristic closely similar to the luminosity characteristic of a human being is used as the solar battery.

Signed and Sealed this

Twenty-eighth Day of September, 2004

JON W. DUDAS
*Director of the United States Patent and Trademark Office*